United States Patent
Lee et al.

(10) Patent No.: US 10,541,254 B2
(45) Date of Patent: Jan. 21, 2020

(54) THIN FILM TRANSISTOR SUBSTRATE, AND DISPLAY PANEL AND DISPLAY DEVICE INCLUDING SAME

(71) Applicant: LG INNOTEK CO., LTD., Seoul (KR)

(72) Inventors: Sang Youl Lee, Seoul (KR); Chung Song Kim, Seoul (KR); Ji Hyung Moon, Seoul (KR); Sun Woo Park, Seoul (KR); June O Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/064,885

(22) PCT Filed: Oct. 14, 2016

(86) PCT No.: PCT/KR2016/011573
§ 371 (c)(1),
(2) Date: Jun. 21, 2018

(87) PCT Pub. No.: WO2017/111275
PCT Pub. Date: Jun. 29, 2017

(65) Prior Publication Data
US 2018/0374876 A1    Dec. 27, 2018

(30) Foreign Application Priority Data
Dec. 22, 2015    (KR) .................. 10-2015-0184112

(51) Int. Cl.
*G02F 1/1362*    (2006.01)
*H01L 27/12*    (2006.01)
(Continued)

(52) U.S. Cl.
CPC ........ *H01L 27/1225* (2013.01); *G02F 1/1368* (2013.01); *G02F 1/136227* (2013.01);
(Continued)

(58) Field of Classification Search
CPC ................................. G02F 1/136227
See application file for complete search history.

(56) References Cited

U.S. PATENT DOCUMENTS

2005/0104068 A1* 5/2005 Yamazaki ......... H01L 21/28114
257/66
2009/0206332 A1    8/2009 Son et al.
(Continued)

FOREIGN PATENT DOCUMENTS

JP            2012-114320 A    6/2012
KR    10-2009-0084642 A    8/2009
(Continued)

OTHER PUBLICATIONS

International Search Report (PCT/ISA/210) issued in PCT/KR2016/011573, dated Feb. 8, 2017.

*Primary Examiner* — Edmond C Lau
(74) *Attorney, Agent, or Firm* — Birch, Stewart, Kolasch & Birch, LLP

(57) ABSTRACT

A thin film transistor substrate according to an embodiment comprises: a support substrate; a bonding layer disposed on the support substrate; a thin film transistor disposed on the bonding layer, wherein the thin film transistor includes a channel layer containing a nitride-based semiconductor layer, a source electrode electrically connected to a first region of the channel layer, a drain electrode electrically connected to a second region of the channel layer, a gate electrode disposed below the channel layer, and a depletion forming layer disposed between the channel layer and the gate electrode; and a pixel electrode disposed on the thin film transistor and electrically connected to the drain electrode of the thin film transistor. The thin film transistor substrate according to the embodiment, and a display panel and a display device including the same have an advantage (Continued)

of implementing high resolution and reproducing a soft moving image by providing a high carrier mobility.

20 Claims, 33 Drawing Sheets

(51) Int. Cl.

| | |
|---|---|
| H01L 29/66 | (2006.01) |
| H01L 29/786 | (2006.01) |
| H01L 29/423 | (2006.01) |
| H01L 29/778 | (2006.01) |
| H01L 29/10 | (2006.01) |
| G02F 1/1368 | (2006.01) |
| H01L 21/762 | (2006.01) |
| H01L 27/32 | (2006.01) |
| H01L 29/205 | (2006.01) |
| G02F 1/1343 | (2006.01) |
| H01L 29/20 | (2006.01) |

(52) U.S. Cl.
CPC ...... *H01L 21/76251* (2013.01); *H01L 27/124* (2013.01); *H01L 27/127* (2013.01); *H01L 27/1266* (2013.01); *H01L 27/3244* (2013.01); *H01L 29/1066* (2013.01); *H01L 29/205* (2013.01); *H01L 29/42316* (2013.01); *H01L 29/66462* (2013.01); *H01L 29/7781* (2013.01); *H01L 29/7786* (2013.01); *H01L 29/7787* (2013.01); *H01L 29/78636* (2013.01); *H01L 29/78687* (2013.01); *G02F 2001/134372* (2013.01); *G02F 2202/10* (2013.01); *H01L 29/2003* (2013.01)

(56) References Cited

U.S. PATENT DOCUMENTS

| | | |
|---|---|---|
| 2013/0099285 A1 | 4/2013 | Hwang et al. |
| 2015/0009460 A1 | 1/2015 | Jang et al. |

FOREIGN PATENT DOCUMENTS

| | | |
|---|---|---|
| KR | 10-2013-0043047 A | 4/2013 |
| KR | 10-2014-0148031 A | 12/2014 |
| KR | 10-2015-0005053 A | 1/2015 |

* cited by examiner

[FIG. 1]
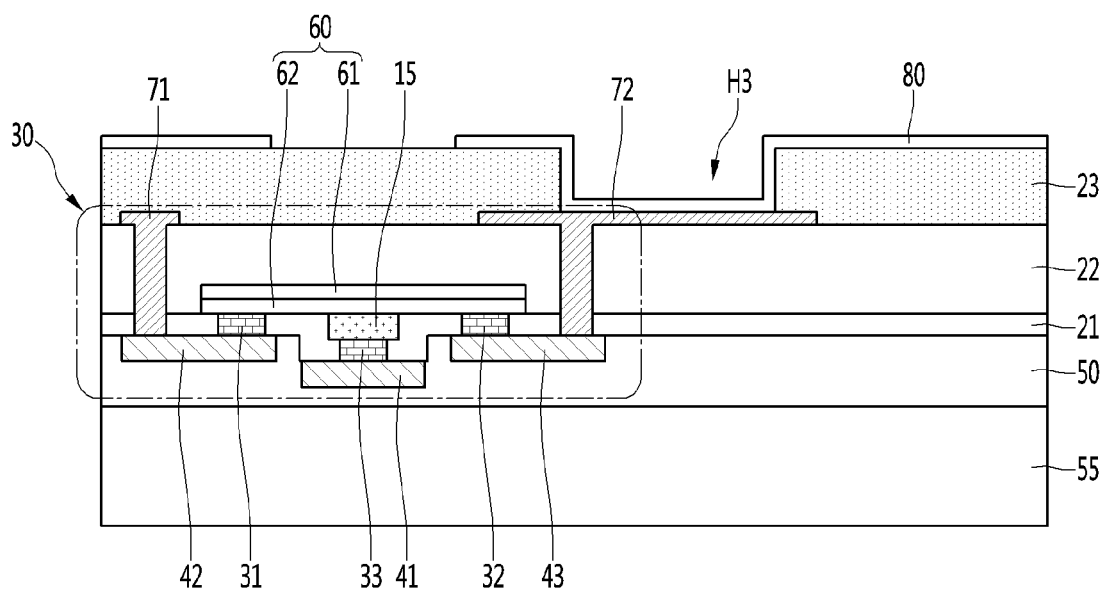

[FIG. 2]
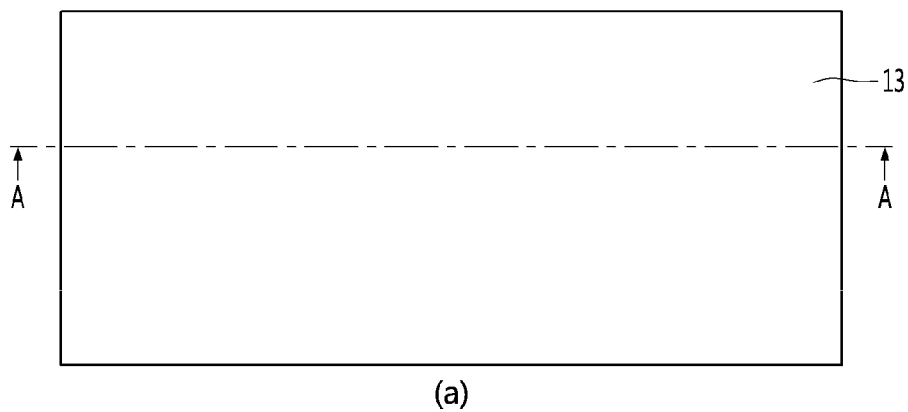
(a)
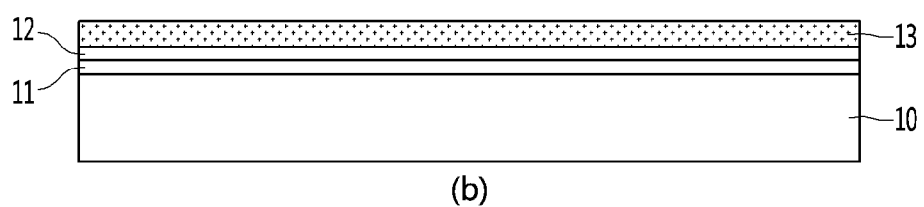
(b)

[FIG. 3]
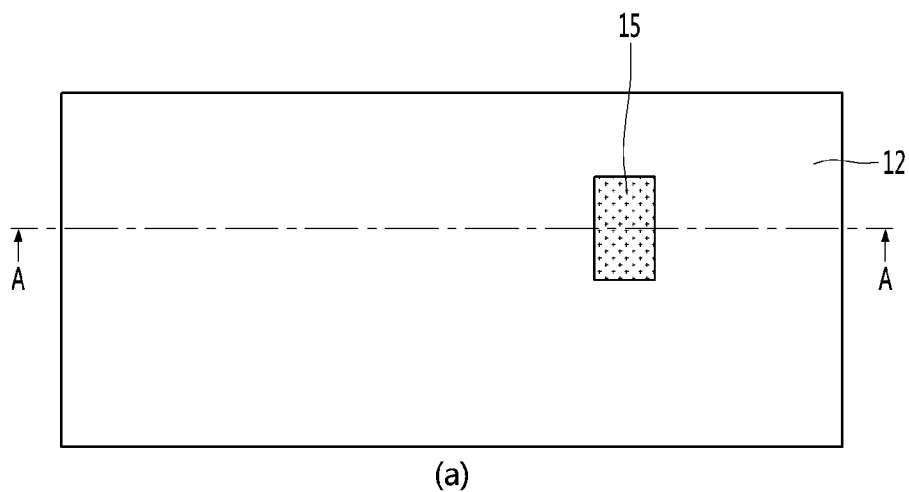
(a)
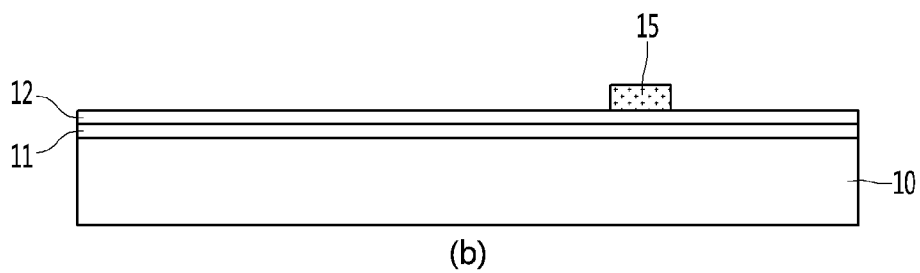
(b)

[FIG. 4]
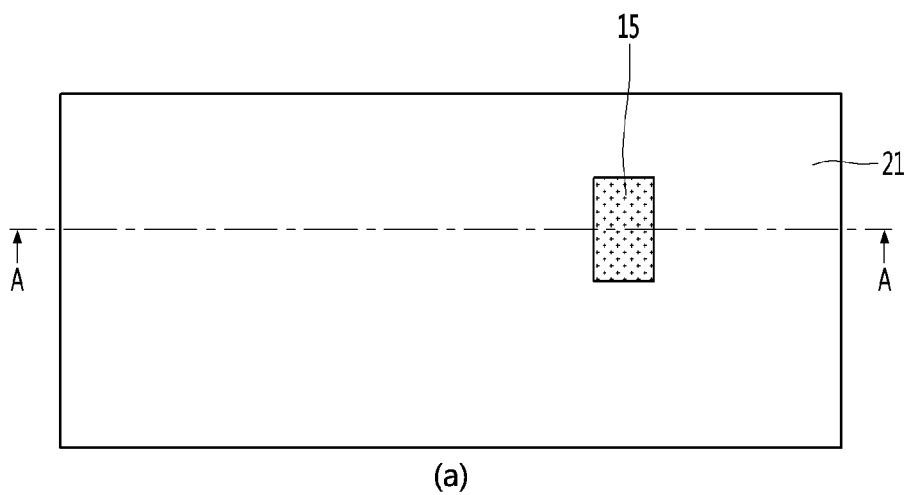
(a)
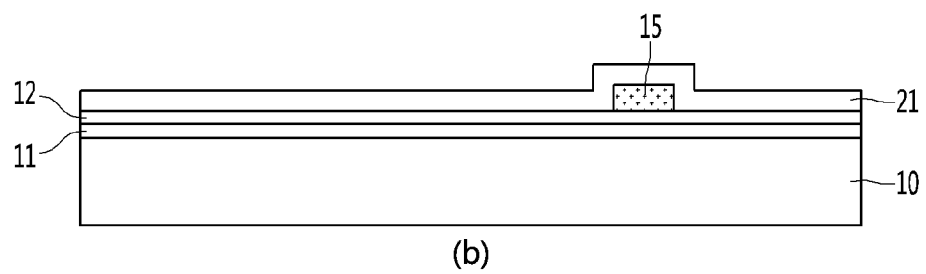
(b)

[FIG. 5]
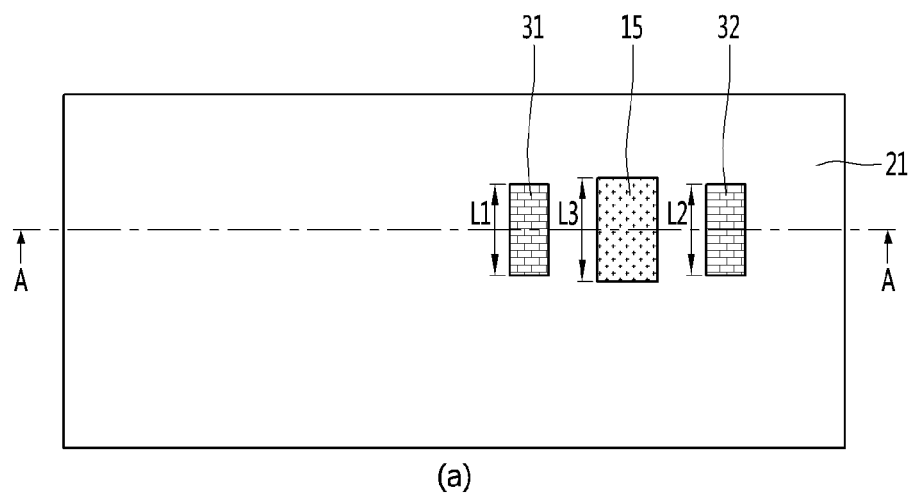
(a)
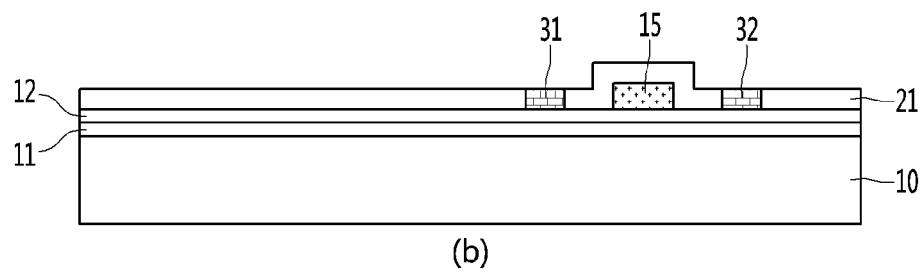
(b)

[FIG. 6]
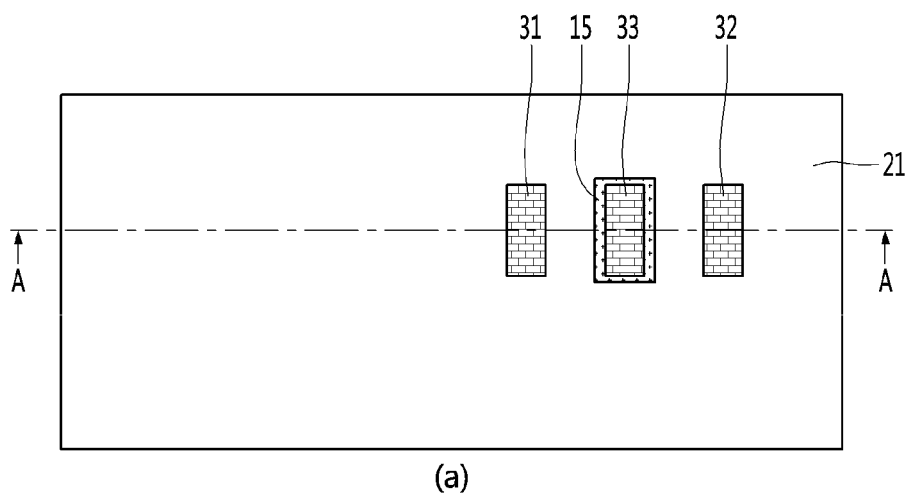
(a)
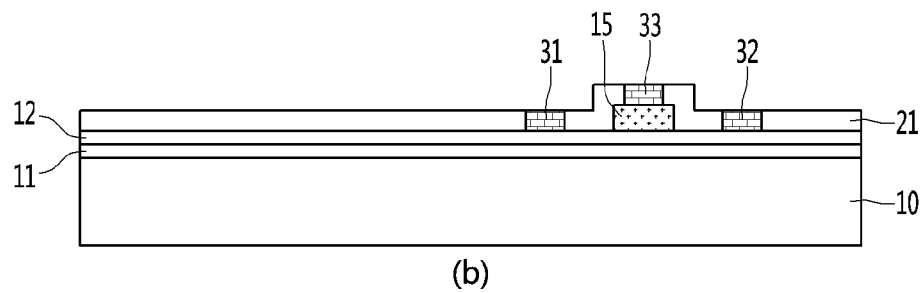
(b)

[FIG. 7]
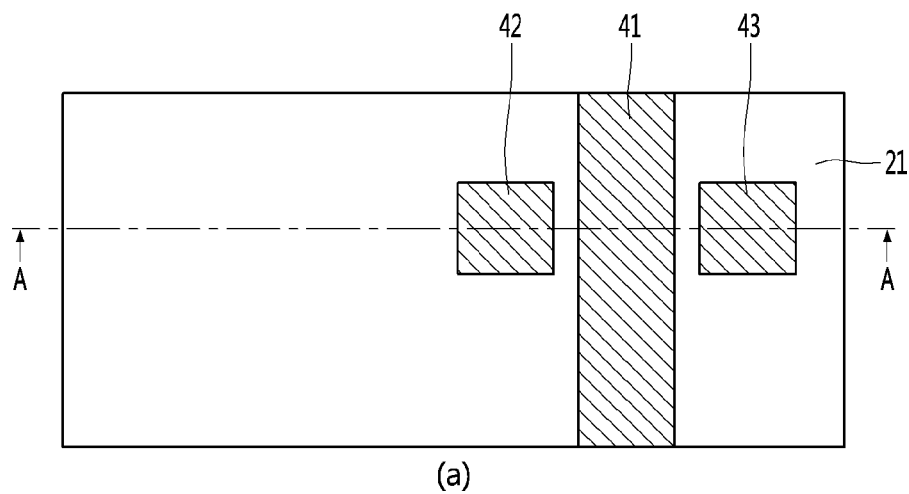
(a)
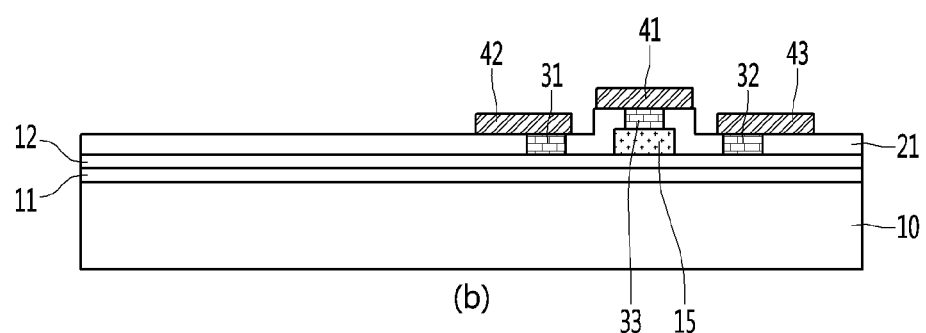
(b)

[FIG. 8]
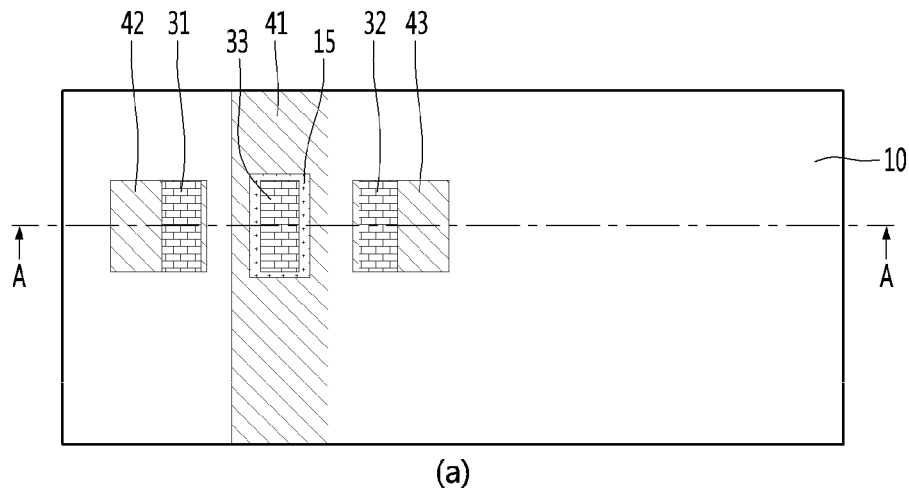
(a)
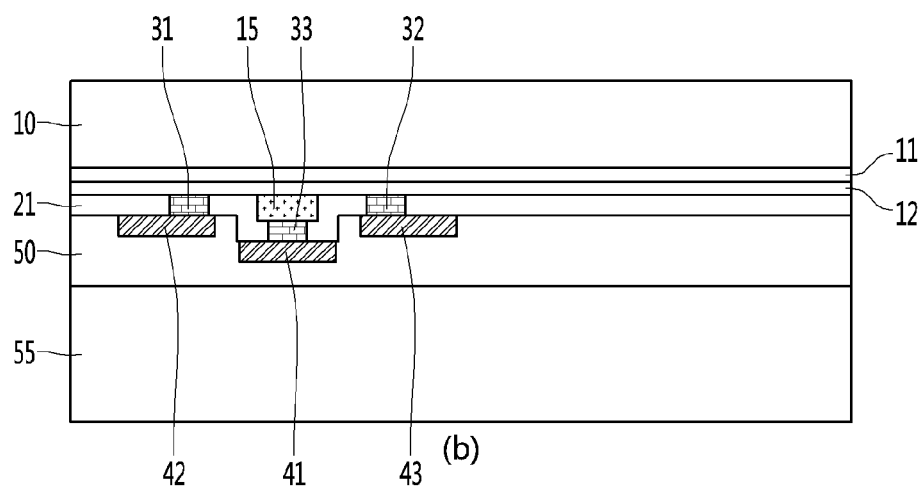
(b)

[FIG. 9]
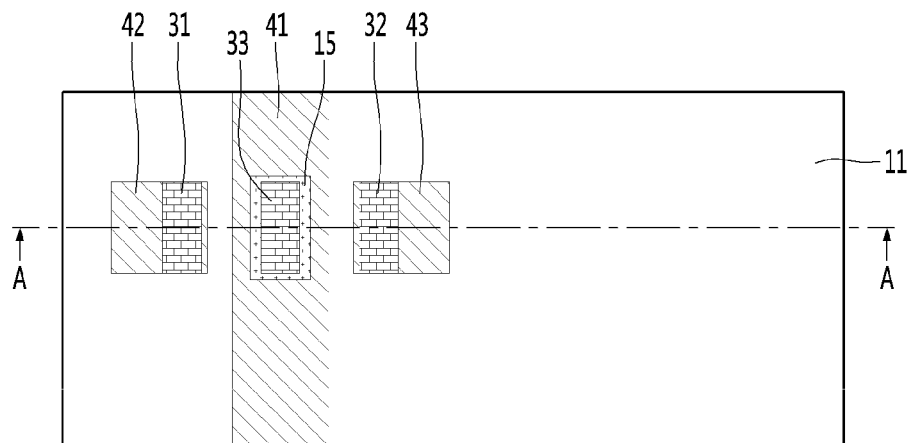
(a)
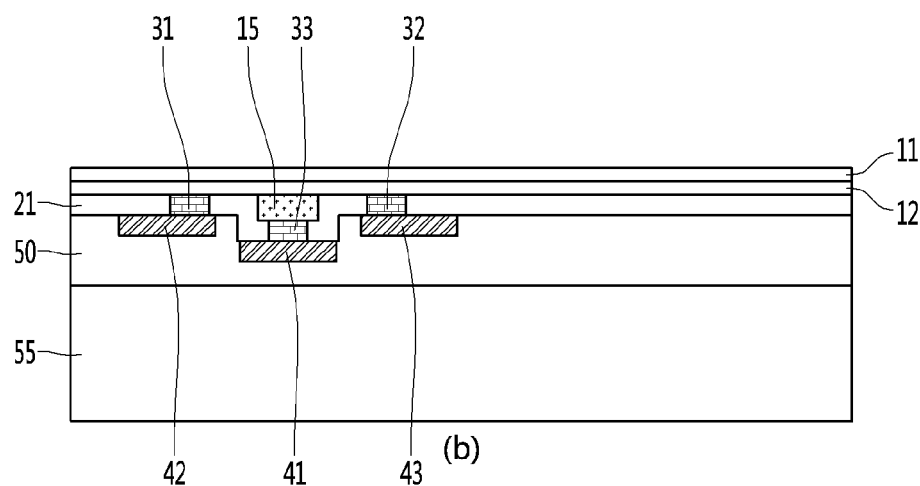
(b)

[FIG. 10]
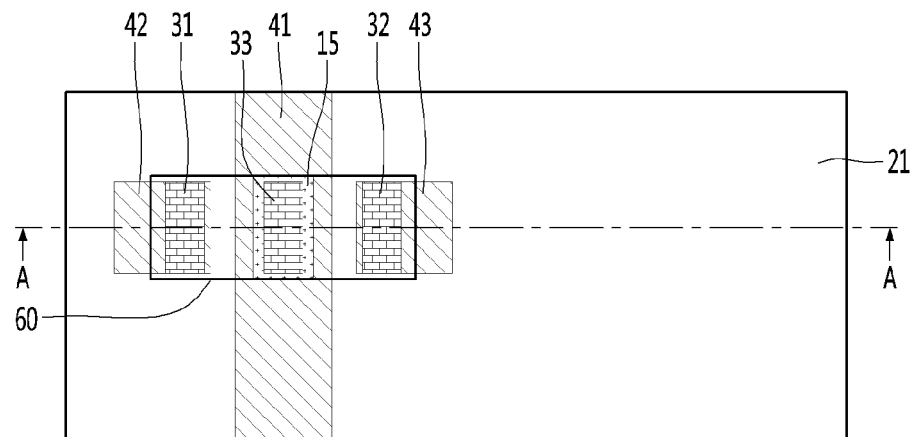
(a)
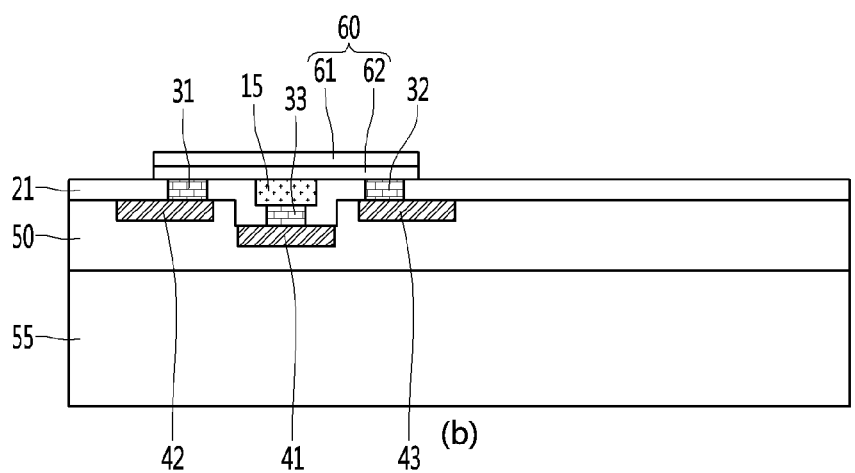
(b)

[FIG. 11]
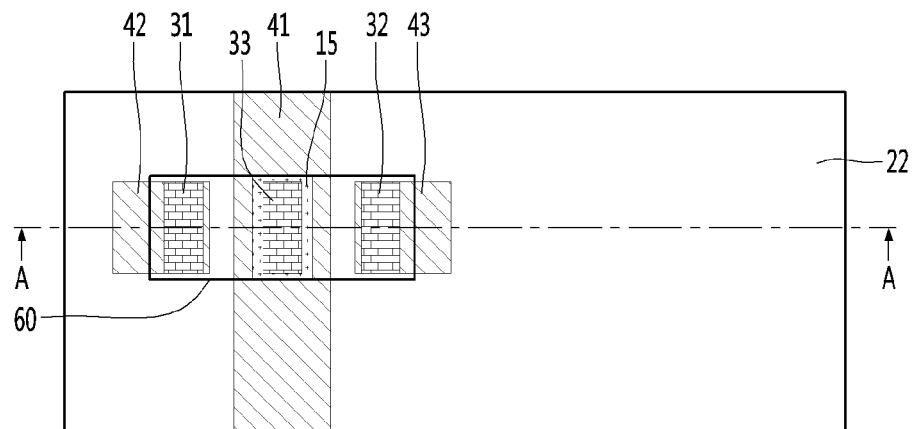
(a)
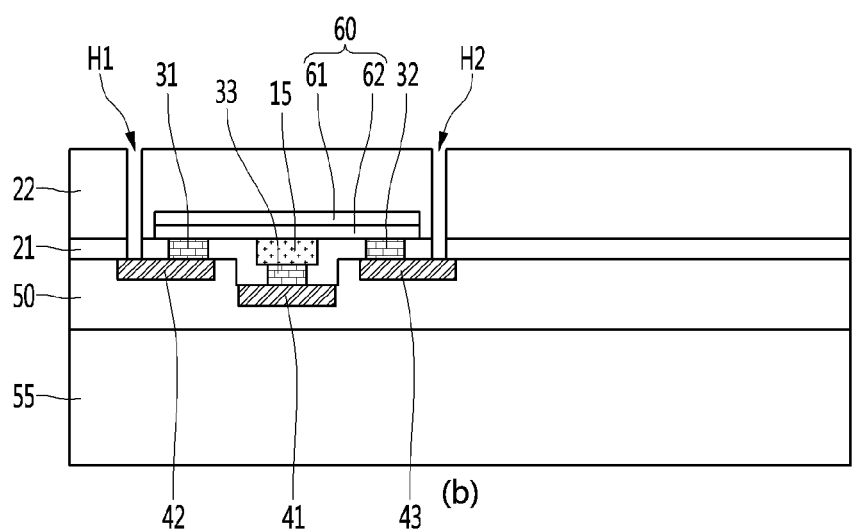
(b)

[FIG. 12]
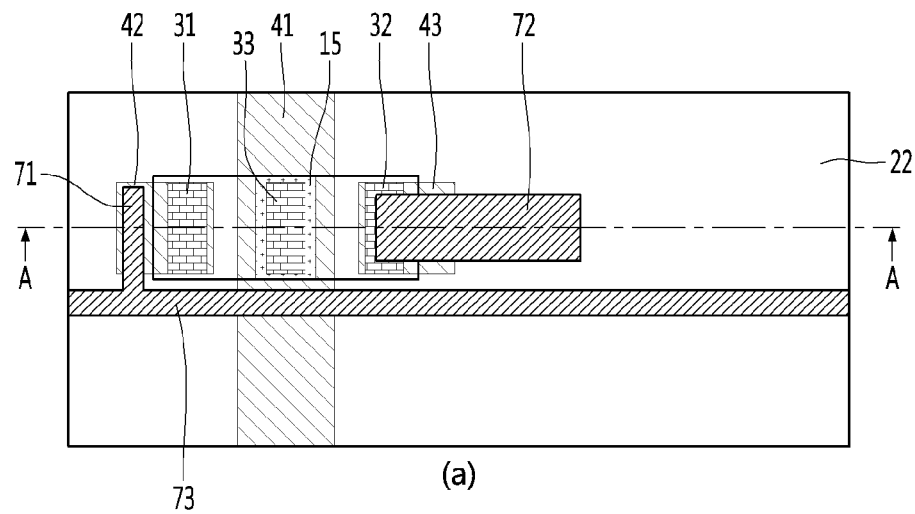
(a)
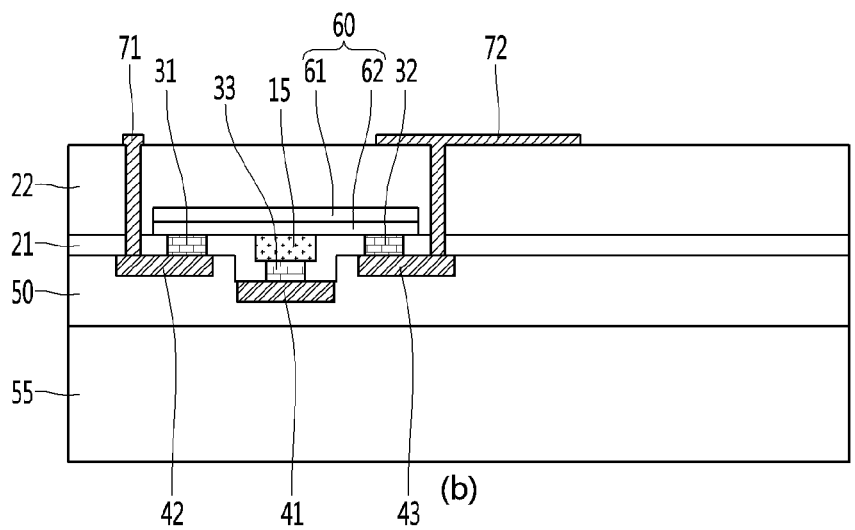
(b)

[FIG. 13]
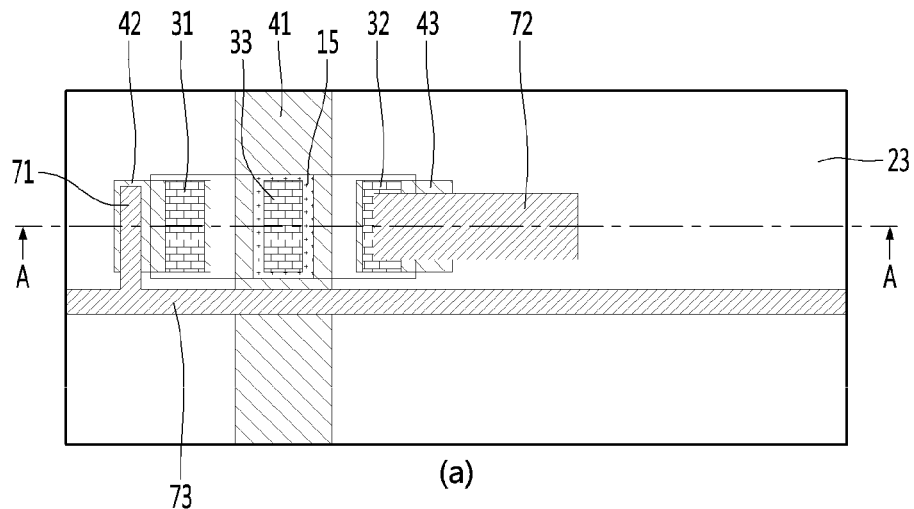
(a)
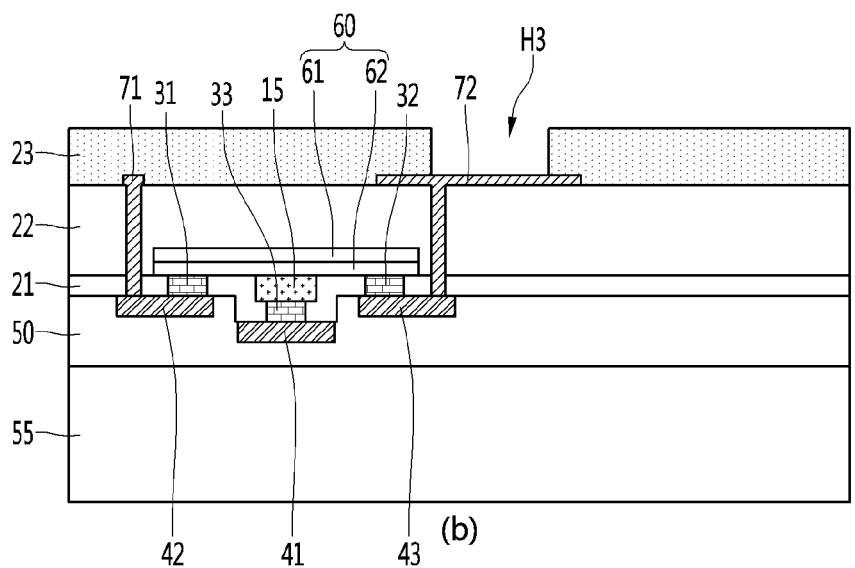
(b)

[FIG. 14]
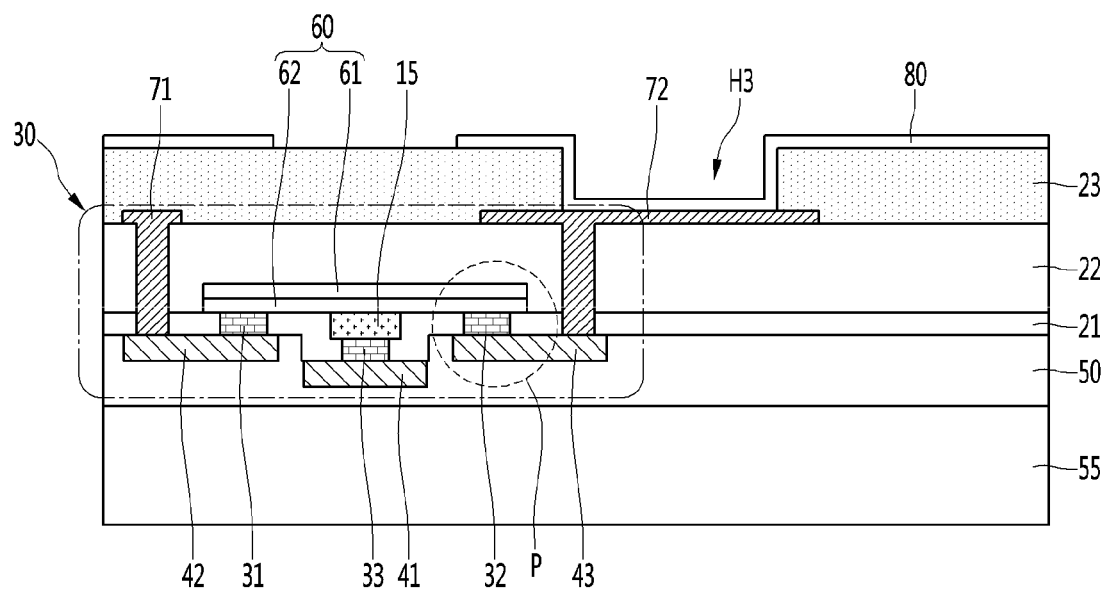

[FIG. 15]
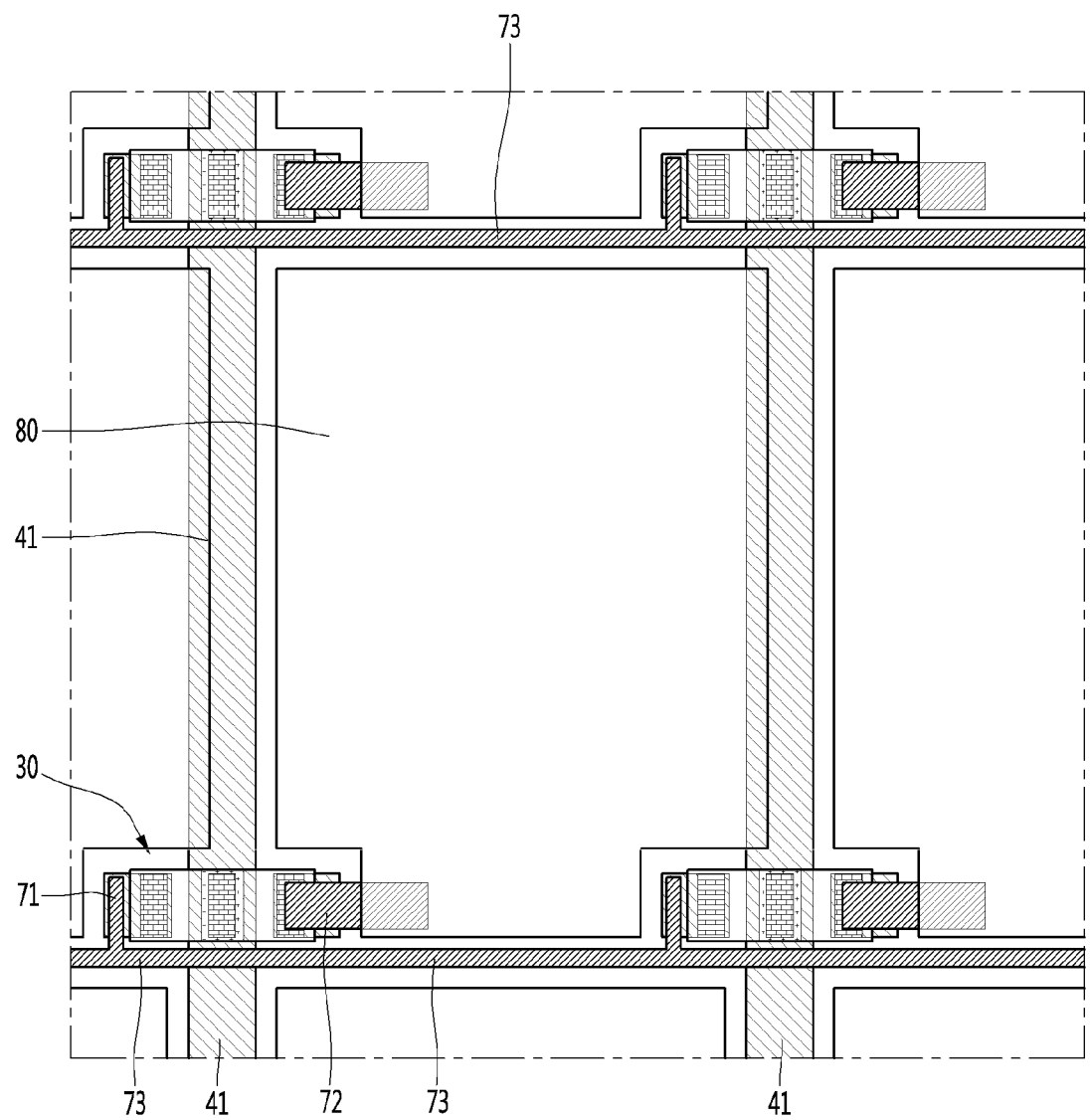

[FIG. 16]
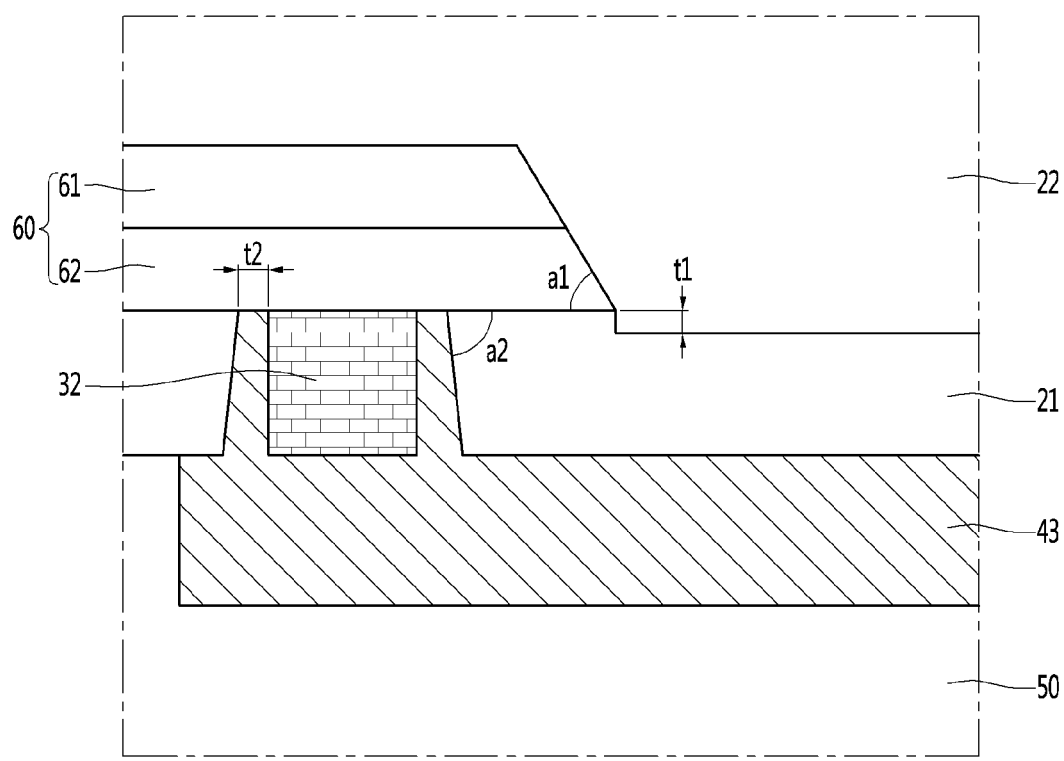

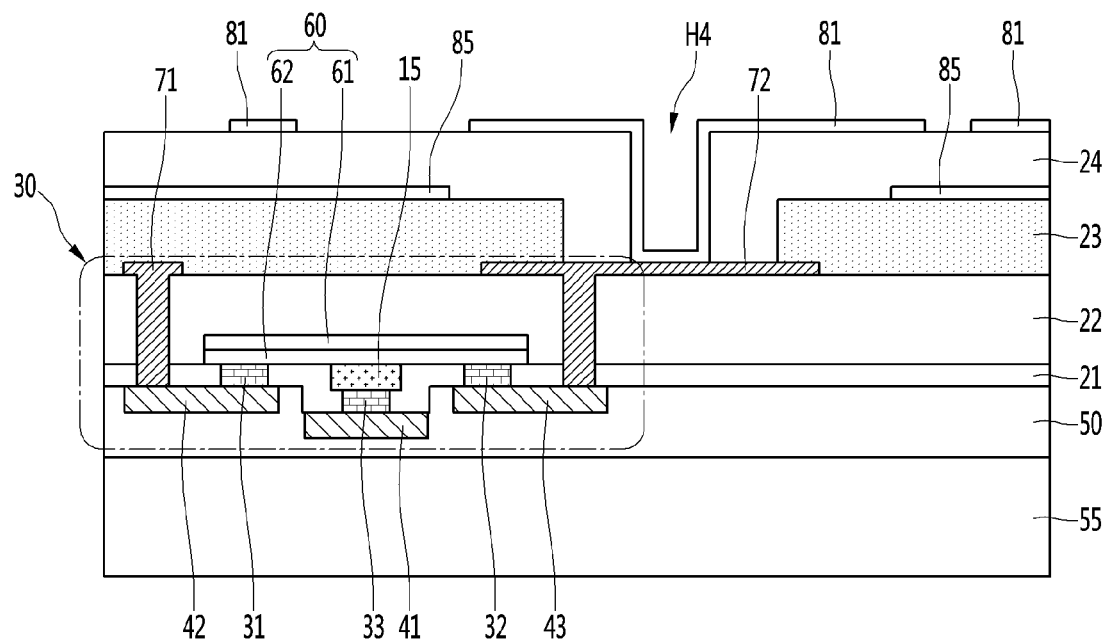
[FIG. 17]

[FIG. 18]
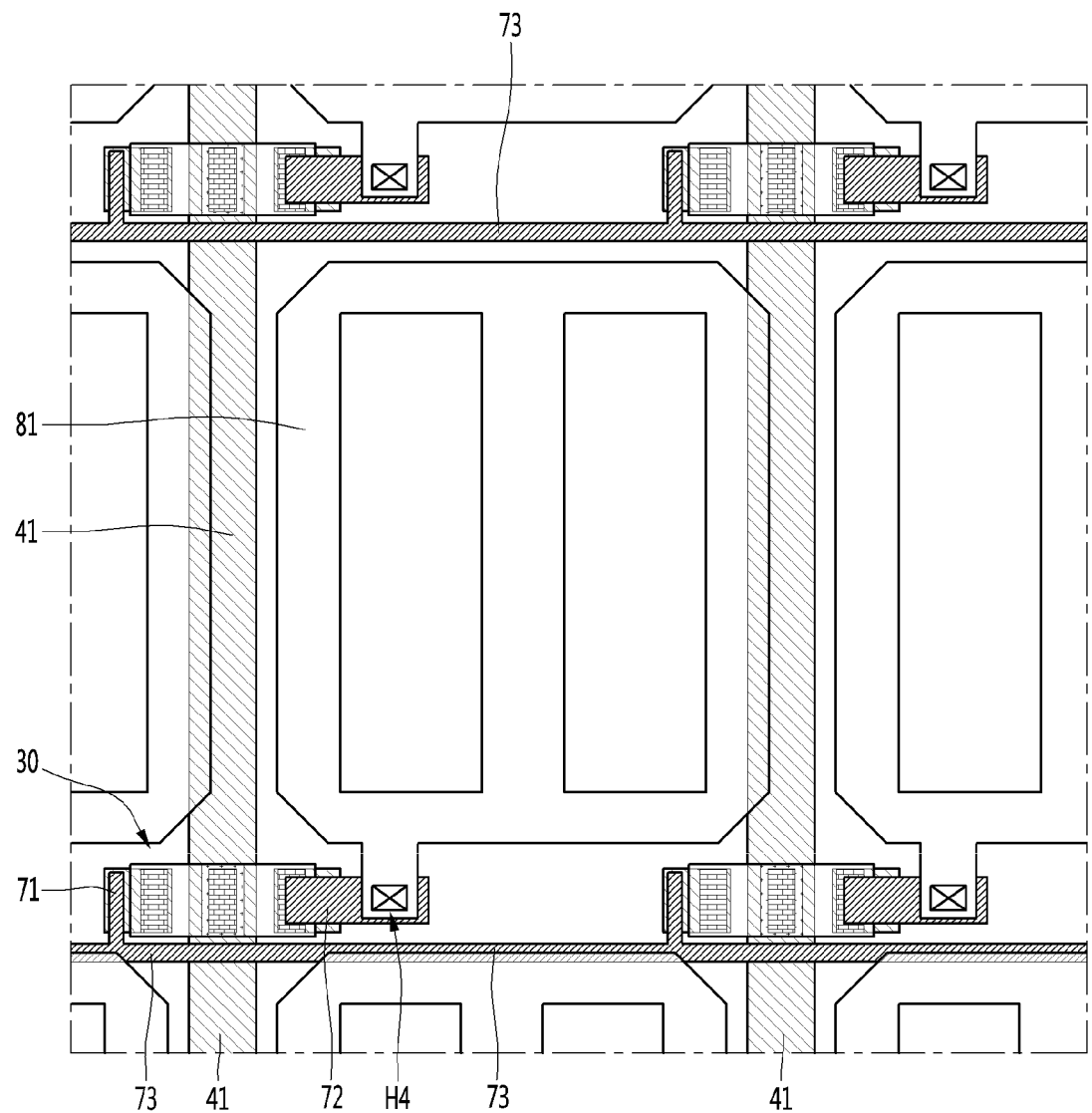

[FIG. 19]
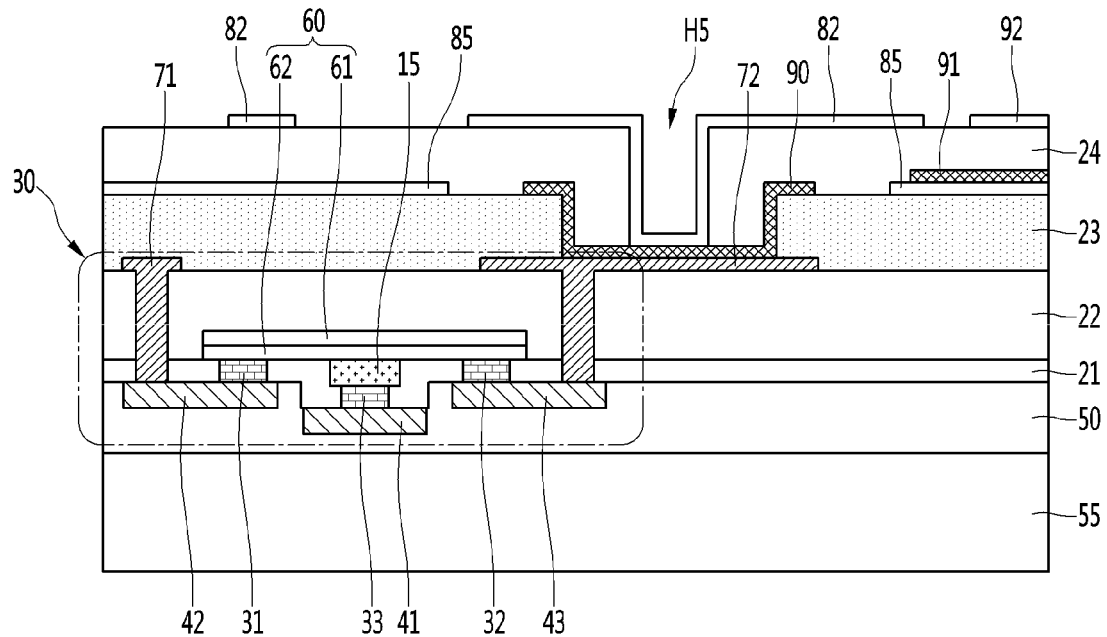
[FIG. 20]
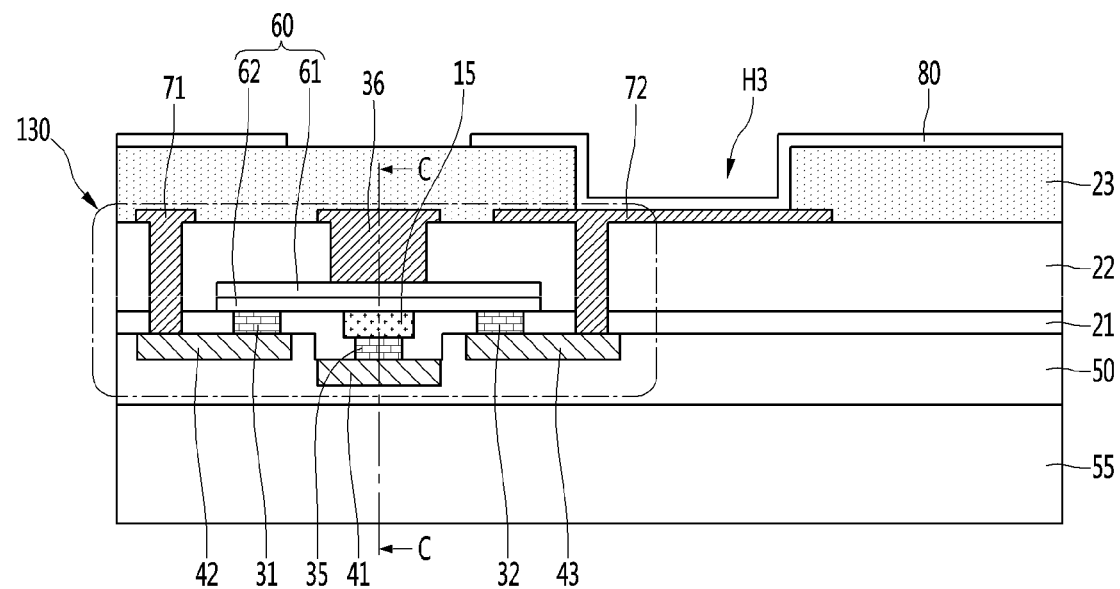

[FIG. 21]
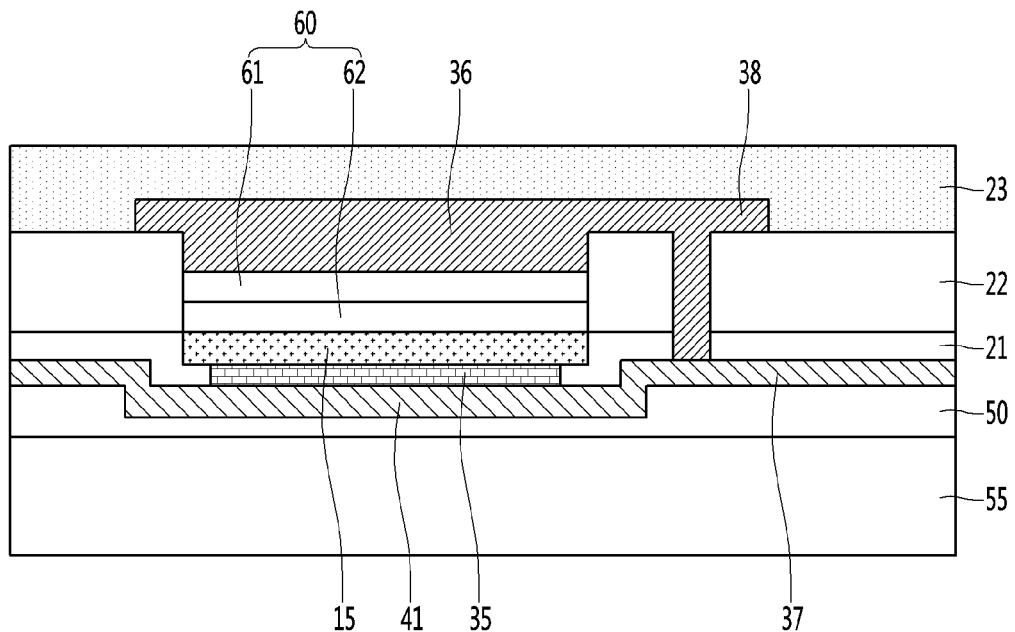
[FIG. 22]
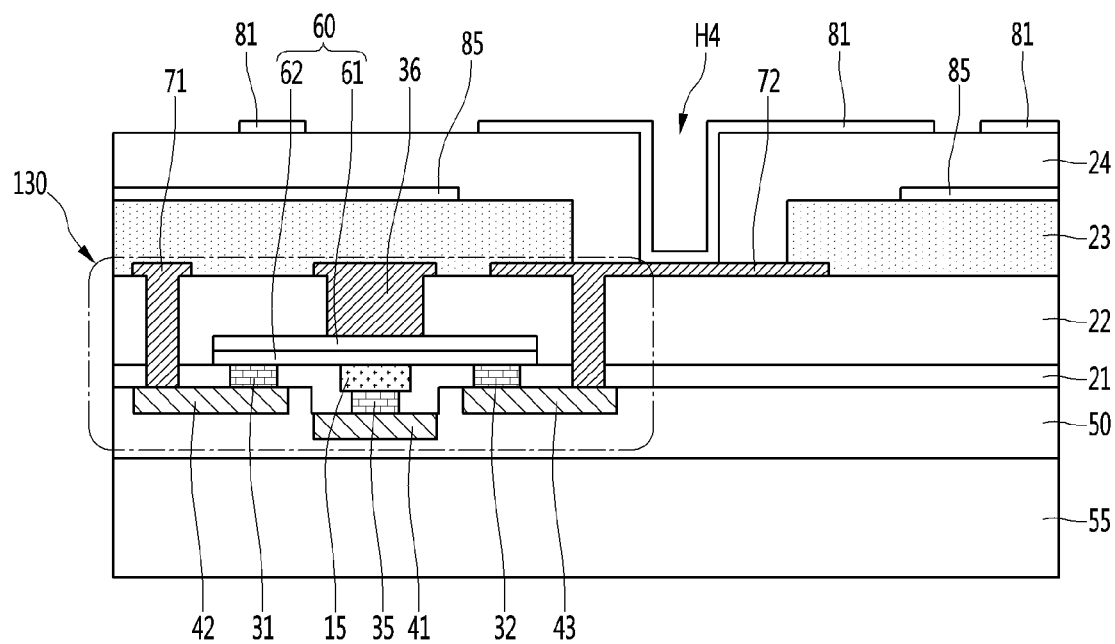

[FIG. 23]
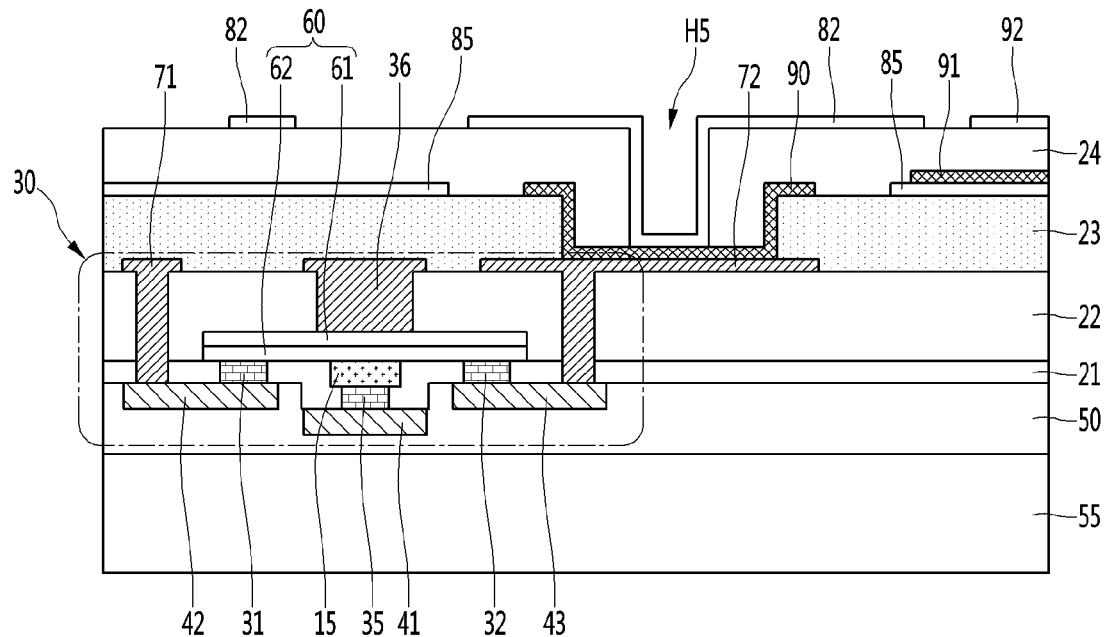
[FIG. 24]
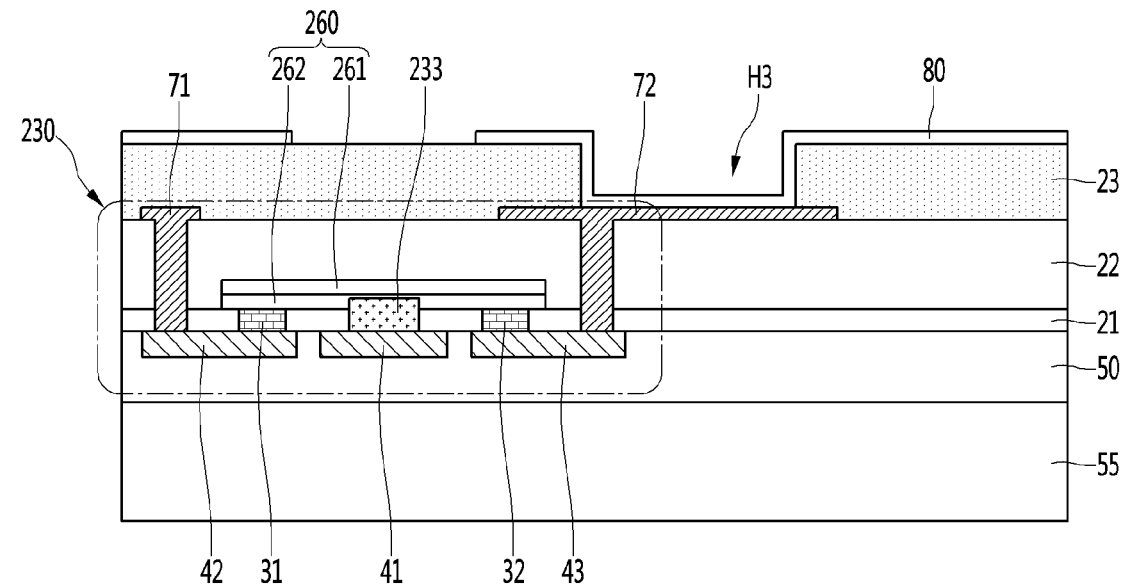

[FIG. 25]
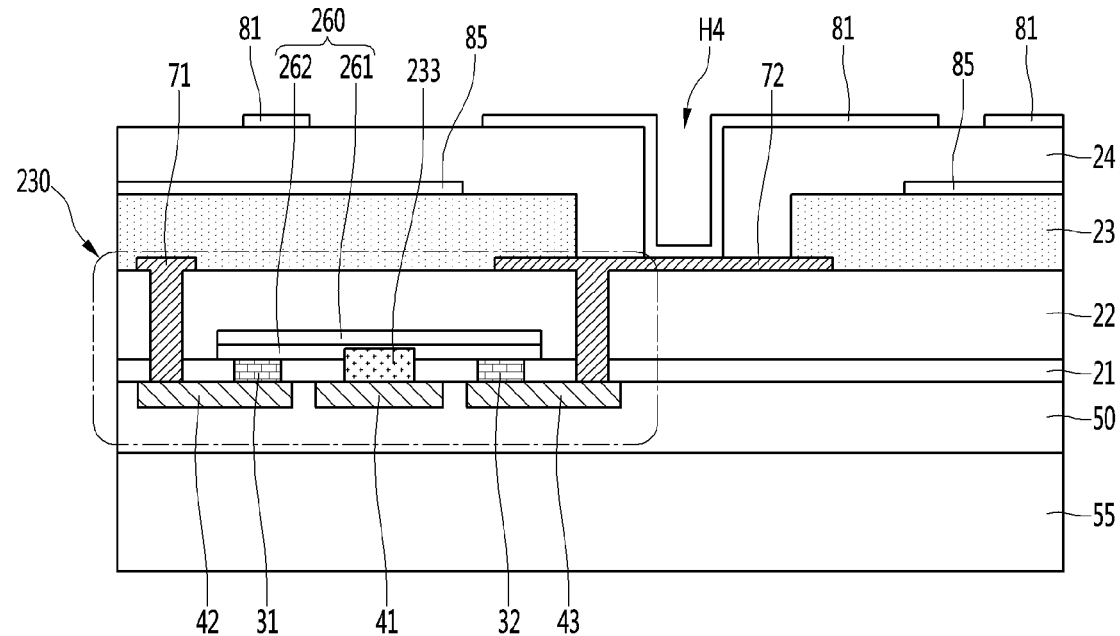
[FIG. 26]
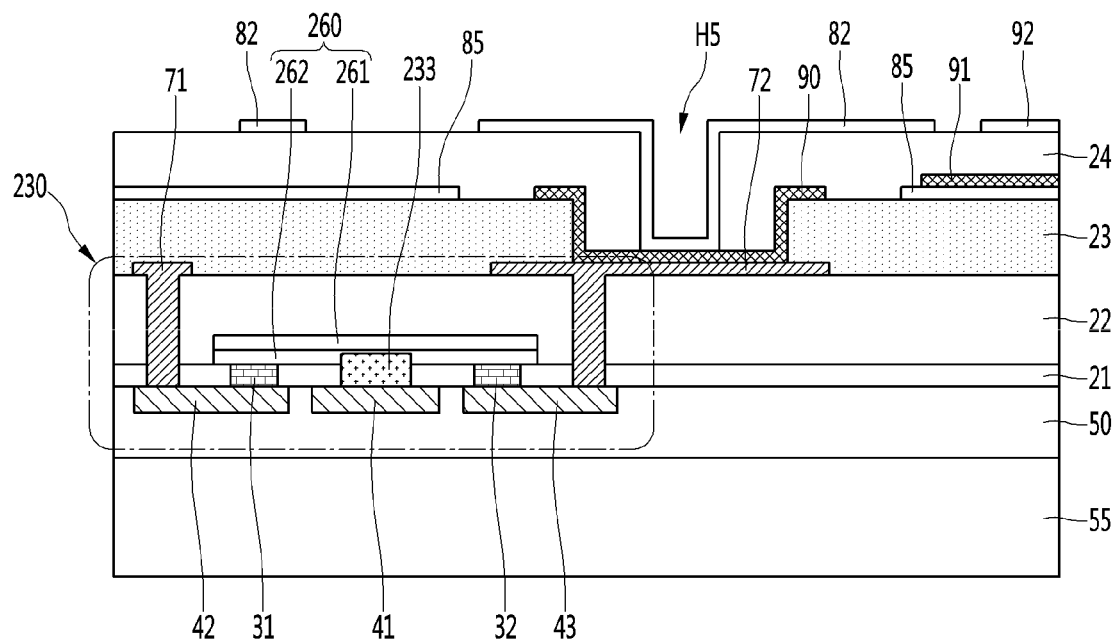

[FIG. 27]
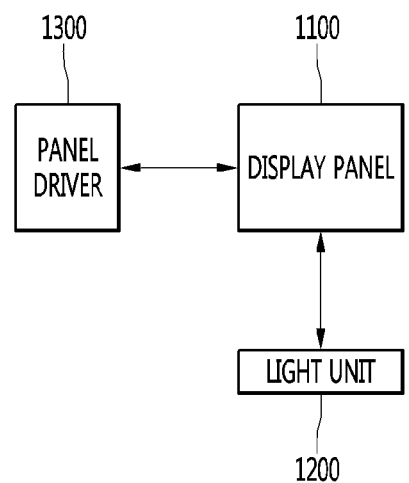

[FIG. 28]
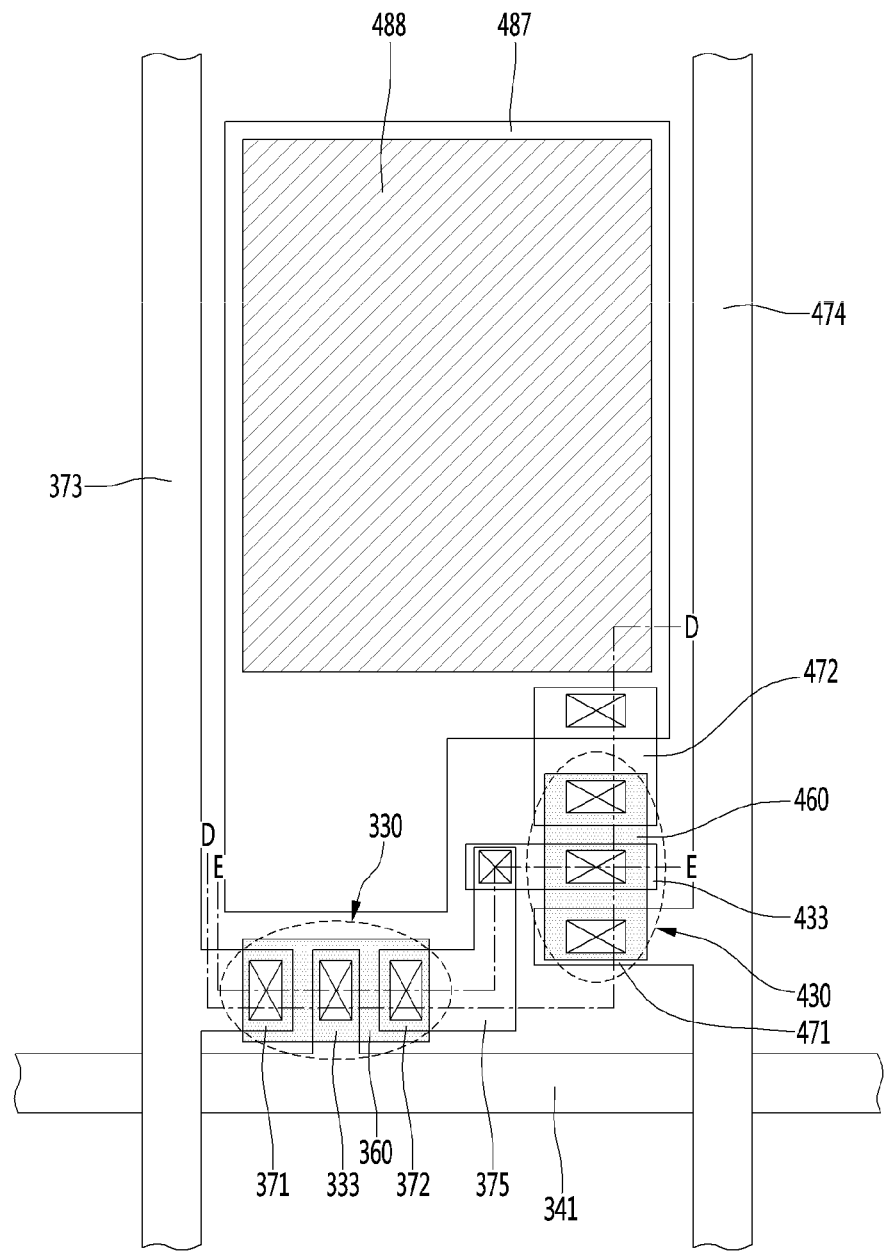

[FIG. 29]
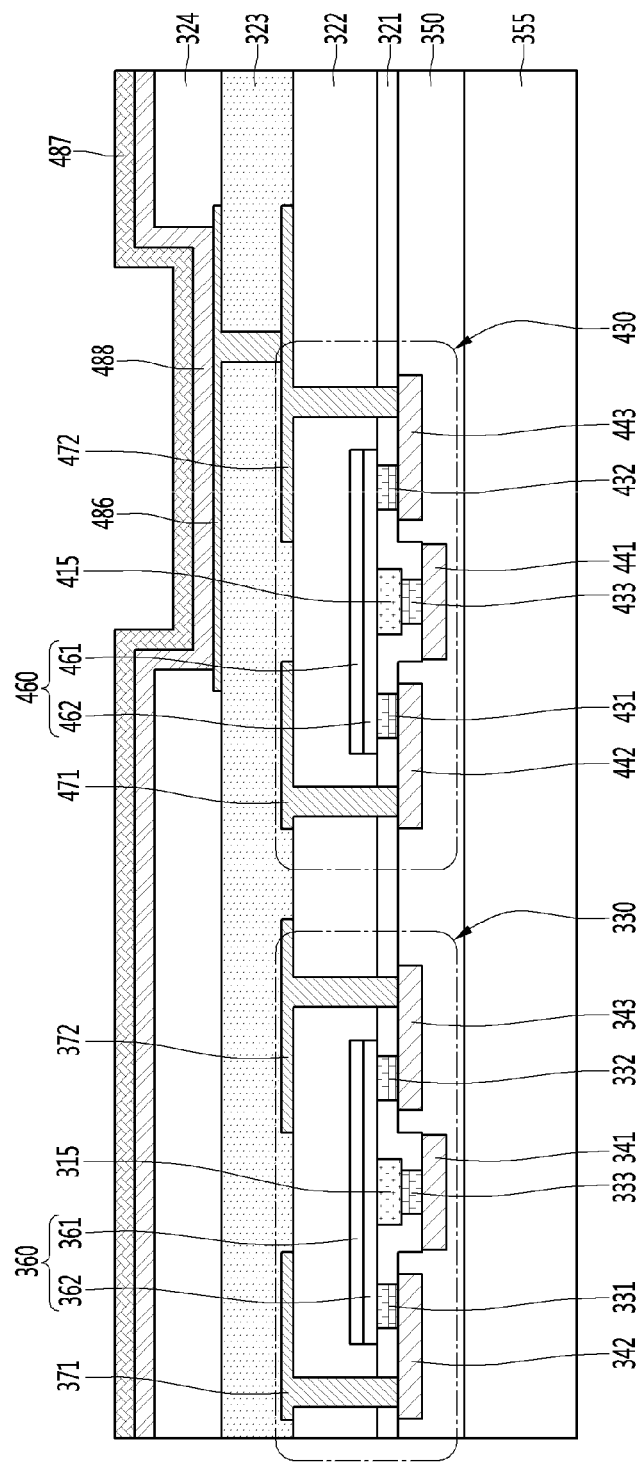

[FIG. 30]
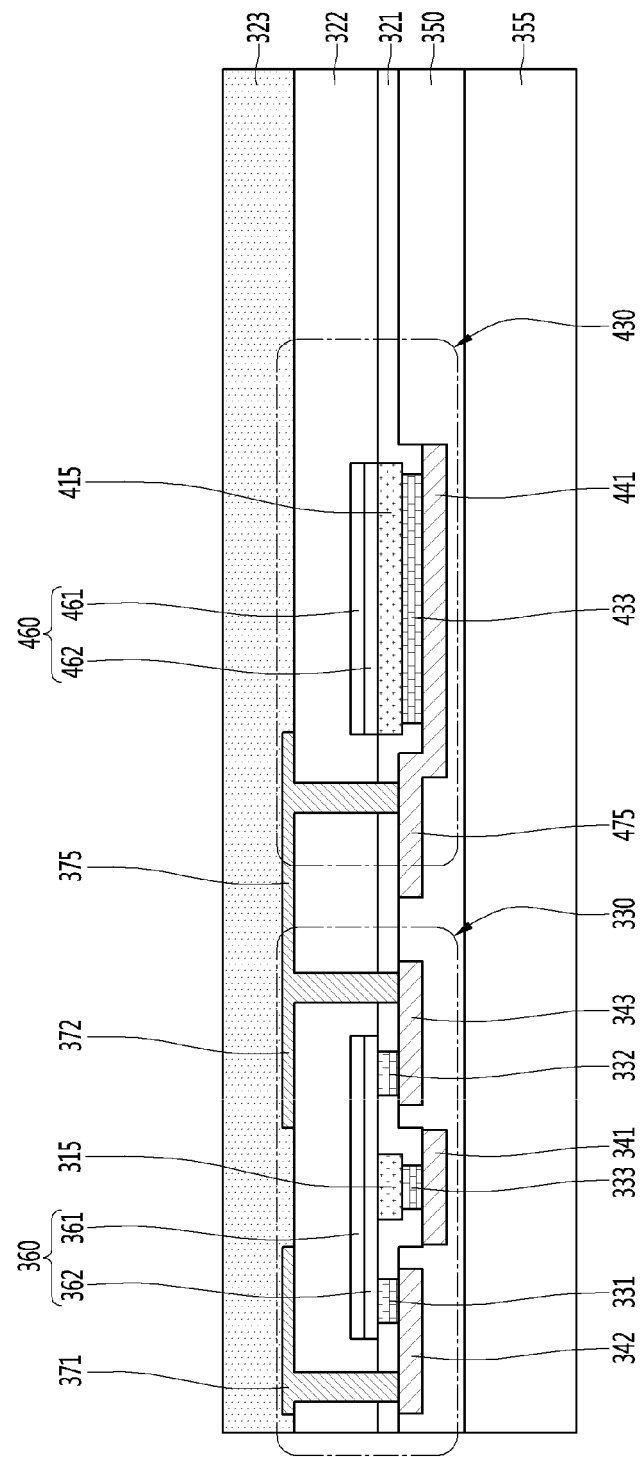

[FIG. 31]
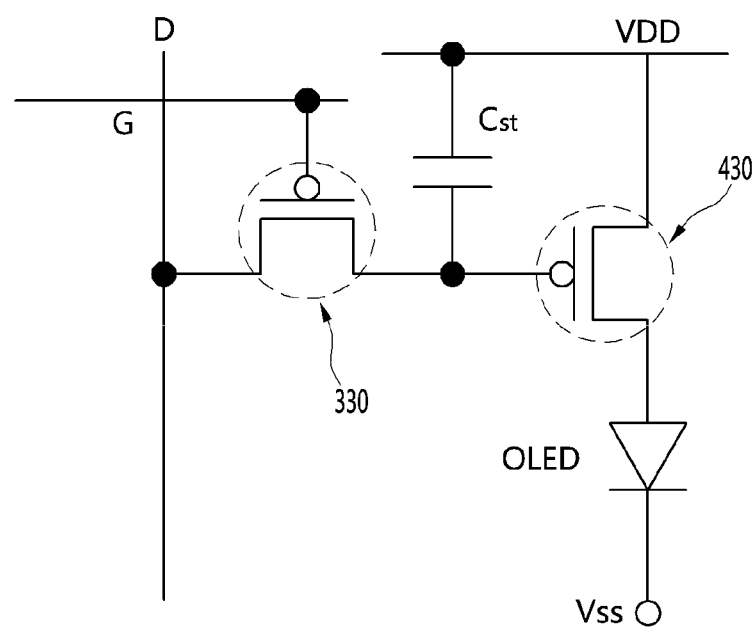

[FIG. 32]
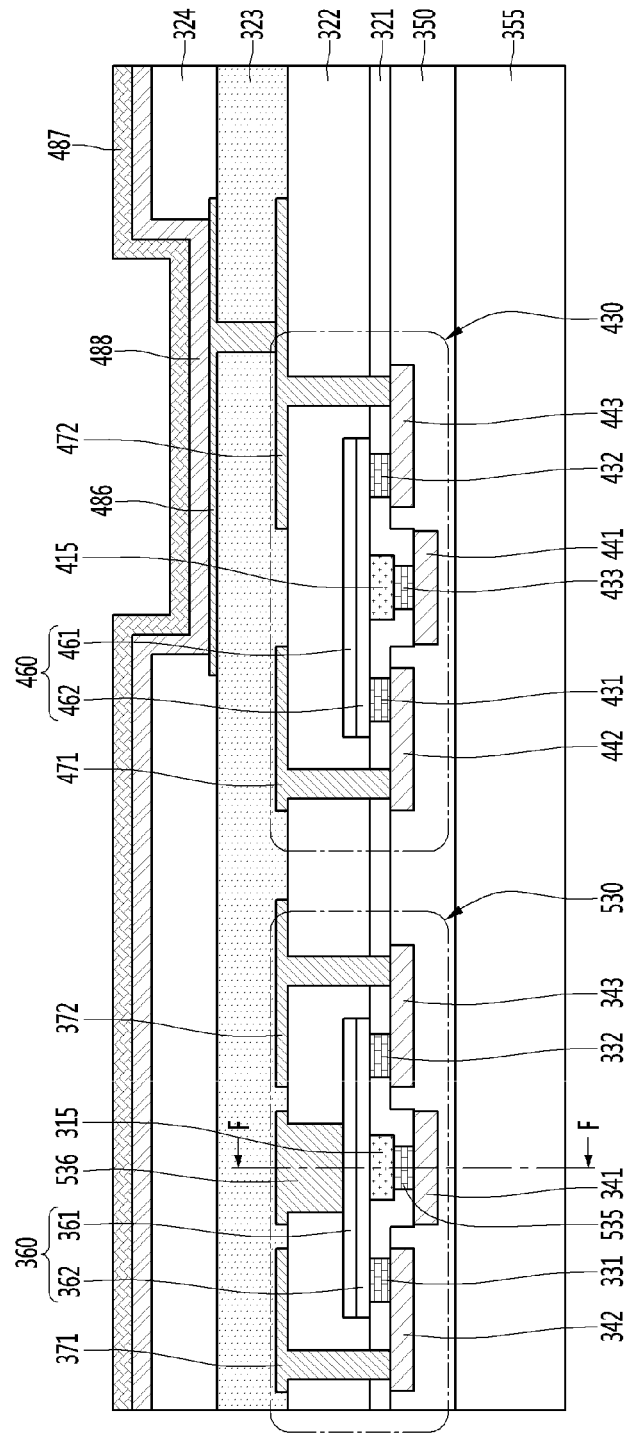

[FIG. 33]
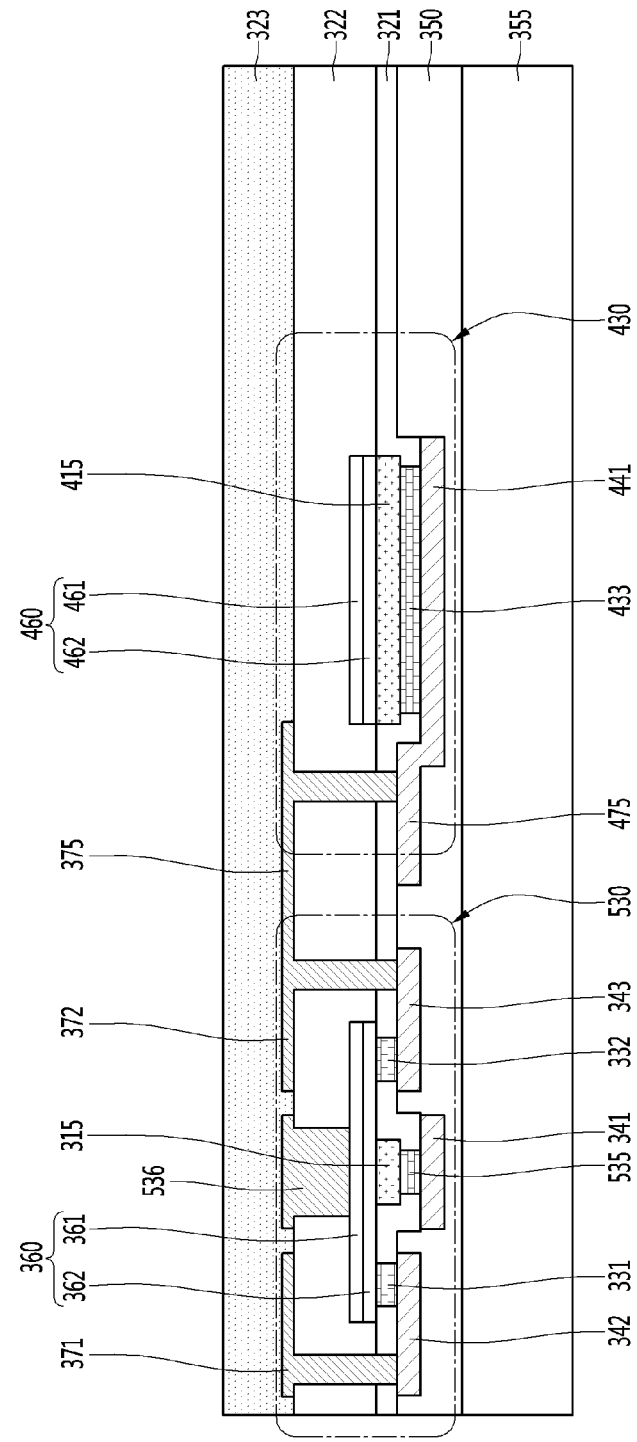

[FIG. 34]
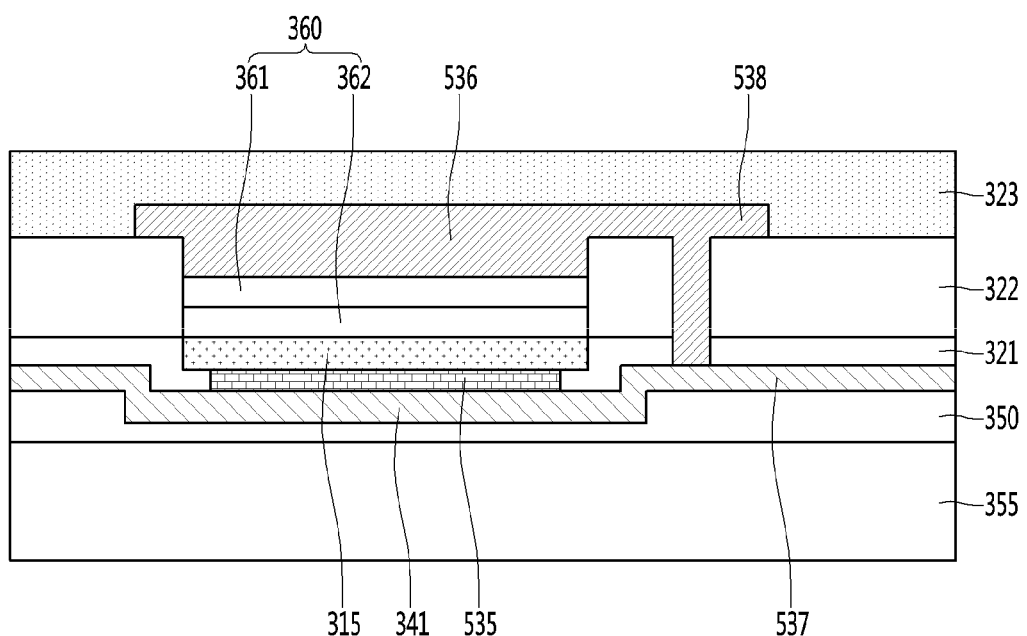

[FIG. 35]
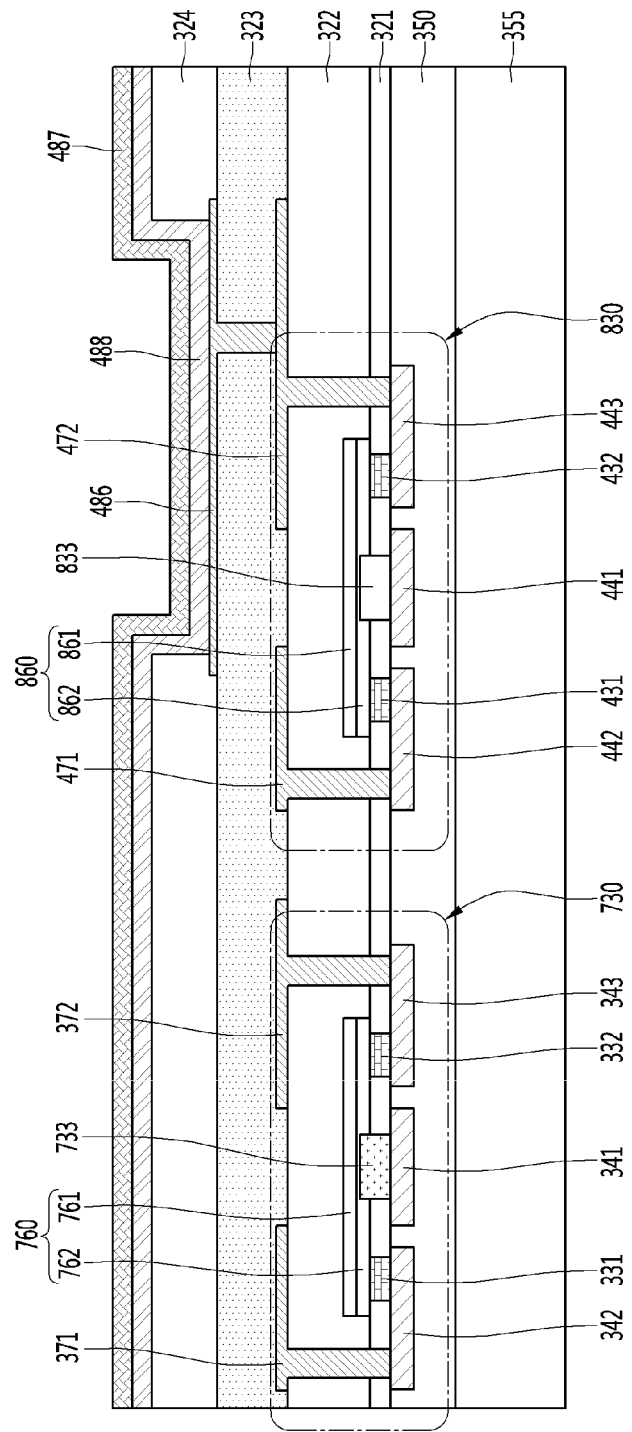

[FIG. 36]
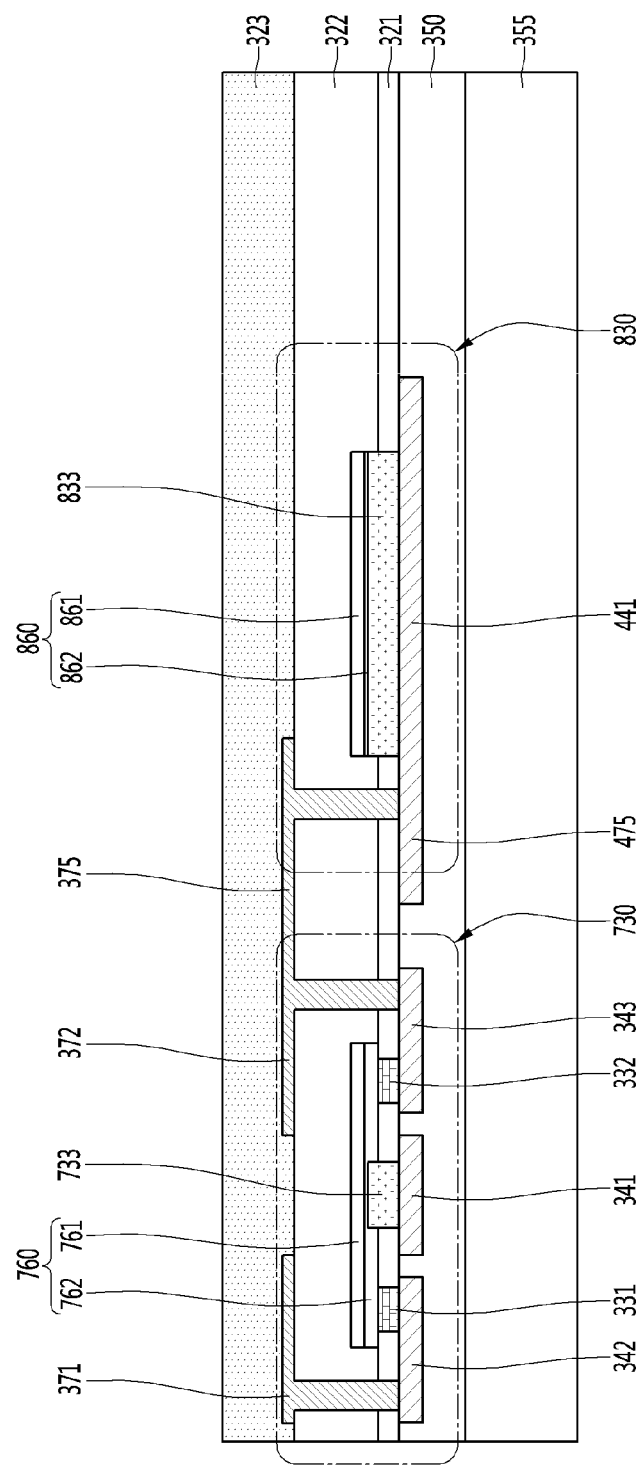

[FIG. 37]
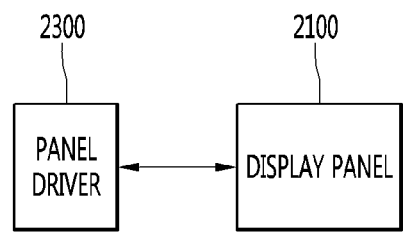

THIN FILM TRANSISTOR SUBSTRATE, AND DISPLAY PANEL AND DISPLAY DEVICE INCLUDING SAME

CROSS REFERENCE TO RELATED APPLICATIONS

This application is the National Phase of PCT International Application No. PCT/KR2016/011573, filed on Oct. 14, 2016, which claims priority under 35 U.S.C. 119(a) to Patent Application No. 10-2015-0184112, filed in the Republic of Korea on Dec. 22, 2015, which is hereby expressly incorporated by reference into the present application.

TECHNICAL FIELD

The present invention relates to a thin film transistor substrate, and a display panel and a display device comprising the same.

BACKGROUND ART

According to development of the information society, demands for display devices for displaying images are increasing in various forms, and demand for high-resolution display devices is also increasing. As a way for realizing a high-resolution display device, the number of pixels per unit area is increased, but the numbers of gate wirings and data wirings are increased in order to supply a gate signal and a data signal in accordance with increased pixels. However, as the number of gate wirings increases, a time (Gate on Time) for which a gate signal may be provided to one pixel is shortened, so that development of a thin film transistor with a high carrier mobility is required.

In addition, as a way for smooth moving picture playback, a way for increasing a driving frequency has been studied, and even when the driving frequency is increased, a time (Gate on Time) for which a gate signal may be provided to one pixel is shortened, so that development of a thin film transistor with a high carrier mobility is required.

DISCLOSURE

Technical Problem

An embodiment provides a thin film transistor substrate capable of increasing mobility of a carrier and ensuring product reliability, and a display panel and a display device comprising the same.

Technical Solution

A thin film transistor substrate according to an embodiment comprises: a support substrate; a bonding layer disposed on the support substrate; a thin film transistor disposed on the bonding layer, the thin film transistor comprising a channel layer comprising a nitride-based semiconductor layer, a source electrode electrically connected to a first region of the channel layer, a drain electrode electrically connected to a second region of the channel layer, a gate electrode disposed under the channel layer, and a depletion forming layer disposed between the channel layer and the gate electrode; and a pixel electrode disposed on the thin film transistor and electrically connected to the drain electrode of the thin film transistor.

A thin film transistor substrate according to an embodiment comprises: a support substrate; a bonding layer disposed on the support substrate; a thin film transistor disposed on the bonding layer, the thin film transistor comprising a channel layer comprising a nitride-based semiconductor layer, a source electrode electrically connected to a first region of the channel layer, a drain electrode electrically connected to a second region of the channel layer, a first gate electrode disposed under the channel layer, a depletion forming layer disposed between the channel layer and the first gate electrode, and a second gate electrode disposed on the channel layer; and a pixel electrode disposed on the thin film transistor and electrically connected to the drain electrode of the thin film transistor.

A thin film transistor substrate according to an embodiment comprises: a support substrate; a bonding layer disposed on the support substrate; a thin film transistor disposed on the bonding layer, the thin film transistor comprising a channel layer comprising a nitride-based semiconductor layer and having a recessed region recessed in an upward direction on a lower surface thereof, a source electrode electrically connected to a first region of a lower surface of the channel layer, a drain electrode electrically connected to a second region of the lower surface of the channel layer, and a gate electrode disposed in the recessed region of the channel layer; and a pixel electrode disposed on the thin film transistor and electrically connected to the drain electrode of the thin film transistor.

A thin film transistor substrate according to an embodiment comprises: a support substrate; a bonding layer disposed on the support substrate; a switching thin film transistor disposed on the bonding layer, the switching thin film transistor comprising a first channel layer comprising a nitride-based semiconductor layer, a first source electrode electrically connected to a first region of the first channel layer, a first drain electrode electrically connected to a second region of the first channel layer, a first gate electrode disposed under the first channel layer, and a first depletion forming layer disposed between the first channel layer and the first gate electrode; a driving thin film transistor disposed on the bonding layer, the driving thin film transistor comprising a second channel layer comprising a nitride-based semiconductor layer, a second source electrode electrically connected to a first region of the second channel layer, a second drain electrode electrically connected to a second region of the second channel layer, a second gate electrode disposed under the second channel layer, and a second depletion forming layer disposed between the second channel layer and the second gate electrode; a lower electrode disposed on the driving thin film transistor and electrically connected to the driving thin film transistor; a light-emitting layer disposed on the lower electrode; and an upper electrode disposed on the light-emitting layer.

A thin film transistor substrate according to an embodiment comprises: a support substrate; a bonding layer disposed on the support substrate; a switching thin film transistor disposed on the bonding layer, the switching thin film transistor comprising a channel layer comprising a nitride-based semiconductor layer, a first source electrode electrically connected to a first region of the first channel layer, a first drain electrode electrically connected to a second region of the first channel layer, a first gate electrode disposed under the first channel layer, a first depletion forming layer disposed between the first channel layer and the first gate electrode, and a double gate electrode disposed on the first channel layer; a driving thin film transistor disposed on the bonding layer, the driving thin film transistor comprising a second channel layer comprising a nitride-based semiconductor layer, a second source electrode electrically connected to a first region of the second channel layer, a second drain electrode electrically connected to a second region of the second channel layer, a second gate electrode disposed under the second channel layer, and a second depletion forming layer disposed between the second channel layer and the second gate electrode; a lower electrode disposed on the driving thin film transistor and electrically connected to the driving thin film transistor; a light-emitting layer disposed on the lower electrode; and an upper electrode disposed on the light-emitting layer.

A thin film transistor substrate according to an embodiment comprises: a support substrate; a bonding layer disposed on the support substrate; a switching thin film transistor disposed on the bonding layer, the switching thin film transistor comprising a first channel layer comprising a nitride-based semiconductor layer and having a first recessed region recessed in an upward direction on a lower surface thereof, a first source electrode electrically connected to a first region of a lower surface of the first channel layer, a first drain electrode electrically connected to a second region of the lower surface of the first channel layer, and a first gate electrode disposed in the first recessed region of the first channel layer; a driving thin film transistor disposed on the bonding layer, the driving thin film transistor comprising a second channel layer comprising a nitride-based semiconductor layer and having a second recessed region recessed in an upward direction on a lower surface thereof, a second source electrode electrically connected to a first region of a lower surface of the second channel layer, a second drain electrode electrically connected to a second region of the lower surface of the second channel layer, and a second gate electrode disposed in the second recessed region of the second channel layer; a lower electrode disposed on the driving thin film transistor and electrically connected to the driving thin film transistor; a light-emitting layer disposed on the lower electrode; and an upper electrode disposed on the light-emitting layer.

A liquid crystal display panel according to an embodiment comprises: a support substrate; a bonding layer disposed on the support substrate; a thin film transistor disposed on the bonding layer, the thin film transistor comprising a channel layer comprising a nitride-based semiconductor layer, a source electrode electrically connected to a first region of the channel layer, a drain electrode electrically connected to a second region of the channel layer, a gate electrode disposed under the channel layer, and a depletion forming layer disposed between the channel layer and the gate electrode; a thin film transistor substrate comprising a pixel electrode disposed on the thin film transistor and electrically connected to the drain electrode of the thin film transistor; a color filter substrate disposed on the thin film transistor substrate; and a liquid crystal layer provided between the thin film transistor substrate and the color filter substrate.

A display device according to an embodiment comprises: a support substrate; a bonding layer disposed on the support substrate; a thin film transistor disposed on the bonding layer, the thin film transistor comprising a channel layer comprising a nitride-based semiconductor layer, a source electrode electrically connected to a first region of the channel layer, a drain electrode electrically connected to a second region of the channel layer, a gate electrode disposed under the channel layer, and a depletion forming layer disposed between the channel layer and the gate electrode; a display panel comprising a thin film transistor substrate comprising a pixel electrode disposed on the thin film transistor and electrically connected to the drain electrode of the thin film transistor, and a color filter substrate disposed on the thin film transistor substrate; and a light unit disposed below the display panel to supply light to the display panel.

Advantageous Effects

A thin film transistor substrate according to an embodiment, and a display panel and a display device comprising the same, have an advantage of realizing a high resolution and reproducing a smooth moving picture by providing a high carrier mobility.

DESCRIPTION OF DRAWINGS

FIG. 1 is a view illustrating a thin film transistor substrate according to an embodiment of the present invention.

FIGS. 2 to 14 are views illustrating an example of a manufacturing process of the thin film transistor substrate shown in FIG. 1 according to an embodiment of the present invention.

FIG. 15 is a view illustrating an example in which a plurality of pixels are disposed on a thin film transistor substrate according to an embodiment of the present invention.

FIG. 16 is a view illustrating an example in which source/drain contact portions and source/drain connecting wirings are disposed on a thin film transistor substrate according to an embodiment of the present invention FIGS. 17 and 18 are views illustrating another example of a thin film transistor substrate according to an embodiment of the present invention.

FIG. 19 is a view illustrating still another example of a thin film transistor substrate according to an embodiment of the present invention.

FIGS. 20 and 21 are views illustrating still another example of a thin film transistor substrate according to an embodiment of the present invention.

FIG. 22 is a view illustrating still another example of a thin film transistor substrate according to an embodiment of the present invention.

FIG. 23 is a view illustrating still another example of a thin film transistor substrate according to an embodiment of the present invention.

FIG. 24 is a view illustrating still another example of a thin film transistor substrate according to an embodiment of the present invention.

FIG. 25 is a view illustrating still another example of a thin film transistor substrate according to an embodiment of the present invention.

FIG. 26 is a view illustrating still another example of a thin film transistor substrate according to an embodiment of the present invention.

FIG. 27 is a block diagram illustrating an example of a display device comprising a thin film transistor substrate according to an embodiment of the present invention.

FIG. 28 is a view illustrating still another example of a thin film transistor substrate according to an embodiment of the present invention.

FIG. 29 is a cross-sectional view taken along line D-D of the thin film transistor substrate shown in FIG. 28 according to the embodiment of the present invention.

FIG. 30 is a cross-sectional view taken along line E-E of the thin film transistor substrate shown in FIG. 28 according to the embodiment of the present invention.

FIG. 31 is a circuit diagram equivalently illustrating one pixel in the thin film transistor substrate described with reference to FIGS. 28 to 30.

FIGS. 32 to 34 are views illustrating still another example of a thin film transistor substrate according to an embodiment of the present invention.

FIGS. 35 and 36 are views illustrating still another example of a thin film transistor substrate according to an embodiment of the present invention.

FIG. 37 is a block diagram illustrating an example of a display device comprising a thin film transistor substrate according to an embodiment of the present invention.

MODES OF THE INVENTION

In the description of an embodiment, when it is described that each layer (film), region, pattern, or structure is formed "above/on" or "below/under" a substrate, each layer (film), region, pad or pattern, the description comprises being formed both "directly" and "indirectly (by interposing another layer)" "above/on" or "below/under". Also, a standard of above/on or below/under of each layer will be described based on the drawings.

Hereinafter, a thin film transistor substrate, a display panel, a display device, and a method of manufacturing a thin film transistor substrate according to embodiments of the present invention will be described in detail with reference to the accompanying drawings.

FIG. 1 is a view illustrating a thin film transistor substrate according to an embodiment of the present invention.

As shown in FIG. 1, the thin film transistor substrate according to an embodiment of the present invention may comprise a support substrate 55, a thin film transistor 30 disposed on the support substrate 55, and a pixel electrode 80 electrically connected to the thin film transistor 30.

The thin film transistor 30 according to an embodiment may comprise a depletion forming layer 15, a gate electrode 33, a channel layer 60, a source electrode 71, and a drain electrode 72. The source electrode 71 may be electrically connected to a first region of the channel layer 60. The source electrode 71 may be electrically connected to a lower surface of the channel layer 60. The drain electrode 72 may be electrically connected to a second region of the channel layer 60. The drain electrode 72 may be electrically connected to the lower surface of the channel layer 60. The gate electrode 33 may be disposed under the channel layer 60. The depletion forming layer 15 may be disposed under between the first region and the second region of the channel layer 60. The depletion forming layer 15 may be disposed between the channel layer 60 and the gate electrode 33.

The channel layer 60 may be provided with, for example, a Group III-V compound semiconductor. For example, the channel layer 60 may be provided with a semiconductor material having an empirical formula of $In_xAl_yGa_{1-x-y}N$ ($0 \geq x \geq 1$, $0 \geq y \geq 1$, $0 \geq x+y \geq 1$). The channel layer 60 may comprise a single layer or multiple layers selected from, for example, GaN, AlN, AlGaN, InGaN, InN, InAlGaN, AlInN, AlGaAs, GaP, GaAs, GaAsP, AlGaInP and so on.

The channel layer 60 may comprise a first nitride semiconductor layer 61 and a second nitride semiconductor layer 62. The first nitride semiconductor layer 61 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). The second nitride semiconductor layer 62 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$).

According to the channel layer 60 according to an embodiment, the first nitride semiconductor layer 61 may comprise a GaN semiconductor layer, and the second nitride semiconductor layer 62 may comprise an AlGaN semiconductor layer. The second nitride semiconductor layer 62 may be disposed between the first nitride semiconductor layer 61 and the depletion forming layer 15.

The depletion forming layer 15 may be provided with, for example, a Group III-V compound semiconductor. For example, the depletion forming layer 15 may be provided with a semiconductor material having an empirical formula of $In_xAl_yGa_{1-x-y}N$ ($0 \geq x \geq 1$, $0 \geq y \geq 1$, $0 \geq x+y \geq 1$). The depletion forming layer 15 may comprise a single layer or multiple layers selected from, for example, GaN, AlN, AlGaN, InGaN, InN, InAlGaN, AlInN, AlGaAs, GaP, GaAs, GaAsP, AlGaInP and so on. The depletion forming layer 15 may comprise a nitride semiconductor layer doped with a p-type dopant. For example, the depletion forming layer 15 may comprise a GaN semiconductor layer doped with a p-type dopant or an AlGaN semiconductor layer doped with a p-type dopant. The depletion forming layer 15 may comprise a single layer or multiple layers provided with, for example, a semiconductor material having an empirical formula of $p\text{-}Al_xGa_{1-x}N$ ($0 \geq x \geq 0.3$). The depletion forming layer 15 may be provided in a thickness of 2 to 300 nm as an example.

The depletion forming layer 15 may serve to form a depletion region at two-dimensional electron gas (2DEG) provided at the channel layer 60. The energy bandgap of a portion of the second nitride semiconductor layer 62 positioned thereon may be increased by the depletion forming layer 15. As a result, the depletion region of the 2DEG may be provided at a portion of the channel layer 60 corresponding to the depletion forming layer 15. Therefore, a region corresponding to the position in which the depletion forming layer 15 is disposed in the 2DEG provided at the channel layer 60 may be cut off. The region in which the 2DEG is cut off at the channel layer 60 may be referred to as a cut-off region. For example, a cut-off region may be formed at the second nitride semiconductor layer 62. The thin film transistor 30 may have a normally-off characteristic due to such a cut-off region. When a voltage equal to or higher than a threshold voltage is applied to the gate electrode 33, the 2DEG is generated at the cut-off region and the thin film transistor 30 is turned on. When a channel formed at an upper portion of the gate electrode 33 is turned on, a current may flow via the 2DEG formed at the channel layer 60. Accordingly, the current flow from the first region to the second region of the channel layer 60 may be controlled according to a voltage applied to the gate electrode 33.

The support substrate 55 may comprise a transparent substrate. The support substrate 55 may be provided with, for example, a transparent substrate having a thickness of 0.1 mm to 3 mm. The support substrate 55 may comprise at least one material selected from materials comprising silicon, glass, polyimide, and plastic. The support substrate 55 may comprise a flexible substrate.

The support substrate 55 is a substrate to be used in a transfer process which will be described later, and serves to support the thin film transistor 30. In addition, the thin film transistor substrate according to an embodiment may comprise a bonding layer 50 provided between the support substrate 55 and the thin film transistor 30.

The bonding layer 50 may comprise an organic material. The bonding layer 50 may be provided with a transparent material. The bonding layer 50 may be provided with, for example, a material having a transmittance of 70% or more. The bonding layer 50 may comprise an organic insulating material. The bonding layer 50 may comprise at least one material selected from the group consisting of acryl, benzocyclobutene (BCB), SU-8 polymer, and the like. The bonding layer 50 may be provided in a thickness of 0.5 to 6 µm as an example.

The thin film transistor 30 according to an embodiment may comprise a source contact portion 31 disposed under the first region of the channel layer 60 and a drain contact portion 32 disposed under the second region of the channel layer 60. The source contact portion 31 may be disposed in contact with the first region of the channel layer 60. The drain contact portion 32 may be disposed in contact with the second region of the channel layer 60.

The thin film transistor 30 according to an embodiment may comprise a source connecting wiring 42 disposed under the source contact portion 31 and a drain connecting wiring 43 disposed under the drain contact portion 32. In addition, the thin film transistor 30 may comprise a gate wiring 41 disposed under the gate electrode 33. The source connecting wiring 42 may be electrically connected to the source contact portion 31. For example, an upper surface of the source connecting wiring 42 may be disposed in contact with a lower surface of the source contact portion 31. The drain connecting wiring 43 may be electrically connected to the drain contact portion 32. For example, an upper surface of the drain connecting wiring 43 may be disposed in contact with a lower surface of the drain contact portion 32. The gate wiring 41 may be electrically connected to the gate electrode 33. An upper surface of the gate wiring 41 may be disposed in contact with a lower surface of the gate electrode 33.

The source electrode 71 may be electrically connected to the source connecting wiring 42. The source electrode 71 may be disposed in contact with the upper surface of the source connecting wiring 42. For example, the source electrode 71 may be electrically connected to the first region of the channel layer 60 via the source connecting wiring 42 and the source contact portion 31. The drain electrode 72 may be electrically connected to the drain connecting wiring 43. The drain electrode 72 may be disposed in contact with the upper surface of the drain connecting wiring 43. For example, the drain electrode 72 may be electrically connected to the second region of the channel layer 60 via the drain connecting wiring 43 and the drain contact portion 32.

The source contact portion 31 and the drain contact portion 32 may be provided with a material in ohmic contact with the channel layer 60. The source contact portion 31 and the drain contact portion 32 may comprise a material in ohmic contact with the second nitride semiconductor layer 62. For example, the source contact portion 31 and the drain contact portion 32 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source contact portion 31 and the drain contact portion 32 may be provided in a thickness of 0.1 to 1 µm as an example.

The gate electrode 33 may be provided with a material in ohmic contact with the depletion forming layer 15. For example, the gate electrode 33 may be provided with a metallic material in ohmic contact with a p-type nitride layer. The gate electrode 33 may comprise a single layer or multiple layers comprising at least one material selected from the group consisting of tungsten (W), tungsten silicon (WSi$_2$), titanium nitride (TiN), tantalum (Ta), tantalum nitride (TaN), palladium (Pd), nickel (Ni), and platinum (Pt). The gate electrode 33 may be provided in a thickness of 0.1 to 1 µm as an example.

The gate wiring 41 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The gate wiring 41 may be provided in a thickness of 0.1 to 3 µm as an example.

The source connecting wiring 42 and the drain connecting wiring 43 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source connecting wiring 42 and the drain connecting wiring 43 may be provided in a thickness of 0.1 to 3 µm as an example.

The source electrode 71 and the drain electrode 72 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source electrode 71 and the drain electrode 72 may be provided in a thickness of 0.1 to 3 µm as an example.

The thin film transistor substrate according to an embodiment may comprise a first passivation film 21 disposed under the channel layer 60. The first passivation film 21 may be disposed under the second nitride semiconductor layer 62. An upper surface of the first passivation film 21 may be disposed in contact with a lower surface of the second nitride semiconductor layer 62.

According to an embodiment, the source contact portion 31 may be disposed to pass through the first passivation film 21. The source contact portion 31 may be disposed to be surrounded by the first passivation film 21. The source contact portion 31 may be disposed to pass through the first passivation film 21 and provided in contact with the first region of the channel layer 60. The drain contact portion 32 may be disposed to pass through the first passivation film 21. The drain contact portion 32 may be disposed to be surrounded by the first passivation film 21. The drain contact portion 32 may be disposed to pass through the first passivation film 21 and provided in contact with the second region of the channel layer 60.

The first passivation film 21 may be provided with an insulating material. The first passivation film 21 may comprise a single layer or multiple layers comprising at least one of a silicon-based oxide, a silicon-based nitride, a metal oxide comprising Al$_2$O$_3$, and an organic insulating material as an example.

The source connecting wiring 42 may be disposed in contact with the source contact portion 31 thereunder and provided to be surrounded by the bonding layer 50. The drain connecting wiring 43 may be disposed in contact with the drain contact portion 32 thereunder and provided to be surrounded by the bonding layer 50. The gate wiring 41 may be disposed in contact with the gate electrode 33 thereunder and provided to be surrounded by the bonding layer 50.

The upper surface of the source connecting wiring 42 may be disposed higher than the upper surface of the gate wiring 41. The upper surface of the source connecting wiring 42 may be disposed higher than the lower surface of the gate electrode 33. The upper surface of the drain connecting wiring 43 may be disposed higher than the upper surface of the gate wiring 41. The upper surface of the drain connecting wiring 43 may be disposed higher than the lower surface of the gate electrode 33.

The thin film transistor substrate according to an embodiment may comprise the first passivation film 21 and a second passivation film 22 disposed on the channel layer 60. The source electrode 71 may pass through the first passivation film 21 and the second passivation film 22 and be electrically connected to the source connecting wiring 42. The source electrode 71 may comprise a first region disposed on the second passivation film 22. The source electrode 71 may comprise a second region passing through the second passivation film 22 and the first passivation film 21. The drain electrode 72 may pass through the first passivation film 21 and the second passivation film 22 and be electrically connected to the drain connecting wiring 43. The drain electrode 72 may comprise a first region disposed on the second passivation film 22. The drain electrode 72 may comprise a second region passing through the second passivation film 22 and the first passivation film 21.

The first passivation film 21 may comprise a region disposed in contact with the lower surface of the channel layer 60 and having a first thickness, and a region disposed in contact with a lower surface of the second passivation film 22 and having a second thickness. The region having the first thickness of the first passivation film 21 may be disposed between the lower surface of the channel layer 60 and the upper surface of the gate wiring 41. The region having the second thickness of the first passivation film 21 may be disposed between the lower surface of the second passivation film 22 and the upper surface of the source connecting wiring 42 or the upper surface of the drain connecting wiring 43. The region having the second thickness of the first passivation film 21 may be disposed between the lower surface of the second passivation film 22 and an upper surface of the bonding layer 50. The first thickness of the first passivation film 21 may be provided thicker than the second thickness thereof.

The second passivation film 22 may comprise an insulating material. The second passivation film 22 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may comprise a third passivation film 23 disposed on the second passivation film 22. The third passivation film 23 may be disposed on the source electrode 71 and the drain electrode 72. The third passivation film 23 may comprise a contact hole H3 provided on the drain electrode 72.

The third passivation film 23 may comprise a single layer or multiple layers comprising at least one material of a silicon-based oxide, a silicon-based nitride, a metal oxide comprising $Al_2O_3$, and an organic insulating material as an example.

According to an embodiment, the pixel electrode 80 may be disposed on the third passivation film 23. The pixel electrode 80 may be electrically connected to the drain electrode 72 via the contact hole H3 provided in the third passivation film 23. A lower surface of the pixel electrode 80 may be disposed in contact with an upper surface of the drain electrode 72.

The pixel electrode 80 may be provided with a transparent conductive material. The pixel electrode 80 may be provided with, for example, a transparent conductive oxide film. The pixel electrode 80 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

Hereinafter, an example of a manufacturing process of a thin film transistor substrate according to an embodiment of the present invention will be described with reference to FIGS. 2 to 14. In FIGS. 2 to 13, (a) of each drawing is a plan view and (b) of that is a cross-sectional view taken along line A-A of a plan view.

First, as shown in FIG. 2, a first layer 11, a second layer 12, and a third layer 13 may be sequentially grown on a growth substrate 10.

The growth substrate 10 may be a substrate on which the first layer 11, the second layer 12, and the third layer 13 may be grown. The growth substrate 10 may comprise at least one of sapphire, SiC, GaAs, GaN, ZnO, Si, GaP, InP and Ge as an example. A buffer layer may be further formed between the growth substrate 10 and the first layer 11.

The first layer 11, the second layer 12, and the third layer 13 may be provided with, for example, a Group III-V compound semiconductor. For example, the first layer 11, the second layer 12, and the third layer 13 may be provided with a semiconductor material having an empirical formula of $In_xAl_yGa_{1-x-y}N$ ($0 \geq x \geq 1$, $0 \geq y \geq 1$, $0 \geq x+y \geq 1$). The first layer 11, the second layer 12, and the third layer 13 may comprise a single layer or multiple layers selected from, for example, GaN, AlN, AlGaN, InGaN, InN, InAlGaN, AlInN, AlGaAs, GaP, GaAs, GaAsP, AlGaInP and so on.

According to an embodiment, for example, the first layer 11 may be formed of a GaN semiconductor layer, and the second layer 12 may be formed of an AlGaN semiconductor layer. The third layer 13 may comprise a nitride semiconductor layer doped with a p-type dopant. For example, the third layer 13 may comprise a GaN semiconductor layer doped with a p-type dopant or an AlGaN semiconductor layer doped with a p-type dopant. The third layer 13 may comprise a single layer or multiple layers provided with, for example, a semiconductor material having an empirical formula of $p-Al_xGa_{1-x}N$ ($0 \geq x \geq 0.3$).

Next, as shown in FIG. 3, a depletion forming layer 15 may be formed on the second layer 12 by etching the third layer 13. The depletion forming layer 15 may be formed, for example, by a photolithography process and an etching process.

Next, as shown in FIG. 4, a first passivation film 21 may be formed on the second layer 12 and the depletion forming layer 15. The first passivation film 21 may be formed of an insulating material. The first passivation film 21 may comprise a single layer or multiple layers comprising at least one material of, for example, a silicon-based oxide, a silicon-based nitride, a metal oxide comprising $Al_2O_3$, and an organic insulating material.

As shown in FIG. 5, a source contact portion 31 and a drain contact portion 32 may be formed on the second layer 12. The source contact portion 31 and the drain contact portion 32 may be formed on the second layer 12 by passing through the first passivation film 21. For example, the source contact portion 31 and the drain contact portion 32 may be formed by a self-align process. The source contact portion 31 and the drain contact portion 32 may be in ohmic contact with the second layer 12. For example, the source contact portion 31 and the drain contact portion 32 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source contact portion 31 and the drain contact portion 32 may be formed in a thickness of 0.1 to 1 μm as an example.

As shown in (a) of FIG. 5, the source contact portion 31 may have a length of L1 in a first direction and the drain contact portion 32 may have a length of L2 in the first direction. The depletion forming layer 15 may be formed to have a length L3 in the first direction. For example, a side surface of the source contact portion 31 and a side surface of the drain contact portion 32 may be disposed to face each other, and the depletion forming layer 15 may be disposed to extend in one direction between the side surface of the source contact portion 31 and the side surface of the drain contact portion 32. The length L3 of the depletion forming layer 15 disposed to extend in the one direction may be formed longer than the side length L1 of the source contact portion 31. The length L3 of the depletion forming layer 15 may be formed longer than the side length L2 of the drain contact portion 32. Since the length of the depletion forming layer 15 disposed between the source contact portion 31 and the drain contact portion 32 is formed longer, when the depletion forming layer 15 is operated as a transistor, a sufficient depletion region may be formed at the channel layer by the depletion forming layer 15. Accordingly, according to an embodiment, when a gate voltage is not applied, it is possible to prevent a current from flowing from the source contact portion 31 to the drain contact portion 32. As described above, according to an embodiment, it is possible to provide a transistor of a normally off driving.

In addition, as shown in FIG. 6, a gate electrode 33 may be formed on the depletion forming layer 15. The gate electrode 33 may be formed to pass through the first passivation film 21.

The gate electrode 33 may be provided with a material in ohmic contact with the depletion forming layer 15. For example, the gate electrode 33 may be provided with a metallic material in ohmic contact with a p-type nitride layer. The gate electrode 33 may comprise a single layer or multiple layers comprising at least one material selected from the group consisting of tungsten (W), tungsten silicon (WSi$_2$), titanium nitride (TiN), tantalum (Ta), tantalum nitride (TaN), palladium (Pd), nickel (Ni), and platinum (Pt). The gate electrode 33 may be formed in a thickness of 0.1 to 1 μm as an example.

Next, as shown in FIG. 7, a gate wiring 41, a source connecting wiring 42, and a drain connecting wiring 43 may be formed. The gate wiring 41 may be formed in contact with the gate electrode 33 and extending in the first direction. The source connecting wiring 42 may be formed in contact with the source contact portion 31 and extending in the first direction. The drain connecting wiring 43 may be in contact with the drain contact portion 32 and extending in the first direction.

For example, the gate wiring 41, the source connecting wiring 42, and the drain connecting wiring 43 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The gate wiring 41, the source connecting wiring 42, and the drain connecting wiring 43 may be provided in a thickness of 0.1 to 3 μm as an example.

Next, a bonding layer 50 and a support substrate 55 may be formed on the gate wiring 41, the source connecting wiring 42, and the drain connecting wiring 43. FIG. 8 is a view illustrating a structure in which the support substrate 55 is disposed at a bottom and the growth substrate 10 is disposed at a top.

The bonding layer 50 may comprise an organic material. The bonding layer 50 may be provided with a transparent material. The bonding layer 50 may be provided with, for example, a material having a transmittance of 70% or more. The bonding layer 50 may comprise an organic insulating material. The bonding layer 50 may comprise at least one material selected from the group consisting of acryl, benzocyclobutene (BCB), SU-8 polymer, and the like. The bonding layer 50 may be formed in a thickness of 0.5 to 6 μm as an example.

The support substrate 55 may comprise a transparent substrate. The support substrate 55 may be provided with, for example, a transparent substrate having a thickness of 0.1 to 3 mm. The support substrate 55 may comprise at least one material selected from materials comprising silicon, glass, polyimide, and plastic. The support substrate 55 may comprise a flexible substrate.

According to an embodiment, a high quality semiconductor layer may be formed by using the growth substrate 10 and a thin film transistor substrate having an excellent electron mobility may be provided by applying a transfer process by using the support substrate 55.

Next, as shown in FIGS. 9 and 10, the growth substrate 10 is removed and the first layer 11 and the second layer 12 may be etched to form a channel layer 60. For example, the channel layer 60 may comprise a first nitride semiconductor layer 61 and a second nitride semiconductor layer 62. A partial region of the first passivation film 21 may be exposed by the etching of the first layer 11 and the second layer 12. For example, the channel layer 60 may be formed to the same length L3 as that of the depletion forming layer 15. When the length of the depletion forming layer 15 is smaller than that of the channel layer 60, a leakage current may be generated.

Next, as shown in FIG. 11, a second passivation film 22 may be formed on the channel layer 60 and the first passivation film 21. The second passivation film 22 may be referred to as a planarization layer or an overcoat layer.

A first contact hole H1 may be formed to pass through the second passivation film 22 and the first passivation film 21 to expose a partial region of the source connecting wiring 42. In addition, a second contact hole H2 may be formed to pass through the second passivation film 22 and the first passivation film 21 to expose a partial region of the drain connecting wiring 43.

The second passivation film 22 may comprise an insulating material. The second passivation film 22 may comprise a single layer or multiple layers comprising at least one material of a silicon-based oxide, a silicon-based nitride, a metal oxide comprising $Al_2O_3$, and an organic insulating material as an example.

In addition, as shown in FIG. 12, a source electrode 71 and a drain electrode 72 may be formed on the second passivation film 22. A first region of the source electrode 71 may be formed on the second passivation film 22 and a second region of the source electrode 71 may be formed at the first contact hole H1, so as to electrically be connected to the source connecting wiring 42. A first region of the drain electrode 72 may be formed on the second passivation film 22 and a second region of the drain electrode 72 may be formed at the second contact hole H2, so as to electrically be connected to the drain connecting wiring 43. In addition, a data wiring 73 connected to the source electrode 71 may be formed. The data wiring 73 may be disposed to be extending in one direction and intersecting with the gate wiring 41.

For example, the source electrode 71 and the drain electrode 72 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source electrode 71 and the drain electrode 72 may be provided in a thickness of 0.1 to 3 μm as an example.

As shown in FIGS. 13 and 14, a third passivation film 23 may be formed on the source electrode 71 and the drain electrode 72. In addition, a third contact hole H3 may be formed at the third passivation film 23 to expose the drain electrode 72.

A pixel electrode 80 may be formed on the third passivation film 23. The pixel electrode 80 may be electrically connected to the drain electrode 72 through the third contact hole H3 provided in the third passivation film 23.

The pixel electrode 80 may be provided with a transparent conductive material. The pixel electrode 80 may be provided with, for example, a transparent conductive oxide film. The pixel electrode 80 may comprise at least one material selected among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The basic thin film transistor substrate according to an embodiment may be formed by such a process. The manufacturing process described with reference to FIGS. 2 to 14 is only one example, and the process method or the process order in each step may be modified within a range obvious to a person skilled in the art to which the present invention belongs.

FIG. 15 is a view illustrating an example in which a plurality of pixels are disposed on a thin film transistor substrate according to an embodiment of the present invention.

As shown in FIG. 15, the thin film transistor substrate according to an embodiment may comprise a plurality of thin film transistors 30 disposed in a region in which the gate wiring 41 and the data wiring 73 intersect with each other.

The pixel electrode 80 may be disposed in a region that is defined by the gate wiring 41 and the data wiring 73. A partial region of the pixel electrode 80 may be disposed to be overlapped with the gate wiring 41.

The thin film transistor substrate according to an embodiment may be bonded to a color filter substrate to provide a liquid crystal display panel. A liquid crystal layer may be provided between the thin film transistor substrate and the color filter substrate. A common electrode may be provided at the color filter substrate. An arrangement of the liquid crystal layer disposed between the common electrode and the pixel electrode provided on the thin film transistor substrate may be controlled by a difference in voltage applied therebetween, and a light transmission amount of a corresponding pixel may be controlled. The liquid crystal display panel having such a structure may be referred to as a vertical electric field type liquid crystal display panel.

FIG. 16 is a view illustrating an example in which source/drain contact portions and source/drain connecting wirings are disposed on a thin film transistor substrate according to an embodiment of the present invention. FIG. 16 is an enlarged view illustrating a specific example of a P region shown in FIG. 14.

As shown in FIG. 16, a partial region of the drain connecting wiring 43 according to an embodiment may be disposed between the drain contact portion 32 and the first passivation film 21. In the process of forming the drain contact portion 32, a space may be provided between the side surface of the drain contact portion 32 and the first passivation film 21, and the partial region of the drain connecting wiring 43 may be formed in this space.

In the process of forming a through hole at the first passivation film 21 to form the drain contact portion 32, a side surface of the first passivation film 21 surrounding the drain contact portion 32 may be formed to be inclined. An angle a2 formed by the side surface of the first passivation film 21 and the upper surface of the first passivation film 21 may be provided as an acute angle. For example, the angle a2 formed by the side surface of the first passivation film 21 and the upper surface of the first passivation film 21 may be 10 to 90 degrees. As another embodiment, the angle a2 formed by the side surface of the first passivation film 21 and the upper surface of the first passivation film 21 may be 30 to 90 degrees. A predetermined gap t2 may be provided between the side surface of the first passivation film 21 and the drain contact portion 32 and, for example, a gap of 0 to 3 μm may be provided.

For example, when the first passivation film 21 is provided with a silicon-based oxide such as $SiO_2$, the first passivation film 21 may be etched by wet etching or dry etching. When the etching is performed by the wet etching, the angle of a2 may be formed at about 10 to 60 degrees, and a wider shape may be provided within a few μm compared to a pattern to be etched. When the wet etching is performed, the angle of a2 may be formed at an angle of about 35 to 45 degrees. When the etching is performed by the dry etching, the angle of a2 may be formed at about 60 to 90 degrees, and a shape having a width similar to the pattern to be etched may be provided. When the dry etching is performed, the angle of a2 may be formed at an angle of about 65 to 75 degrees.

In addition, although not shown in the drawing, a partial region of the source connecting wiring 42 according to an embodiment may be disposed between the source contact portion 31 and the first passivation film 21. In the process of forming the source contact portion 31, a space may be provided between the side surface of the source contact portion 31 and the first passivation film 21, and a partial region of the source connecting wiring 43 may be formed in this space.

According to an embodiment, since the channel layer 60 is formed by the etching process, an angle a1 formed between a side surface of the channel layer 60 and the lower surface of the channel layer 60 may be provided as an acute angle. For example, the angle a1 formed between the side surface of the channel layer 60 and the lower surface of the channel layer 60 may be 30 to 90 degrees. An upper surface of the first nitride semiconductor layer 61 may be provided shorter than a lower surface thereof. An upper surface of the second nitride semiconductor layer 62 may be provided shorter than the lower surface thereof. The lower surface of the first nitride semiconductor layer 61 and the upper surface of the second nitride semiconductor layer 62 may be provided at the same length.

In the process of forming the channel layer 60 by etching, a partial over-etching may be generated at an end region of the channel layer 60. Accordingly, a step may be provided on the upper surface of the first passivation film 21. That is, in the first passivation film 21, thicknesses of a region in which the channel layer 60 is disposed at a lower portion thereof and a region in which the channel layer 60 is not disposed may be different from each other. For example, a thickness t1 of the step may be provided at about 0 to 1 μm. Accordingly, the lower surface of the second passivation film 22 disposed on the first passivation film 21 may be disposed to be extending below the lower surface of the channel layer 60.

According to the thin film transistor substrate according to an embodiment, a high carrier mobility may be implemented by providing the thin film transistor comprising the nitride-based semiconductor layer. An electron mobility (cm$^2$/Vs) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIGS. 17 and 18 are views illustrating another example of a thin film transistor substrate according to an embodiment of the present invention. Referring to FIGS. 17 and 18, in the description of the thin film transistor substrate according to an embodiment, description of contents overlapping with those described with reference to FIGS. 1 to 16 may be omitted.

The thin film transistor substrate described with reference to FIGS. 1 to 16 may be applied to a vertical electric field type liquid crystal display panel. A pixel electrode 80 may be disposed on the thin film transistor substrate and a common electrode configured to form an electric field in a pixel along with the pixel electrode 80 may be provided at a separate color filter substrate, and thus a vertical electric field type liquid crystal display panel can be realized. Meanwhile, the thin film transistor substrate described with reference to FIGS. 17 and 18 may be applied to a horizontal electric field type liquid crystal display panel.

As shown in FIGS. 17 and 18, the thin film transistor substrate according to an embodiment may comprise a pixel electrode 81, a common electrode 85, and a fourth passivation film 24.

The common electrode 85 may be disposed on a third passivation film 23. The fourth passivation film 24 may be disposed on the third passivation film 23. The fourth passivation film 24 may be disposed on the common electrode 85 and the third passivation film 23. The common electrode 85 may be disposed between the third passivation film 23 and the fourth passivation film 24. In addition, the fourth passivation film 24 may be provided on a drain electrode 72 exposed through the third passivation film 23. The pixel electrode 81 may be disposed on the fourth passivation film 24. A partial region of the pixel electrode 81 may be electrically connected to the drain electrode 72 through a fourth contact hole H4 provided in the fourth passivation film 24. A partial region of the pixel electrode 81 may be disposed in contact with the upper surface of the drain electrode 72 through the fourth contact hole H4. The pixel electrode 81 may be disposed in contact with the upper surface of the drain electrode 72 by passing through the third passivation film 23 and the fourth passivation film 24. A partial region of the pixel electrode 81 and a partial region of the common electrode 85 may be overlapped with each other in a vertical direction.

The thin film transistor substrate according to an embodiment may comprise a plurality of thin film transistors 30 disposed in a region in which a gate wiring 41 and a data wiring 73 intersect with each other. The pixel electrode 81 may be disposed at a region that is defined by the gate wiring 41 and the data wiring 73. The pixel electrode 81 may comprise a portion extending in a finger shape. A partial region of the pixel electrode 81 may be disposed and overlapped with the gate wiring 41.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 81 may be provided with a transparent conductive material. The pixel electrode 81 may be provided with, for example, a transparent conductive oxide film. The pixel electrode 81 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The fourth passivation film 24 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may be bonded to a color filter substrate to provide a liquid crystal display panel. A liquid crystal layer may be provided between the thin film transistor substrate and the color filter substrate. In the thin film transistor substrate according to an embodiment, an arrangement of the liquid crystal layer may be adjusted by a difference in voltage applied between the common electrode 85 and the pixel electrode 81, and a light transmission amount of a corresponding pixel may be controlled. The liquid crystal display panel having such a structure may be referred to as a horizontal electric field type liquid crystal display panel, a transverse electric field type liquid crystal display panel, or an In Plane Switching (IPS) liquid crystal display panel. Since the liquid crystal display panel itself has no light source, a display device may be implemented by providing a light unit that supplies light to the liquid crystal display panel.

According to the thin film transistor substrate according to an embodiment, a high carrier mobility may be provided by providing the thin film transistor comprising the nitride-based semiconductor layer. An electron mobility ($cm^2/Vs$) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIG. 19 is a view illustrating still another example of a thin film transistor substrate according to an embodiment of the present invention. Referring to FIG. 19, in the description of the thin film transistor substrate according to an embodiment, description of a part overlapping with those described with reference to FIGS. 1 to 18 may be omitted.

The thin film transistor substrate according to an embodiment may comprise a pixel electrode 82, a common electrode 85, a metal layer 90, a touch panel lower electrode 91, and a touch panel upper electrode 92.

The common electrode 85 may be disposed on a third passivation film 23. The pixel electrode 82 may be disposed on a fourth passivation film 24. The pixel electrode 82 may be electrically connected to a drain electrode 72. The metal layer 90 may be provided between the pixel electrode 82 and the drain electrode 72. The metal layer 90 may be disposed in contact with the drain electrode 72 exposed through the third passivation film 23. A partial region of the pixel electrode 82 may be electrically connected to the drain electrode 72 through the metal layer 90 through a fifth contact hole H5 provided in the fourth passivation film 24.

According to an embodiment, the touch panel upper electrode 92 may be provided on the fourth passivation film 24 and the touch panel lower electrode 91 may be disposed below the touch panel upper electrode 92. The touch panel lower electrode 91 may be disposed on the third passivation film 23 and may be electrically connected to the common electrode 85. The touch panel lower electrode 91 may be disposed between the common electrode 85 and the fourth passivation film 24. The touch panel upper electrode 92 may be disposed to be overlapped with the touch panel lower electrode 91 in a vertical direction.

The touch panel upper electrode 92 and the touch panel lower electrode 91 may form an in-cell touch panel provided in the display panel. Accordingly, the thin film transistor substrate according to an embodiment may detect a contact of the display panel from outside by using the in-cell touch panel.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 82 may be provided with a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The touch panel lower electrode 91 and the touch panel upper electrode 92 may be formed of a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The in-cell touch panel-integrated thin film transistor substrate according to an embodiment may be bonded to a color filter substrate to provide a liquid crystal display panel. A liquid crystal layer may be provided between the in-cell touch panel-integrated thin film transistor substrate and the color filter substrate. In the in-cell touch panel-integrated thin film transistor substrate according to an embodiment, an arrangement of the liquid crystal layer may be adjusted by a difference in voltage applied between the common electrode 85 and the pixel electrode 82, and a light transmission amount of a corresponding pixel may be controlled. The in-cell touch panel-integrated liquid crystal display panel having such a structure may be referred to as a horizontal electric field type liquid crystal display panel, a transverse electric field type liquid crystal display panel, or an In Plane Switching (IPS) liquid crystal display panel. Since the in-cell touch panel-integrated liquid crystal display panel itself has no light source, a display device may be implemented by providing a light unit that supplies light to the in-cell touch panel-integrated liquid crystal display panel.

According to the thin film transistor substrate according to an embodiment, a high carrier mobility may be implemented by providing the thin film transistor comprising the nitride-based semiconductor layer. An electron mobility ($cm^2$/Vs) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may provide an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIGS. 20 and 21 are views illustrating still another example of a thin film transistor substrate according to an embodiment of the present invention. The thin film transistor substrate shown in FIGS. 20 and 21 is an embodiment to which a thin film transistor having a double gate structure is applied, and description of contents overlapping with those described with reference to FIGS. 1 to 19 may be omitted.

As shown in FIGS. 20 and 21, the thin film transistor substrate according to an embodiment of the present invention may comprise a support substrate 55, a thin film transistor 130 disposed on the support substrate 55, and a pixel electrode 80 electrically connected to the thin film transistor 130.

The thin film transistor 130 according to an embodiment may comprise a depletion forming layer 15, a first gate electrode 35, a second gate electrode 36, a channel layer 60, a source electrode 71, and a drain electrode 72. The source electrode 71 may be electrically connected to a first region of the channel layer 60. The source electrode 71 may be electrically connected to a lower surface of the channel layer 60. The drain electrode 72 may be electrically connected to a second region of the channel layer 60. The drain electrode 72 may be electrically connected to the lower surface of the channel layer 60. The first gate electrode 35 may be disposed under the channel layer 60. The second gate electrode 36 may be disposed on the channel layer 60. The depletion forming layer 15 may be disposed under between the first region and the second region of the channel layer 60. The depletion forming layer 15 may be disposed between the channel layer 60 and the first gate electrode 35.

The channel layer 60 may be provided with, for example, a Group III-V compound semiconductor. For example, the channel layer 60 may be provided with a semiconductor material having an empirical formula of $In_xAl_yGa_{1-x-y}N$ ($0 \geq x \geq 1$, $0 \geq y \geq 1$, $0 \geq x+y \geq 1$). The channel layer 60 may comprise a single layer or multiple layers selected from, for example, GaN, AlN, AlGaN, InGaN, InN, InAlGaN, AlInN, AlGaAs, GaP, GaAs, GaAsP, AlGaInP and so on.

The channel layer 60 may comprise a first nitride semiconductor layer 61 and a second nitride semiconductor layer 62. The first nitride semiconductor layer 61 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). The second nitride semiconductor layer 62 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$).

According to the channel layer 60 according to an embodiment, the first nitride semiconductor layer 61 may comprise a GaN semiconductor layer, and the second nitride semiconductor layer 62 may comprise an AlGaN semiconductor layer. The second nitride semiconductor layer 62 may be disposed between the first nitride semiconductor layer 61 and the depletion forming layer 15.

The depletion forming layer 15 may be provided with, for example, a Group III-V compound semiconductor. For example, the depletion forming layer 15 may be provided with a semiconductor material having an empirical formula of $In_xAl_yGa_{1-x-y}N$ ($0 \geq x \geq 1$, $0 \geq y \geq 1$, $0 \geq x+y \geq 1$). The depletion forming layer 15 may comprise a single layer or multiple layers selected from, for example, GaN, AlN, AlGaN, InGaN, InN, InAlGaN, AlInN, AlGaAs, GaP, GaAs, GaAsP, AlGaInP and so on. The depletion forming layer 15 may comprise a nitride semiconductor layer doped with a p-type dopant. For example, the depletion forming layer 15 may comprise a GaN semiconductor layer doped with a p-type dopant or an AlGaN semiconductor layer doped with a p-type dopant. The depletion forming layer 15 may comprise a single layer or multiple layers provided with, for example, a semiconductor material having an empirical formula of $p-Al_xGa_{1-x}N$ ($0 \geq x \geq 0.3$). The depletion forming layer 15 may be provided in a thickness of 2 to 300 nm as an example.

The depletion forming layer 15 may serve to form a depletion region at two-dimensional electron gas (2DEG) provided at the channel layer 60. The energy bandgap of a portion of the second nitride semiconductor layer 62 positioned thereon may be increased by the depletion forming layer 15. As a result, the depletion region of the 2DEG may be provided at a portion of the channel layer 60 corresponding to the depletion forming layer 15. Therefore, a region corresponding to the position in which the depletion forming layer 15 is disposed in the 2DEG provided at the channel layer 60 may be cut off. The region in which the 2DEG is cut off at the channel layer 60 may be referred to as a cut-off region. For example, a cut-off region may be formed at the second nitride semiconductor layer 62. The thin film transistor 30 may have a normally-off characteristic due to such a cut-off region. When a voltage equal to or higher than a threshold voltage is applied to the gate electrode 33, the 2DEG is generated at the cut-off region and the thin film transistor 30 is turned on. When a channel formed at an upper portion of the first gate electrode 35 is turned on, a current may flow via the 2DEG formed at the channel layer 60. Accordingly, the current flow from the first region to the second region of the channel layer 60 may be controlled according to a voltage applied to the first gate electrode 35 and the second gate electrode 36. Meanwhile, according to the present embodiment, the second gate electrode 36 may be disposed on the channel layer 60. The first gate electrode 35 and the second gate electrode 36 may be disposed to be overlapped with each other in a vertical direction. According to an embodiment, the first gate electrode 35 and the second gate electrode 36 are disposed below and above the channel layer 60 to efficiently and reliably control a current flow in the channel layer 60.

The support substrate 55 may comprise a transparent substrate. The support substrate 55 may be provided with, for example, a transparent substrate having a thickness of 0.1 mm to 3 mm. The support substrate 55 may comprise at least one material selected from materials comprising silicon, glass, polyimide, and plastic. The support substrate 55 may comprise a flexible substrate.

The support substrate 55 is a substrate to be used in a transfer process and serves to support the thin film transistor 130. In addition, the thin film transistor substrate according to an embodiment may comprise a bonding layer 50 provided between the support substrate 55 and the thin film transistor 130.

The bonding layer 50 may comprise an organic material. The bonding layer 50 may be provided with a transparent material. The bonding layer 50 may be provided with, for example, a material having a transmittance of 70% or more. The bonding layer 50 may comprise an organic insulating material. The bonding layer 50 may comprise at least one material selected from the group consisting of acryl, benzocyclobutene (BCB), SU-8 polymer, and the like. The bonding layer 50 may be provided in a thickness of 0.5 to 6 µm as an example.

The thin film transistor 130 according to an embodiment may comprise a source contact portion 31 disposed under the first region of the channel layer 60 and a drain contact portion 32 disposed under the second region of the channel layer 60. The source contact portion 31 may be disposed in contact with the first region of the channel layer 60. The drain contact portion 32 may be disposed in contact with the second region of the channel layer 60.

The thin film transistor 130 according to an embodiment may comprise a source connecting wiring 42 disposed under the source contact portion 31 and a drain connecting wiring 43 disposed under the drain contact portion 32. In addition, the thin film transistor 130 may comprise a gate wiring 41 disposed under the first gate electrode 35. The source connecting wiring 42 may be electrically connected to the source contact portion 31. For example, an upper surface of the source connecting wiring 42 may be disposed in contact with a lower surface of the source contact portion 31. The drain connecting wiring 43 may be electrically connected to the drain contact portion 32. For example, an upper surface of the drain connecting wiring 43 may be disposed in contact with a lower surface of the drain contact portion 32. The gate wiring 41 may be electrically connected to the first gate electrode 35. An upper surface of the gate wiring 41 may be disposed in contact with a lower surface of the first gate electrode 35.

The source electrode 71 may be electrically connected to the source connecting wiring 42. The source electrode 71 may be disposed in contact with the upper surface of the source connecting wiring 42. For example, the source electrode 71 may be electrically connected to the first region of the channel layer 60 via the source connecting wiring 42 and the source contact portion 31. The drain electrode 72 may be electrically connected to the drain connecting wiring 43. The drain electrode 72 may be disposed in contact with the upper surface of the drain connecting wiring 43. For example, the drain electrode 72 may be electrically connected to the second region of the channel layer 60 via the drain connecting wiring 43 and the drain contact portion 32.

The source contact portion 31 and the drain contact portion 32 may be provided with a material in ohmic contact with the channel layer 60. The source contact portion 31 and the drain contact portion 32 may comprise a material in ohmic contact with the second nitride semiconductor layer 62. For example, the source contact portion 31 and the drain contact portion 32 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source contact portion 31 and the drain contact portion 32 may be provided in a thickness of 0.1 to 1 µm as an example.

The first gate electrode 35 may be provided with a material in ohmic contact with the depletion forming layer 15. For example, the first gate electrode 35 may be provided with a metallic material in ohmic contact with a p-type nitride layer. The first gate electrode 35 may comprise a single layer or multiple layers comprising at least one material selected from the group consisting of tungsten (W), tungsten silicon (WSi$_2$), titanium nitride (TiN), tantalum (Ta), tantalum nitride (TaN), palladium (Pd), nickel (Ni), and platinum (Pt). The first gate electrode 35 may be provided in a thickness of 0.1 to 1 µm as an example.

The gate wiring 41 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The gate wiring 41 may be provided in a thickness of 0.1 to 3 µm as an example.

The source connecting wiring 42 and the drain connecting wiring 43 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source connecting wiring 42 and the drain connecting wiring 43 may be provided in a thickness of 0.1 to 3 µm as an example.

The source electrode 71 and the drain electrode 72 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source electrode 71 and the drain electrode 72 may be provided in a thickness of 0.1 to 3 µm as an example.

The thin film transistor substrate according to an embodiment may comprise a first passivation film 21 disposed under the channel layer 60. The first passivation film 21 may be disposed under the second nitride semiconductor layer 62. An upper surface of the first passivation film 21 may be disposed in contact with a lower surface of the second nitride semiconductor layer 62.

According to an embodiment, the source contact portion 31 may be disposed to pass through the first passivation film 21. The source contact portion 31 may be disposed to be surrounded by the first passivation film 21. The source contact portion 31 may be disposed to pass through the first passivation film 21 and provided in contact with the first region of the channel layer 60. The drain contact portion 32 may be disposed to pass through the first passivation film 21. The drain contact portion 32 may be disposed to be surrounded by the first passivation film 21. The drain contact portion 32 may be disposed to pass through the first passivation film 21 and provided in contact with the second region of the channel layer 60.

The first passivation film 21 may be provided with an insulating material. The first passivation film 21 may comprise a single layer or multiple layers comprising at least one of a silicon-based oxide, a silicon-based nitride, a metal oxide comprising $Al_2O_3$, and an organic insulating material as an example.

The source connecting wiring 42 may be disposed in contact with the source contact portion 31 thereunder and provided to be surrounded by the bonding layer 50. The drain connecting wiring 43 may be disposed in contact with the drain contact portion 32 thereunder and provided to be surrounded by the bonding layer 50. The gate wiring 41 may be disposed in contact with the first gate electrode 35 thereunder and provided to be surrounded by the bonding layer 50.

The upper surface of the source connecting wiring 42 may be disposed higher than the upper surface of the gate wiring 41. The upper surface of the source connecting wiring 42 may be disposed higher than the lower surface of the first gate electrode 35. The upper surface of the drain connecting wiring 43 may be disposed higher than the upper surface of the gate wiring 41. The upper surface of the drain connecting wiring 43 may be disposed higher than the lower surface of the first gate electrode 35.

The thin film transistor substrate according to an embodiment may comprise the first passivation film 21 and a second passivation film 22 disposed on the channel layer 60. The source electrode 71 may pass through the first passivation film 21 and the second passivation film 22 and be electrically connected to the source connecting wiring 42. The source electrode 71 may comprise a first region disposed on the second passivation film 22. The source electrode 71 may comprise a second region passing through the second passivation film 22 and the first passivation film 21. The drain electrode 72 may pass through the first passivation film 21 and the second passivation film 22 and be electrically connected to the drain connecting wiring 43. The drain electrode 72 may comprise a first region disposed on the second passivation film 22. The drain electrode 72 may comprise a second region passing through the second passivation film 22 and the first passivation film 21.

The second gate electrode 36 may comprise a first region disposed on the second passivation film 22. The second gate electrode 36 may comprise a second region passing through the second passivation film 22. The second gate electrode 36 may be disposed in contact with an upper surface of the channel layer 60 by passing through the second passivation film 22. The second gate electrode 36 may be in Schottky contact with the first nitride semiconductor layer 61. The second gate electrode 36 may comprise a single layer or multiple layers comprising at least one material selected from the group consisting of nickel (Ni), platinum (Pt), gold (Au), and palladium (Pd), or an alloy thereof. For example, the Schottky contact may be implemented by plasma treatment of the channel layer 60.

The first gate electrode 35 and the second gate electrode 36 may be electrically connected as shown in FIG. 21. The thin film transistor 130 according to an embodiment may be disposed under the first passivation film 21, and comprise a first gate connecting wiring 37 electrically connected to the first gate electrode 35 and disposed to be extending from the gate wiring 41. In addition, the thin film transistor 130 according to an embodiment may comprise a second gate connecting wiring 38 disposed on the second passivation film 22 and disposed to be extending from the second gate electrode 36. The first gate connecting wiring 37 and the second gate connecting wiring 38 may be electrically connected to each other by passing through the first passivation film 21 and the second passivation film 22. For example, the first gate electrode 35 and the gate wiring 41 may be integrally formed in the same process. Further, the first gate electrode 35 and the gate wiring 41 may be separately formed in different processes and electrically connected to each other.

As shown in FIG. 21, the channel layer 60 and the depletion forming layer 15 may be formed at the same width. When the width of the depletion forming layer 15 is smaller than that of the channel layer 60, a leakage current may be generated. In other words, the length of the channel layer 60 and the length of the depletion forming layer 15 provided along the extending direction of the gate electrode 35 may be provided as the same.

The first passivation film 21 may comprise a region disposed in contact with the lower surface of the channel layer 60 and having a first thickness, and a region disposed in contact with a lower surface of the second passivation film 22 and having a second thickness. The region having the first thickness of the first passivation film 21 may be disposed between the lower surface of the channel layer 60 and the upper surface of the gate wiring 41. The region having the second thickness of the first passivation film 21 may be disposed between the lower surface of the second passivation film 22 and the upper surface of the source connecting wiring 42 or the upper surface of the drain connecting wiring 43. The region having the second thickness of the first passivation film 21 may be disposed between the lower surface of the second passivation film 22 and an upper surface of the bonding layer 50. The first thickness of the first passivation film 21 may be provided thicker than the second thickness thereof.

The second passivation film 22 may comprise an insulating material. The second passivation film 22 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may comprise a third passivation film 23 disposed on the second passivation film 22. The third passivation film 23 may be disposed on the source electrode 71 and the drain electrode 72. The third passivation film 23 may be disposed on the second gate electrode 36. The third passivation film 23 may comprise a contact hole H3 provided on the drain electrode 72.

The third passivation film 23 may comprise a single layer or multiple layers comprising at least one material of a silicon-based oxide, a silicon-based nitride, a metal oxide comprising $Al_2O_3$, and an organic insulating material as an example.

According to an embodiment, the pixel electrode 80 may be disposed on the third passivation film 23. The pixel electrode 80 may be electrically connected to the drain electrode 72 via the contact hole H3 provided in the third passivation film 23. A lower surface of the pixel electrode 80 may be disposed in contact with an upper surface of the drain electrode 72.

The pixel electrode 80 may be provided with a transparent conductive material. The pixel electrode 80 may be provided with, for example, a transparent conductive oxide film. The pixel electrode 80 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

Meanwhile, as explained above referring to FIG. 16, a partial region of the drain connecting wiring 43 according to an embodiment may be disposed between the drain contact portion 32 and the first passivation film 21. In the process of forming the drain contact portion 32, a space may be provided between the side surface of the drain contact portion 32 and the first passivation film 21, and the partial region of the drain connecting wiring 43 may be formed in this space. In the process of forming a through hole at the first passivation film 21 to form the drain contact portion 32, a side surface of the first passivation film 21 surrounding the drain contact portion 32 may be formed to be inclined. An angle a2 formed by the side surface of the first passivation film 21 and the upper surface of the first passivation film 21 may be provided as an acute angle. For example, the angle a2 formed by the side surface of the first passivation film 21 and the upper surface of the first passivation film 21 may be 10 to 90 degrees. As another embodiment, the angle a2 formed by the side surface of the first passivation film 21 and the upper surface of the first passivation film 21 may be 30 to 90 degrees. A predetermined gap t2 may be provided between the side surface of the first passivation film 21 and the drain contact portion 32 and, for example, a gap of 0 to 3 μm may be provided.

For example, when the first passivation film 21 is provided with a silicon-based oxide such as $SiO_2$, the first passivation film 21 may be etched by wet etching or dry etching. When the etching is performed by the wet etching, the angle of a2 may be formed at about 10 to 60 degrees, and a wider shape may be provided within a few μm compared to a pattern to be etched. When the wet etching is performed, the angle of a2 may be formed at an angle of about 35 to 45 degrees. When the etching is performed by the dry etching, the angle of a2 may be formed at about 60 to 90 degrees, and a shape having a width similar to the pattern to be etched may be provided. When the dry etching is performed, the angle of a2 may be formed at an angle of about 65 to 75 degrees.

In addition, although not shown in the drawing, a partial region of the source connecting wiring 42 according to an embodiment may be disposed between the source contact portion 31 and the first passivation film 21. In the process of forming the source contact portion 31, a space may be provided between the side surface of the source contact portion 31 and the first passivation film 21, and a partial region of the source connecting wiring 43 may be formed in this space. According to an embodiment, since the channel layer 60 is formed by the etching process, an angle a1 formed between a side surface of the channel layer 60 and the lower surface of the channel layer 60 may be provided as an acute angle. For example, the angle a1 formed between the side surface of the channel layer 60 and the lower surface of the channel layer 60 may be 30 to 90 degrees. An upper surface of the first nitride semiconductor layer 61 may be provided shorter than a lower surface thereof. An upper surface of the second nitride semiconductor layer 62 may be provided shorter than the lower surface thereof. The lower surface of the first nitride semiconductor layer 61 and the upper surface of the second nitride semiconductor layer 62 may be provided at the same length. In the process of forming the channel layer 60 by etching, a partial over-etching may be generated at an end region of the channel layer 60. Accordingly, a step may be provided on the upper surface of the first passivation film 21. That is, in the first passivation film 21, thicknesses of a region in which the channel layer 60 is disposed at a lower portion thereof and a region in which the channel layer 60 is not disposed may be different from each other. For example, a thickness t1 of the step may be provided at about 0 to 1 μm. Accordingly, the lower surface of the second passivation film 22 disposed on the first passivation film 21 may be disposed to be extending below the lower surface of the channel layer 60.

The thin film transistor substrate according to an embodiment may be bonded to a color filter substrate to provide a liquid crystal display panel. A liquid crystal layer may be provided between the thin film transistor substrate and the color filter substrate. A common electrode may be provided at the color filter substrate. An arrangement of the liquid crystal layer disposed between the common electrode and the pixel electrode provided on the thin film transistor substrate may be adjusted by a difference in voltage applied therebetween, and a light transmission amount of a corresponding pixel may be controlled. The liquid crystal display panel having such a structure may be referred to as a vertical electric field type liquid crystal display panel.

According to the thin film transistor substrate according to an embodiment, a high carrier mobility may be implemented by providing the thin film transistor comprising the nitride-based semiconductor layer. An electron mobility ($cm^2/Vs$) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIG. 22 is a view illustrating still another example of a thin film transistor substrate according to an embodiment of the present invention. The thin film transistor substrate shown in FIG. 22 is an embodiment in which a thin film transistor having a double gate structure is applied, and description of contents overlapping with those described with reference to FIGS. 1 to 21 may be omitted.

The thin film transistor substrate described with reference to FIGS. 20 and 21 may be applied to a vertical electric field type liquid crystal display panel. A pixel electrode 80 may be disposed on the thin film transistor substrate and a common electrode configured to form an electric field in a pixel along with the pixel electrode 80 may be provided at a separate color filter substrate, and thus a vertical electric field type liquid crystal display panel can be realized. Meanwhile, the thin film transistor substrate described with reference to FIG. 22 may be applied to a horizontal electric field type liquid crystal display panel.

As shown in FIG. 22, the thin film transistor substrate according to an embodiment may comprise a pixel electrode 81, a common electrode 85, and a fourth passivation film 24.

The common electrode 85 may be disposed on a third passivation film 23. The fourth passivation film 24 may be disposed on the third passivation film 23. The fourth passivation film 24 may be disposed on the common electrode 85 and the third passivation film 23. The common electrode 85 may be disposed between the third passivation film 23 and the fourth passivation film 24. In addition, the fourth passivation film 24 may be provided on a drain electrode 72 exposed through the third passivation film 23. The pixel electrode 81 may be disposed on the fourth passivation film 24. A partial region of the pixel electrode 81 may be electrically connected to the drain electrode 72 through a fourth contact hole H4 provided in the fourth passivation film 24. A partial region of the pixel electrode 81 may be disposed in contact with the upper surface of the drain electrode 72 through the fourth contact hole H4. The pixel electrode 81 may be disposed in contact with the upper surface of the drain electrode 72 by passing through the third passivation film 23 and the fourth passivation film 24. A partial region of the pixel electrode 81 and a partial region of the common electrode 85 may be overlapped with each other in a vertical direction.

The thin film transistor substrate according to an embodiment may comprise a plurality of thin film transistors 130 disposed in a region in which a gate wiring 41 and a data wiring 73 intersect with each other. The pixel electrode 81 may be disposed at a region that is defined by the gate wiring 41 and the data wiring 73. The pixel electrode 81 may comprise a portion extending in a finger shape. A partial region of the pixel electrode 81 may be disposed and overlapped with the gate wiring 41.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 81 may be provided with a transparent conductive material. The pixel electrode 81 may be provided with, for example, a transparent conductive oxide film. The pixel electrode 81 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The fourth passivation film 24 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may be bonded to a color filter substrate to provide a liquid crystal display panel. A liquid crystal layer may be provided between the thin film transistor substrate and the color filter substrate. In the thin film transistor substrate according to an embodiment, an arrangement of the liquid crystal layer may be adjusted by a difference in voltage applied between the common electrode 85 and the pixel electrode 81, and a light transmission amount of a corresponding pixel may be controlled. The liquid crystal display panel having such a structure may be referred to as a horizontal electric field type liquid crystal display panel, a transverse electric field type liquid crystal display panel, or an In Plane Switching (IPS) liquid crystal display panel. Since the liquid crystal display panel itself has no light source, a display device may be implemented by providing a light unit that supplies light to the liquid crystal display panel.

According to the thin film transistor substrate according to an embodiment, a high carrier mobility may be provided by providing the thin film transistor comprising the nitride-based semiconductor layer. An electron mobility ($cm^2/Vs$) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIG. 23 is a view illustrating still another example of a thin film transistor substrate according to an embodiment of the present invention. The thin film transistor substrate shown in FIG. 23 is an embodiment to which a thin film transistor having a double gate structure is applied, and description of a part overlapping with those described with reference to FIGS. 1 to 22 may be omitted.

The thin film transistor substrate according to an embodiment may comprise a pixel electrode 82, a common electrode 85, a metal layer 90, a touch panel lower electrode 91, and a touch panel upper electrode 92.

The common electrode 85 may be disposed on a third passivation film 23. The pixel electrode 82 may be disposed on a fourth passivation film 24. The pixel electrode 82 may be electrically connected to a drain electrode 72. The metal layer 90 may be provided between the pixel electrode 82 and the drain electrode 72. The metal layer 90 may be disposed in contact with the drain electrode 72 exposed through the third passivation film 23. A partial region of the pixel electrode 82 may be electrically connected to the drain electrode 72 through the metal layer 90 through a fifth contact hole H5 provided in the fourth passivation film 24.

According to an embodiment, the touch panel upper electrode 92 may be provided on the fourth passivation film 24 and the touch panel lower electrode 91 may be disposed below the touch panel upper electrode 92. The touch panel lower electrode 91 may be disposed on the third passivation film 23 and may be electrically connected to the common electrode 85. The touch panel lower electrode 91 may be disposed between the common electrode 85 and the fourth passivation film 24. The touch panel upper electrode 92 may be disposed to be overlapped with the touch panel lower electrode 91 in a vertical direction.

The touch panel upper electrode 92 and the touch panel lower electrode 91 may form an in-cell touch panel provided in the display panel. Accordingly, the thin film transistor substrate according to an embodiment may detect a contact of the display panel from outside by using the in-cell touch panel.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 82 may be provided with a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The touch panel lower electrode 91 and the touch panel upper electrode 92 may be formed of a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The in-cell touch panel-integrated thin film transistor substrate according to an embodiment may be bonded to a color filter substrate to provide a liquid crystal display panel. A liquid crystal layer may be provided between the in-cell touch panel-integrated thin film transistor substrate and the color filter substrate. In the in-cell touch panel-integrated thin film transistor substrate according to an embodiment, an arrangement of the liquid crystal layer may be adjusted by a difference in voltage applied between the common electrode 85 and the pixel electrode 82, and a light transmission amount of a corresponding pixel may be controlled. The in-cell touch panel-integrated liquid crystal display panel having such a structure may be referred to as a horizontal electric field type liquid crystal display panel, a transverse electric field type liquid crystal display panel, or an In Plane Switching (IPS) liquid crystal display panel. Since the in-cell touch panel-integrated liquid crystal display panel itself has no light source, a display device may be implemented by providing a light unit that supplies light to the in-cell touch panel-integrated liquid crystal display panel.

According to the thin film transistor substrate according to an embodiment, a high carrier mobility may be implemented by providing the thin film transistor comprising the nitride-based semiconductor layer. An electron mobility ($cm^2/Vs$) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may provide an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIG. 24 is a view illustrating still another example of a thin film transistor substrate according to an embodiment of the present invention. The thin film transistor substrate shown in FIG. 24 is an embodiment to which a thin film transistor having a structure in which gates are disposed in a recessed region of a channel layer is applied, and description of contents overlapping with those described with reference to FIGS. 1 to 23 may be omitted.

As shown in FIG. 24, the thin film transistor substrate according to an embodiment of the present invention may comprise a support substrate 55, a thin film transistor 230 disposed on the support substrate 55, and a pixel electrode 80 electrically connected to the thin film transistor 230.

The thin film transistor 230 according to an embodiment may comprise a gate electrode 233, a channel layer 260, a source electrode 71, and a drain electrode 72. The source electrode 71 may be electrically connected to a first region of the channel layer 260. The source electrode 71 may be electrically connected to a lower surface of the channel layer 260. The drain electrode 72 may be electrically connected to a second region of the channel layer 260. The drain electrode 72 may be electrically connected to the lower surface of the channel layer 260. The gate electrode 233 may be disposed under the channel layer 260.

The channel layer 260 may comprise a recessed region recessed in a upward direction in the lower surface thereof. The gate electrode 233 may be disposed in the recessed region of the channel layer 260.

The channel layer 260 may be provided with, for example, a Group III-V compound semiconductor. For example, the channel layer 260 may be provided with a semiconductor material having an empirical formula of $In_xAl_yGa_{1-x-y}N$ (0≥x≥1, 0≥y≥1, 0≥x+y≥1). The channel layer 260 may comprise a single layer or multiple layers selected from, for example, GaN, AlN, AlGaN, InGaN, InN, InAlGaN, AlInN, AlGaAs, GaP, GaAs, GaAsP, AlGaInP and so on.

The channel layer 260 may comprise a first nitride semiconductor layer 261 and a second nitride semiconductor layer 262. The first nitride semiconductor layer 261 may be provided with, for example, a semiconductor material having an empirical formula of $In_xAl_yGa_{1-x-y}N$ (0≥x≥1, 0≥y≥1, 0≥x+y≥1). The second nitride semiconductor layer 262 may be provided with, for example, a semiconductor material having an empirical formula of $In_xAl_yG_{1-x-y}N$ (0≥x≥1, 0≥y≥1, 0≥x+y≥1). A recessed region recessed upwardly may be provided at a lower surface of the second nitride semiconductor layer 262. The gate electrode 233 may be disposed in the recessed region of the second nitride semiconductor layer 262. An upper surface of the gate electrode 233 may be disposed higher than the lowest surface of the second nitride semiconductor layer 262. The gate electrode 233 and the second nitride semiconductor layer 262 may be in Schottky contact with each other.

According to the channel layer 260 according to an embodiment, the first nitride semiconductor layer 261 may comprise a GaN semiconductor layer, and the second nitride semiconductor layer 262 may comprise an AlGaN semiconductor layer.

The support substrate 55 may comprise a transparent substrate. The support substrate 55 may be provided with, for example, a transparent substrate having a thickness of 0.1 mm to 3 mm. The support substrate 55 may comprise at least one material selected from materials comprising silicon, glass, polyimide, and plastic. The support substrate 55 may comprise a flexible substrate.

The support substrate 55 is a substrate to be used in a transfer process and serves to support the thin film transistor 230. In addition, the thin film transistor substrate according to an embodiment may comprise a bonding layer 50 provided between the support substrate 55 and the thin film transistor 230.

The bonding layer 50 may comprise an organic material. The bonding layer 50 may be provided with a transparent material. The bonding layer 50 may be provided with, for example, a material having a transmittance of 70% or more. The bonding layer 50 may comprise an organic insulating material. The bonding layer 50 may comprise at least one material selected from the group consisting of acryl, benzocyclobutene (BCB), SU-8 polymer, and the like. The bonding layer 50 may be provided in a thickness of 0.5 to 6 µm as an example.

The thin film transistor 230 according to an embodiment may comprise a source contact portion 31 disposed under the first region of the channel layer 60 and a drain contact portion 32 disposed under the second region of the channel layer 260. The source contact portion 31 may be disposed in contact with the first region of the channel layer 260. The drain contact portion 32 may be disposed in contact with the second region of the channel layer 260.

The thin film transistor 230 according to an embodiment may comprise a source connecting wiring 42 disposed under the source contact portion 31 and a drain connecting wiring 43 disposed under the drain contact portion 32. In addition, the thin film transistor 230 may comprise a gate wiring 41 disposed under the gate electrode 233. The source connecting wiring 42 may be electrically connected to the source contact portion 31. For example, an upper surface of the source connecting wiring 42 may be disposed in contact with a lower surface of the source contact portion 31. The drain connecting wiring 43 may be electrically connected to the drain contact portion 32. For example, an upper surface of the drain connecting wiring 43 may be disposed in contact with a lower surface of the drain contact portion 32. The gate wiring 41 may be electrically connected to the gate electrode 233. An upper surface of the gate wiring 41 may be disposed in contact with a lower surface of the gate electrode 233.

The source electrode 71 may be electrically connected to the source connecting wiring 42. The source electrode 71 may be disposed in contact with the upper surface of the source connecting wiring 42. For example, the source electrode 71 may be electrically connected to the first region of the channel layer 260 via the source connecting wiring 42 and the source contact portion 31. The drain electrode 72 may be electrically connected to the drain connecting wiring 43. The drain electrode 72 may be disposed in contact with the upper surface of the drain connecting wiring 43. For example, the drain electrode 72 may be electrically connected to the second region of the channel layer 260 via the drain connecting wiring 43 and the drain contact portion 32.

The source contact portion 31 and the drain contact portion 32 may be provided with a material in ohmic contact with the channel layer 260. The source contact portion 31 and the drain contact portion 32 may comprise a material in ohmic contact with the second nitride semiconductor layer 262. For example, the source contact portion 31 and the drain contact portion 32 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source contact portion 31 and the drain contact portion 32 may be provided in a thickness of 0.1 to 1 µm as an example.

The gate electrode 233 may be provided as a material in Schottky contact with the channel layer 260. The gate electrode 233 may be provided with a material which is in a Schottky contact with the second nitride semiconductor layer 262. The gate electrode 233 may comprise a single layer or multiple layers comprising at least one material selected from the group consisting of nickel (Ni), platinum (Pt), gold (Au), and palladium (Pd), or an alloy thereof. For example, the Schottky contact may be implemented by plasma treatment of the channel layer 260. In the plasma treatment, for example, fluorine (F) ion treatment may be applied. Accordingly, the thin film transistor 230 according to an embodiment may be provided with a threshold voltage by the Schottky contact and may have a normally off characteristic. When a voltage equal to or higher than the threshold voltage is applied to the gate electrode 233, a channel formed on the gate electrode 233 is turned on to allow a current to flow the channel layer 260.

The gate wiring 41 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The gate wiring 41 may be provided in a thickness of 0.1 to 3 μm as an example.

The source connecting wiring 42 and the drain connecting wiring 43 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source connecting wiring 42 and the drain connecting wiring 43 may be provided in a thickness of 0.1 to 3 μm as an example.

The source electrode 71 and the drain electrode 72 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source electrode 71 and the drain electrode 72 may be provided in a thickness of 0.1 to 3 μm as an example.

The thin film transistor substrate according to an embodiment may comprise a first passivation film 21 disposed under the channel layer 260. The first passivation film 21 may be disposed under the second nitride semiconductor layer 262. An upper surface of the first passivation film 21 may be disposed in contact with a lower surface of the second nitride semiconductor layer 262.

According to an embodiment, the source contact portion 31 may be disposed to pass through the first passivation film 21. The source contact portion 31 may be disposed to be surrounded by the first passivation film 21. The source contact portion 31 may be disposed to pass through the first passivation film 21 and provided in contact with the first region of the channel layer 260. The drain contact portion 32 may be disposed to pass through the first passivation film 21. The drain contact portion 32 may be disposed to be surrounded by the first passivation film 21. The drain contact portion 32 may be disposed to pass through the first passivation film 21 and provided in contact with the second region of the channel layer 260.

The first passivation film 21 may be provided with an insulating material. The first passivation film 21 may comprise a single layer or multiple layers comprising at least one of a silicon-based oxide, a silicon-based nitride, a metal oxide comprising $Al_2O_3$, and an organic insulating material as an example.

The source connecting wiring 42 may be disposed in contact with the source contact portion 31 thereunder and provided to be surrounded by the bonding layer 50. The drain connecting wiring 43 may be disposed in contact with the drain contact portion 32 thereunder and provided to be surrounded by the bonding layer 50. The gate wiring 41 may be disposed in contact with the gate electrode 233 thereunder and provided to be surrounded by the bonding layer 50.

The thin film transistor substrate according to an embodiment may comprise the first passivation film 21 and a second passivation film 22 disposed on the channel layer 260. The source electrode 71 may pass through the first passivation film 21 and the second passivation film 22 and be electrically connected to the source connecting wiring 42. The source electrode 71 may comprise a first region disposed on the second passivation film 22. The source electrode 71 may comprise a second region passing through the second passivation film 22 and the first passivation film 21. The drain electrode 72 may pass through the first passivation film 21 and the second passivation film 22 and be electrically connected to the drain connecting wiring 43. The drain electrode 72 may comprise a first region disposed on the second passivation film 22. The drain electrode 72 may comprise a second region passing through the second passivation film 22 and the first passivation film 21.

The second passivation film 22 may comprise an insulating material. The second passivation film 22 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may comprise a third passivation film 23 disposed on the second passivation film 22. The third passivation film 23 may be disposed on the source electrode 71 and the drain electrode 72. The third passivation film 23 may be disposed on the second gate electrode 36. The third passivation film 23 may comprise a contact hole H3 provided on the drain electrode 72.

The third passivation film 23 may comprise a single layer or multiple layers comprising at least one material of a silicon-based oxide, a silicon-based nitride, a metal oxide comprising $Al_2O_3$, and an organic insulating material as an example.

According to an embodiment, the pixel electrode 80 may be disposed on the third passivation film 23. The pixel electrode 80 may be electrically connected to the drain electrode 72 via the contact hole H3 provided in the third passivation film 23. A lower surface of the pixel electrode 80 may be disposed in contact with an upper surface of the drain electrode 72.

The pixel electrode 80 may be provided with a transparent conductive material. The pixel electrode 80 may be provided with, for example, a transparent conductive oxide film. The pixel electrode 80 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The thin film transistor substrate according to an embodiment may be bonded to a color filter substrate to provide a liquid crystal display panel. A liquid crystal layer may be provided between the thin film transistor substrate and the color filter substrate. A common electrode may be provided at the color filter substrate. An arrangement of the liquid crystal layer disposed between the common electrode and the pixel electrode provided on the thin film transistor substrate may be adjusted by a difference in voltage applied therebetween, and a light transmission amount of a corresponding pixel may be controlled. The liquid crystal display panel having such a structure may be referred to as a vertical electric field type liquid crystal display panel.

According to the thin film transistor substrate according to an embodiment, a high carrier mobility may be implemented by providing the thin film transistor comprising the nitride-based semiconductor layer. An electron mobility ($cm^2/Vs$) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIG. 25 is a view illustrating still another example of a thin film transistor substrate according to an embodiment of the present invention. The thin film transistor substrate shown in FIG. 25 is an embodiment to which a thin film transistor having a structure in which gates are disposed in a recessed region of a channel layer is applied, and description of contents overlapping with those described with reference to FIGS. 1 to 24 may be omitted.

The thin film transistor substrate described with reference to FIG. 24 may be applied to a vertical electric field type liquid crystal display panel. Meanwhile, the thin film transistor substrate described with reference to FIG. 25 may be applied to a horizontal electric field type liquid crystal display panel.

As shown in FIG. 25, the thin film transistor substrate according to an embodiment may comprise a pixel electrode 81, a common electrode 85, and a fourth passivation film 24.

The common electrode 85 may be disposed on a third passivation film 23. The fourth passivation film 24 may be disposed on the third passivation film 23. The fourth passivation film 24 may be disposed on the common electrode 85 and the third passivation film 23. The common electrode 85 may be disposed between the third passivation film 23 and the fourth passivation film 24. In addition, the fourth passivation film 24 may be provided on a drain electrode 72 exposed through the third passivation film 23. The pixel electrode 81 may be disposed on the fourth passivation film 24. A partial region of the pixel electrode 81 may be electrically connected to the drain electrode 72 through a fourth contact hole H4 provided in the fourth passivation film 24. A partial region of the pixel electrode 81 may be disposed in contact with the upper surface of the drain electrode 72 through the fourth contact hole H4. The pixel electrode 81 may be disposed in contact with the upper surface of the drain electrode 72 by passing through the third passivation film 23 and the fourth passivation film 24. A partial region of the pixel electrode 81 and a partial region of the common electrode 85 may be overlapped with each other in a vertical direction.

The thin film transistor substrate according to an embodiment may comprise a plurality of thin film transistors 230 disposed in a region in which a gate wiring 41 and a data wiring 73 intersect with each other. The pixel electrode 81 may be disposed at a region that is defined by the gate wiring 41 and the data wiring 73. The pixel electrode 81 may comprise a portion extending in a finger shape. A partial region of the pixel electrode 81 may be disposed and overlapped with the gate wiring 41.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 81 may be provided with a transparent conductive material. The pixel electrode 81 may be provided with, for example, a transparent conductive oxide film. The pixel electrode 81 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The fourth passivation film 24 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may be bonded to a color filter substrate to provide a liquid crystal display panel. A liquid crystal layer may be provided between the thin film transistor substrate and the color filter substrate. In the thin film transistor substrate according to an embodiment, an arrangement of the liquid crystal layer may be adjusted by a difference in voltage applied between the common electrode 85 and the pixel electrode 81, and a light transmission amount of a corresponding pixel may be controlled. The liquid crystal display panel having such a structure may be referred to as a horizontal electric field type liquid crystal display panel, a transverse electric field type liquid crystal display panel, or an In Plane Switching (IPS) liquid crystal display panel. Since the liquid crystal display panel itself has no light source, a display device may be implemented by providing a light unit that supplies light to the liquid crystal display panel.

According to the thin film transistor substrate according to an embodiment, a high carrier mobility may be provided by providing the thin film transistor comprising the nitride-based semiconductor layer. An electron mobility ($cm^2/Vs$) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIG. 26 is a view illustrating still another example of a thin film transistor substrate according to an embodiment of the present invention. The thin film transistor substrate shown in FIG. 26 is an embodiment to which a thin film transistor having a structure in which gates are disposed in a recessed region of a channel layer is applied, and description of contents overlapping with those described with reference to FIGS. 1 to 25 may be omitted.

The thin film transistor substrate according to an embodiment may comprise a pixel electrode 82, a common electrode 85, a metal layer 90, a touch panel lower electrode 91, and a touch panel upper electrode 92.

The common electrode 85 may be disposed on a third passivation film 23. The pixel electrode 82 may be disposed on a fourth passivation film 24. The pixel electrode 82 may be electrically connected to a drain electrode 72. The metal layer 90 may be provided between the pixel electrode 82 and the drain electrode 72. The metal layer 90 may be disposed in contact with the drain electrode 72 exposed through the third passivation film 23. A partial region of the pixel electrode 82 may be electrically connected to the drain electrode 72 through the metal layer 90 through a fifth contact hole H5 provided in the fourth passivation film 24.

According to an embodiment, the touch panel upper electrode 92 may be provided on the fourth passivation film 24 and the touch panel lower electrode 91 may be disposed below the touch panel upper electrode 92. The touch panel lower electrode 91 may be disposed on the third passivation film 23 and may be electrically connected to the common electrode 85. The touch panel lower electrode 91 may be disposed between the common electrode 85 and the fourth passivation film 24. The touch panel upper electrode 92 may be disposed to be overlapped with the touch panel lower electrode 91 in a vertical direction.

The touch panel upper electrode 92 and the touch panel lower electrode 91 may form an in-cell touch panel provided in the display panel. Accordingly, the thin film transistor substrate according to an embodiment may detect a contact of the display panel from outside by using the in-cell touch panel.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 82 may be provided with a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The touch panel lower electrode 91 and the touch panel upper electrode 92 may be formed of a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The in-cell touch panel-integrated thin film transistor substrate according to an embodiment may be bonded to a color filter substrate to provide a liquid crystal display panel. A liquid crystal layer may be provided between the in-cell touch panel-integrated thin film transistor substrate and the color filter substrate. In the in-cell touch panel-integrated thin film transistor substrate according to an embodiment, an arrangement of the liquid crystal layer may be adjusted by a difference in voltage applied between the common electrode 85 and the pixel electrode 82, and a light transmission amount of a corresponding pixel may be controlled. The in-cell touch panel-integrated liquid crystal display panel having such a structure may be referred to as a horizontal electric field type liquid crystal display panel, a transverse electric field type liquid crystal display panel, or an In Plane Switching (IPS) liquid crystal display panel. Since the in-cell touch panel-integrated liquid crystal display panel itself has no light source, a display device may be implemented by providing a light unit that supplies light to the in-cell touch panel-integrated liquid crystal display panel.

According to the thin film transistor substrate according to an embodiment, a high carrier mobility may be implemented by providing the thin film transistor comprising the nitride-based semiconductor layer. An electron mobility ($cm^2/Vs$) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may provide an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIG. 27 is a block diagram illustrating an example of a display device comprising a thin film transistor substrate according to an embodiment of the present invention.

The display device according to an embodiment may comprise a display panel 1100, a light unit 1200, and a panel driver 1300 as shown in FIG. 27.

The display panel 1100 may comprise any one of the thin film transistor substrates described with reference to FIGS. 1 to 26 and a color filter substrate disposed on the thin film transistor substrate. The display panel 1100 may comprise a liquid crystal layer disposed between the thin film transistor substrate and the color filter substrate.

The light unit 1200 may be disposed under the display panel 1100 and may supply light to the display panel 1100. The panel driver 1300 may provide a driving signal to the display panel 1100. The panel driver 1300 may control the light transmittance of a plurality of pixels provided in the display panel 1100 and may display an image on the display panel 1100 by using light provided from the light unit 1200.

According to the thin film transistor substrate according to an embodiment, a high carrier mobility may be implemented by providing the thin film transistor comprising the nitride-based semiconductor layer. An electron mobility (cm²/Vs) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may provide an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility FIG. 28 is a view illustrating still another example of a thin film transistor substrate according to an embodiment of the present invention. FIG. 29 is a cross-sectional view taken along line D-D of the thin film transistor substrate shown in FIG. 28, and FIG. 30 is a cross-sectional view taken along line E-E of the thin film transistor substrate shown in FIG. 28.

Embodiments described with reference to FIGS. 1 to 27 relate to a thin film transistor substrate capable of being applied to a liquid crystal display device, and the thin film transistor substrate described with reference to FIGS. 28 to 30 may be applied to, for example, an organic light-emitting display device.

The thin film transistor substrate according to an embodiment may comprise a switching thin film transistor 330 and a driving thin film transistor 430. The switching thin film transistor 330 may receive a signal from a gate line 341 and a data line 373 and may provide a gate signal and a data signal to a corresponding pixel. The switching thin film transistor 330 may comprise a first gate electrode 333, a first source electrode 371, and a first drain electrode 372. The driving thin film transistor 430 may comprise a second gate electrode 433, a second source electrode 471, and a second drain electrode 472. The second gate electrode 433 of the driving thin film transistor 430 may be electrically connected to the first drain electrode 372 of the switching thin film transistor 330. The second source electrode 471 of the driving thin film transistor 430 may be connected to a driving power supply line (Vdd) 474. Operations of the switching thin film transistor 330 and the driving thin film transistor 430 will be described later with reference to FIG. 31.

As shown in FIGS. 28 to 30, the thin film transistor substrate according to an embodiment of the present invention may comprise a support substrate 355, the switching thin film transistor 330 disposed on the support substrate 355, the driving thin film transistor 430, and a light-emitting layer 488 electrically connected to the driving thin film transistor 430.

The switching thin film transistor 330 according to an embodiment may comprise a first depletion forming layer 315, a first gate electrode 333, a first channel layer 360, a first source electrode 371, and a first drain electrode 372. The first source electrode 371 may be electrically connected to a first region of the first channel layer 360. The first source electrode 371 may be electrically connected to a lower surface of the first channel layer 360. The first drain electrode 372 may be electrically connected to a second region of the first channel layer 360. The first drain electrode 372 may be electrically connected to the lower surface of the first channel layer 360. The first gate electrode 333 may be disposed under the first channel layer 360. The first depletion forming layer 315 may be disposed under between the first region and the second region of the first channel layer 360. The first depletion forming layer 315 may be disposed between the first channel layer 360 and the first gate electrode 333.

The driving thin film transistor 430 according to an embodiment may comprise a second depletion forming layer 415, a second gate electrode 433, a second channel layer 460, a second source electrode 471, and a second drain electrode 472. The second source electrode 471 may be electrically connected to a first region of the second channel layer 460. The second source electrode 471 may be electrically connected to a lower surface of the second channel layer 460. The second drain electrode 472 may be electrically connected to a second region of the second channel layer 460. The second drain electrode 472 may be electrically connected to the lower surface of the second channel layer 460. The second gate electrode 433 may be disposed under the second channel layer 460. The second depletion forming layer 415 may be disposed under between the first region and the second region of the second channel layer 460. The second depletion forming layer 415 may be disposed between the second channel layer 460 and the second gate electrode 433.

The structures of the switching thin film transistor 330 and the driving thin film transistor 430 may be similar to each other, and in the description of the driving thin film transistor 430, description of contents overlapping with those described with reference to the switching thin film transistor 330 may be omitted.

The first channel layer 360 and the second channel layer 460 may be provided with, for example, a Group III-V compound semiconductor. For example, the first channel layer 360 and the second channel layer 460 may be provided with a semiconductor material having an empirical formula of $In_xAl_yGa_{1-x-y}N$ ($0 \geq x \geq 1$, $0 \geq y \geq 1$, $0 \geq x+y \geq 1$). The first channel layer 360 and the second channel layer 460 may comprise a single layer or multiple layers selected from, for example, GaN, AlGaN, InGaN, InN, InAlGaN, AlInN, AlGaAs, GaP, GaAs, GaAsP, AlGaInP and so on. The first channel layer 360 and the second channel layer 460 may be formed of different materials.

The first channel layer 360 and the second channel layer 460 may each comprise first nitride semiconductor layers 361 and 461 and second nitride semiconductor layers 362 and 462. The first nitride semiconductor layers 361 and 461 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). The second nitride semiconductor layers 362 and 462 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$).

According to the first channel layer 360 and the second channel layer 460 according to an embodiment, the first nitride semiconductor layers 361 and 461 may comprise a GaN semiconductor layer, and the second nitride semiconductor layers 362 and 462 may comprise an AlGaN semiconductor layer. The second nitride semiconductor layer 362 of the first channel layer 360 may be disposed between the first nitride semiconductor layer 361 and the first depletion forming layer 315. The second nitride semiconductor layer 462 of the second channel layer 460 may be disposed between the first nitride semiconductor layer 461 and the second depletion forming layer 415.

The first depletion forming layer 315 and the second depletion forming layer 415 may be provided with, for example, a group III-V compound semiconductor. For example, the first depletion forming layer 315 and the second depletion forming layer 415 may be provided with a semiconductor material having an empirical formula of $In_xAl_yGa_{1-x-y}N$ ($0 \geq x \geq 1$, $0 \geq y \geq 1$, $0 \geq x+y \geq 1$). The first depletion forming layer 315 and the second depletion forming layer 415 may comprise a single layer or multiple layers selected from, for example, GaN, AlN, AlGaN, InGaN, InN, InAlGaN, AlInN, AlGaAs, GaP, GaAs, GaAsP, AlGaInP and so on. The first depletion forming layer 315 and the second depletion forming layer 415 may comprise a nitride semiconductor layer doped with a p-type dopant. For example, the first depletion forming layer 315 and the second depletion forming layer 415 may comprise a GaN semiconductor layer doped with a p-type dopant or an AlGaN semiconductor layer doped with a p-type dopant. The first depletion forming layer 315 and the second depletion forming layer 415 may comprise a single layer or multiple layers provided with, for example, a semiconductor material having an empirical formula of p-$Al_xGa_{1-x}N$ ($0 \geq x \geq 0.3$). The first depletion forming layer 315 and the second depletion forming layer 415 may be provided in a thickness of 2 to 300 nm as an example. The first depletion forming layer 315 and the second depletion forming layer 415 may comprise different materials. Substances added to the first depletion forming layer 315 and the second depletion forming layer 415, and addition amounts of the added substances may be different from each other.

The first depletion forming layer 315 and the second depletion forming layer 415 may serve to form a depletion region in a two-dimensional electron gas (2DEG) provided in the first channel layer 360 and the second channel layer 460. The energy bandgap of a portion of the second nitride semiconductor layer 362 positioned thereon may be increased by the first depletion forming layer 315. As a result, the depletion region of the 2DEG may be provided at a portion of the first channel layer 360 corresponding to the first depletion forming layer 315. Therefore, a region corresponding to the position in which the first depletion forming layer 315 is disposed in the 2DEG provided at the first channel layer 360 may be cut off. A region in which the 2DEG is cut off at the first channel layer 360 may be referred to as a cut-off region. For example, a cut-off region may be formed at the second nitride semiconductor layer 362. The switching thin film transistor 330 may have a normally-off characteristic due to such a cut-off region. When a voltage equal to or higher than a threshold voltage is applied to the first gate electrode 333, the 2DEG is generated at the cut-off region and the switching thin film transistor 330 is turned on. When a channel formed at an upper portion of the first gate electrode 333 is turned on, a current may flow via the 2DEG formed at the first channel layer 360. Accordingly, the current flow from the first region to the second region of the first channel layer 360 may be controlled according to a voltage applied to the first gate electrode 333. The second depletion forming layer 415 may perform a function similar to that of the first depletion forming layer 315.

The support substrate 355 may comprise a transparent substrate. The support substrate 355 may be provided with, for example, a transparent substrate having a thickness of 0.1 mm to 3 mm. The support substrate 355 may comprise at least one material selected from materials comprising silicon, glass, polyimide, and plastic. The support substrate 355 may comprise a flexible substrate.

The support substrate 355 may serve to support the switching thin film transistor 330 and the driving thin film transistor 430 as a substrate to be used in a transfer process. In addition, the thin film transistor substrate according to an embodiment may comprise a bonding layer 350 provided between the support substrate 355 and the switching thin film transistor 330. The bonding layer 350 may be disposed between the support substrate 355 and the driving thin film transistor 430.

The bonding layer 350 may comprise an organic material. The bonding layer 350 may be provided with a transparent material. The bonding layer 350 may be provided with, for example, a material having a transmittance of 70% or more. The bonding layer 350 may comprise an organic insulating material. The bonding layer 350 may comprise at least one material selected from the group consisting of acryl, benzocyclobutene (BCB), SU-8 polymer, and the like. The bonding layer 350 may be provided in a thickness of 0.5 to 6 μm as an example.

The switching thin film transistor 330 according to an embodiment may comprise a first source contact portion 331 disposed under the first region of the first channel layer 360 and a first drain contact portion 332 disposed under the second region of the first channel layer 360. The first source contact portion 331 may be disposed in contact with the first region of the first channel layer 360. The first drain contact portion 332 may be disposed in contact with the second region of the first channel layer 360.

The switching thin film transistor 330 according to an embodiment may comprise a first source connecting wiring 342 disposed under the first source contact portion 331 and a first drain connecting wiring 343 disposed under the first drain contact portion 332. In addition, the switching thin film transistor 330 may comprise a first gate wiring 341 disposed under the first gate electrode 333. The first source connecting wiring 342 may be electrically connected to the first source contact portion 331. For example, an upper surface of the first source connecting wiring 342 may be disposed in contact with a lower surface of the first source contact portion 331. The first drain connecting wiring 343 may be electrically connected to the first drain contact portion 332. For example, an upper surface of the first drain connecting wiring 343 may be disposed in contact with a lower surface of the first drain contact portion 332. The first gate wiring 341 may be electrically connected to the first gate electrode 333. An upper surface of the first gate wiring 341 may be disposed in contact with a lower surface of the first gate electrode 333.

The first source electrode 371 may be electrically connected to the first source connecting wiring 342. The first source electrode 371 may be disposed in contact with the upper surface of the first source connecting wiring 342. For example, the first source electrode 371 may be electrically connected to the first region of the first channel layer 360 via the first source connecting wiring 342 and the first source contact portion 331. The first drain electrode 372 may be electrically connected to the first drain connecting wiring 343. The first drain electrode 372 may be disposed in contact with the upper surface of the first drain connecting wiring 343. For example, the first drain electrode 372 may be electrically connected to the second region of the first channel layer 360 via the first drain connecting wiring 343 and the first drain contact portion 332.

The driving thin film transistor 430 according to an embodiment may comprise a second source contact portion 431 disposed under the first region of the second channel layer 460 and a second drain contact portion 432 disposed under the second region of the second channel layer 460. The second source contact portion 431 may be disposed in contact with the first region of the second channel layer 460. The second drain contact portion 432 may be disposed in contact with the second region of the second channel layer 460.

The driving thin film transistor 430 according to an embodiment may comprise a second source connecting wiring 442 disposed under the second source contact portion 431 and a second drain connecting wiring 443 disposed under the second drain contact portion 432. In addition, the driving thin film transistor 430 may comprise a second gate wiring 441 disposed under the second gate electrode 433. The second source connecting wiring 442 may be electrically connected to the second source contact portion 431. For example, an upper surface of the second source connecting wiring 442 may be disposed in contact with a lower surface of the second source contact portion 431. The second drain connecting wiring 443 may be electrically connected to the second drain contact portion 432. For example, an upper surface of the second drain connecting wiring 443 may be disposed in contact with a lower surface of the second drain contact portion 432. The second gate wiring 441 may be electrically connected to the second gate electrode 433. An upper surface of the second gate wiring 441 may be disposed in contact with a lower surface of the second gate electrode 433.

The second source electrode 471 may be electrically connected to the second source connecting wiring 442. The second source electrode 471 may be disposed in contact with the upper surface of the second source connecting wiring 442. For example, the second source electrode 471 may be electrically connected to the first region of the second channel layer 460 via the second source connecting wiring 442 and the second source contact portion 431. The second drain electrode 472 may be electrically connected to the second drain connecting wiring 443. The second drain electrode 472 may be disposed in contact with the upper surface of the second drain connecting wiring 443. For example, the second drain electrode 472 may be electrically connected to the second region of the second channel layer 460 via the second drain connecting wiring 443 and the second drain contact portion 432.

The first source contact portion 331 and the first drain contact portion 332 may be provided with a material in ohmic contact with the first channel layer 360. The first source contact portion 331 and the first drain contact portion 332 may comprise a material in ohmic contact with the second nitride semiconductor layer 362. The second source contact portion 431 and the second drain contact portion 432 may be provided with a material in ohmic contact with the second channel layer 460. The second source contact portion 431 and the second drain contact portion 432 may comprise a material in ohmic contact with the second nitride semiconductor layer 462. For example, the first source contact portion 331, the first drain contact portion 332, the second source contact portion 431, and the second drain contact portion 432 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source contact portion 331, the first drain contact portion 332, the second source contact portion 431 and the second drain contact portion 432 may be provided in a thickness of 0.1 to 1 μm as an example.

The first gate electrode 333 may be provided with a material in ohmic contact with the first depletion forming layer 315. The second gate electrode 433 may be provided with a material in ohmic contact with the second depletion forming layer 415. For example, the first gate electrode 333 and the second gate electrode 433 may be provided with a material in ohmic contact with a p-type nitride layer. The first gate electrode 333 and the second gate electrode 433 may comprise a single layer or multiple layers comprising at least one material selected from the group consisting of tungsten (W), tungsten silicon (WSi$_2$), titanium nitride (TiN), tantalum (Ta), tantalum nitride (TaN), palladium (Pd), nickel (Ni), and platinum (Pt). The first gate electrode 333 and the second gate electrode 433 may be provided in a thickness of 0.1 to 1 μm as an example.

The first gate wiring 341 and the second gate wiring 441 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first gate wiring 341 and the second gate wiring 441 may be provided in a thickness of 0.1 to 3 μm as an example.

The first source connecting wiring 342, the first drain connecting wiring 343, the second source connecting wiring 442, and the second drain connecting wiring 443 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source connecting wiring 342, the first drain connecting wiring 343, the second source connecting wiring 442 and the second drain connecting wiring 443 may be provided in a thickness of 0.1 to 3 μm as an example.

The first source electrode 371, the first drain electrode 372, the second source electrode 471, and the second drain electrode 472 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source electrode 371, the first drain electrode 372, the second source electrode 471, and the second drain electrode 472 may be provided in a thickness of 0.1 to 3 µm as an example.

The thin film transistor substrate according to an embodiment may comprise a first passivation film 321 disposed under the first channel layer 360 and the second channel layer 460. The first passivation film 321 may be disposed under the second nitride semiconductor layer 362 of the first channel layer 360 and the second nitride semiconductor layer 462 of the second channel layer 460. An upper surface of the first passivation film 321 may be disposed in contact with lower surfaces of the second nitride semiconductor layer 362 of the first channel layer 360 and the second nitride semiconductor layer 462 of the second channel layer 460.

According to an embodiment, the first source contact portion 331 may be disposed to pass through the first passivation film 321. The first source contact portion 331 may be disposed to be surrounded by the first passivation film 321. The first source contact portion 331 may be disposed to pass through the first passivation film 321 and provided in contact with the first region of the first channel layer 360. The first drain contact portion 332 may be disposed to pass through the first passivation film 321. The first drain contact portion 332 may be disposed to be surrounded by the first passivation film 321. The first drain contact portion 332 may be disposed to pass through the first passivation film 321 and provided in contact with the second region of the first channel layer 360.

According to an embodiment, the second source contact portion 431 may be disposed to pass through the first passivation film 321. The second source contact portion 431 may be disposed to be surrounded by the first passivation film 321. The second source contact portion 431 may be disposed to pass through the first passivation film 321 and provided in contact with the first region of the second channel layer 460. The second drain contact portion 432 may be disposed to pass through the first passivation film 321. The second drain contact portion 432 may be disposed to be surrounded by the first passivation film 321. The second drain contact portion 432 may be disposed to pass through the first passivation film 321 and provided in contact with the second region of the second channel layer 460.

The first passivation film 321 may be provided with an insulating material. The first passivation film 321 may comprise a single layer or multiple layers comprising at least one material of a silicon-based oxide, a silicon-based nitride, a metal oxide comprising $Al_2O_3$, and an organic insulating material as an example.

The first source connecting wiring 342 may be disposed in contact with the first source contact portion 331 thereunder and provided to be surrounded by the bonding layer 350. The first drain connecting wiring 343 may be disposed in contact with the first drain contact portion 332 thereunder and provided to be surrounded by the bonding layer 350. The first gate wiring 341 may be disposed in contact with the first gate electrode 333 thereunder and provided to be surrounded by the bonding layer 350.

The upper surface of the first source connecting wiring 342 may be disposed higher than the upper surface of the first gate wiring 341. The upper surface of the first source connecting wiring 342 may be disposed higher than the lower surface of the first gate electrode 333. The upper surface of the first drain connecting wiring 343 may be disposed higher than the upper surface of the first gate wiring 341. The upper surface of the first drain connecting wiring 343 may be disposed higher than the lower surface of the first gate electrode 333.

The second source connecting wiring 442 may be disposed in contact with the second source contact portion 431 thereunder and provided to be surrounded by the bonding layer 350. The second drain connecting wiring 443 may be disposed in contact with the second drain contact portion 432 thereunder and provided to be surrounded by the bonding layer 350. The second gate wiring 441 may be disposed in contact with the second gate electrode 433 thereunder and provided to be surrounded by the bonding layer 350.

The upper surface of the second source connecting wiring 442 may be disposed higher than the upper surface of the second gate wiring 441. The upper surface of the second source connecting wiring 442 may be disposed higher than the lower surface of the second gate electrode 433. The upper surface of the second drain connecting wiring 443 may be disposed higher than the upper surface of the second gate wiring 441. The upper surface of the second drain connecting wiring 443 may be disposed higher than the lower surface of the second gate electrode 433.

The thin film transistor substrate according to an embodiment may comprise the first passivation film 321, the first channel layer 360, and a second passivation film 322 disposed on the second channel layer 460. The first source electrode 371 may pass through the first passivation film 321 and the second passivation film 322 and be electrically connected to the first source connecting wiring 342. The first source electrode 371 may comprise a first region disposed on the second passivation film 322. The first source electrode 371 may comprise a second region passing through the second passivation film 322 and the first passivation film 321. The first drain electrode 372 may pass through the first passivation film 321 and the second passivation film 322 and be electrically connected to the first drain connecting wiring 343. The first drain electrode 372 may comprise a first region disposed on the second passivation film 322. The first drain electrode 372 may comprise a second region passing through the second passivation film 322 and the first passivation film 321.

The second source electrode 471 may pass through the first passivation film 321 and the second passivation film 322 and be electrically connected to the second source connecting wiring 442. The second source electrode 471 may comprise a first region disposed on the second passivation film 322. The second source electrode 471 may comprise a second region passing through the second passivation film 322 and the first passivation film 321. The second drain electrode 472 may pass through the first passivation film 321 and the second passivation film 322 and be electrically connected to the second drain connecting wiring 443. The second drain electrode 472 may comprise a first region disposed on the second passivation film 322. The second drain electrode 472 may comprise a second region passing through the second passivation film 322 and the first passivation film 321.

According to an embodiment, a first drain-gate connecting wiring 375 may be disposed on the second passivation film 322. The first drain-gate connecting wiring 375 may comprise a first region disposed on the second passivation film 322. The first drain-gate connecting wiring 375 may comprise a second region passing through the second passivation film 322 and the first passivation film 321. The first region of the first drain-gate connecting wiring 375 may be electrically connected to the first drain electrode 372. The first region of the first drain-gate connecting wiring 375 may be disposed to be extending from the first drain electrode 372. For example, the first drain-gate connecting wiring 375 and the first drain electrode 372 may be integrally formed in the same process. In addition, the first drain-gate connecting wiring 375 and the first drain electrode 372 may be separately formed in different processes and electrically connected to each other.

According to an embodiment, a second drain-gate connecting wiring 475 may be disposed under the first passivation film 321. The second drain-gate connecting wiring 475 may be electrically connected to the first drain-gate connecting wiring 375. The second region of the first drain-gate connecting wiring 375 may be disposed in contact with the second drain-gate connecting wiring 475. The second drain-gate connecting wiring 475 may be electrically connected to the second gate wiring 441. The second drain-gate connecting wiring 475 may be disposed to be extending from the second gate wiring 441. For example, the second drain-gate connecting wiring 475 and the second gate wiring 441 may be integrally formed in the same process. In addition, the second drain-gate connecting wiring 475 and the second gate wiring 441 may be formed in separate processes and electrically connected to each other. A partial region of the second drain-gate connecting wiring 475 may be disposed in contact with the upper surface of the second gate wiring 441. The first drain electrode 372 may be electrically connected to the second gate electrode 433 via the first drain-gate connecting wiring 375, the second drain-gate connecting wiring 475, and the second gate wiring 441.

As shown in FIG. 30, the second channel layer 460 and the second depletion forming layer 415 may be formed in the same width. When a width of the second depletion forming layer 415 is smaller than that of the second channel layer 460, a leakage current may be generated. In other words, the length of the second channel layer 460 provided along the direction in which the second gate electrode 433 is extended and disposed and the length of the second depletion forming layer 415 may be provided in the same length.

The first passivation film 321 may comprise a region having a first thickness and disposed in contact with the lower surface of the first channel layer 360 and a region having a second thickness and disposed in contact with a lower surface of the second passivation film 322. The region having the first thickness of the first passivation film 321 may be disposed between the lower surface of the first channel layer 360 and the upper surface of the first gate wiring 341. The region having the second thickness of the first passivation film 321 may be disposed between the lower surface of the second passivation film 322 and the upper surface of the first source connecting wiring 342 or the upper surface of the first drain connecting wiring 343. The region having the second thickness of the first passivation film 321 may be disposed between the lower surface of the second passivation film 322 and an upper surface of the bonding layer 350. The first thickness of the first passivation film 321 may be thicker than the second thickness thereof.

The second passivation film 322 may comprise an insulating material. For example, the second passivation film 322 may comprise a single layer or multiple layers comprising at least one material among a silicon-based oxide, a silicon nitride, a metal oxide containing $Al_2O_3$, and an organic insulator.

The thin film transistor substrate according to an embodiment may comprise a third passivation film 323 disposed on the second passivation film 322. The third passivation film 323 may be disposed on the first source electrode 371, the first drain electrode 372, the second source electrode 471, and the second drain electrode 472.

For example, the third passivation film 323 may comprise a single layer or multiple layers containing at least one material of a silicon-based oxide, a silicon-based nitride, a metal oxide containing $Al_2O_3$, and an organic insulating material.

The thin film transistor substrate according to an embodiment may comprise a lower electrode 486 disposed on the driving thin film transistor 430. The lower electrode 486 may be electrically connected to the driving thin film transistor 430. The lower electrode 486 may be electrically connected to the second drain electrode 472 of the driving thin film transistor 430. The lower electrode 486 may be disposed on the third passivation film 423. The lower electrode 486 may be electrically connected to the second drain electrode 472 through a contact hole provided in the third passivation film 323. A lower surface of the lower electrode 486 may be disposed in contact with an upper surface of the second drain electrode 472.

In addition, the thin film transistor substrate according to an embodiment may comprise a fourth passivation film 324 disposed on the third passivation film 323. The light-emitting layer 488 may be disposed on the lower electrode 486. An upper electrode 487 may be disposed on the light-emitting layer 488. The light-emitting layer 488 and the upper electrode 487 may be disposed on the fourth passivation film 324. A first region of the light-emitting layer 488 may be disposed on the fourth passivation film 324. A second region of the light-emitting layer 488 may be disposed in contact with an upper surface of the lower electrode 486 through a contact hole provided in the fourth passivation film 324. The light-emitting layer 488 may emit light of any one of wavelength bands comprising red, green, blue, and white as an example. The light-emitting layer 488 may be provided with an organic material as an example.

The lower electrode 486 and the upper electrode 487, for example, may comprise one material selected from ITO, ITO/Ag, ITO/Ag/ITO, and ITO/Ag/IZO, or an alloy containing the material. The lower electrode 486 and the upper electrode 487 may comprise different materials. One of the upper electrode 486 and the lower electrode 487 may be provided as a transparent electrode, and light emitted from the light-emitting layer 488 in a direction of the transparent electrode may be emitted to the outside.

Meanwhile, as explained above referring to FIG. 16, a partial region of the first drain connecting wiring 343 according to an embodiment may be disposed between the first drain contact portion 332 and the first passivation film 321. In the process of forming the first drain contact portion 332, a space may be provided between the side surface of the first drain contact portion 332 and the first passivation film 321, and the partial region of the first drain connecting wiring 343 may be formed in this space. In the process of forming a through hole at the first passivation film 321 to form the first drain contact portion 332, a side surface of the first passivation film 321 surrounding the first drain contact portion 332 may be formed to be inclined. An angle a2 formed by the side surface of the first passivation film 321 and the upper surface of the first passivation film 321 may be provided as an acute angle. For example, the angle a2 formed by the side surface of the first passivation film 321 and the upper surface of the first passivation film 321 may be 10 to 90 degrees. As another embodiment, the angle a2 formed by the side surface of the first passivation film 321 and the upper surface of the first passivation film 321 may be 30 to 90 degrees. A predetermined gap t2 may be provided between the side surface of the first passivation film 321 and the first drain contact portion 332 and, for example, a gap of 0 to 3 μm may be provided. In addition, although not shown in the drawing, a partial region of the source connecting wiring 342 according to an embodiment may be disposed between the source contact portion 331 and the first passivation film 321. In the process of forming the source contact portion 331, a space may be provided between the side surface of the source contact portion 331 and the first passivation film 321, and a partial region of the first source connecting wiring 343 may be formed in this space. According to an embodiment, since the first channel layer 360 is formed by the etching process, an angle a1 formed between a side surface of the first channel layer 360 and the lower surface of the first channel layer 360 may be provided as an acute angle. For example, the angle a1 formed between the side surface of the first channel layer 360 and the lower surface of the first channel layer 360 may be 30 to 90 degrees.

For example, when the first passivation film 321 is provided with a silicon-based oxide such as $SiO_2$, the first passivation film 321 may be etched by wet etching or dry etching. When the etching is performed by the wet etching, the angle of a2 may be formed at about 10 to 60 degrees, and a wider shape may be provided within a few μm compared to a pattern to be etched. When the wet etching is performed, the angle of a2 may be formed at an angle of about 35 to 45 degrees. When the etching is performed by the dry etching, the angle of a2 may be formed at about 60 to 90 degrees, and a shape having a width similar to the pattern to be etched may be provided. When the dry etching is performed, the angle of a2 may be formed at an angle of about 65 to 75 degrees.

An upper surface of the first nitride semiconductor layer 361 may be provided shorter than a lower surface thereof. An upper surface of the second nitride semiconductor layer 362 may be provided shorter than the lower surface thereof. The lower surface of the first nitride semiconductor layer 361 and the upper surface of the second nitride semiconductor layer 362 may be provided at the same length. In the process of forming the first channel layer 360 by etching, a partial over-etching may be generated at an end region of the first channel layer 360. Accordingly, a step may be provided on the upper surface of the first passivation film 321. That is, in the first passivation film 321, thicknesses of a region in which the first channel layer 360 is disposed at a lower portion thereof and a region in which the first channel layer 360 is not disposed may be different from each other. For example, a thickness t1 of the step may be provided at about 0 to 1 μm. Accordingly, the lower surface of the second passivation film 322 disposed on the first passivation film 321 may be disposed to be extending below the lower surface of the first channel layer 360.

FIG. 31 is a circuit diagram equivalently illustrating one pixel in the thin film transistor substrate described with reference to FIGS. 28 to 30.

As shown in FIG. 31, a pixel of the thin film transistor substrate according to an embodiment of the present invention may comprise an organic light-emitting diode (OLED), a data line D and a gate line G crossing each other, a switching thin film transistor 330 for sequentially transmitting data of scan pulse SP on the gate line G to a pixel, a driving thin film transistor 430 generating a current by a voltage between a gate and a source terminal, and a storage capacitor Cst for storing and maintaining data for a predetermined time. In this way, the structure constituted by two transistors 330 and 430 and one capacitor Cst may be simply referred to as a 2T-1C structure.

The switching thin film transistor 330 is turned on in response to a scan pulse SP from the gate line G, thereby conducting a current path between its source electrode and drain electrode. During a gate on-time period of the switching thin film transistor 330, a data voltage from the data line D passes through the source electrode and the drain electrode of the switching thin film transistor 330 and is applied to the gate electrode of the driving thin film transistor 430 and the storage capacitor Cst. The driving thin film transistor 430 controls a current flowing to the OLED according to a voltage difference between its gate electrode and source electrode. The storage capacitor Cst constantly maintains a voltage supplied to the gate electrode of the driving thin film transistor 430 during one frame period by storing the data voltage applied to its one side electrode. A driving power supply line VDD may be connected to the source electrode of the driving thin film transistor 430. The OLED provided in the structure as shown in FIG. 31 may be connected between the drain electrode of the driving thin film transistor 430 and a low potential driving voltage source VSS. In addition, the OLED may be disposed to be connected between the source electrode of the driving thin film transistor 430 and the driving power supply line VDD.

According to the thin film transistor substrate according to an embodiment, a high carrier mobility may be implemented by providing the thin film transistor comprising the nitride-based semiconductor layer. An electron mobility ($cm^2/Vs$) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIGS. 32 to 34 are views illustrating still another example of a thin film transistor substrate according to an embodiment of the present invention. FIG. 32 is a cross-sectional view taken along line D-D of the thin film transistor substrate shown in FIG. 28, and FIG. 33 is a cross-sectional view taken along line E-E of the thin film transistor substrate shown in FIG. 28, and FIG. 34 is a cross-sectional view taken along line F-F of the thin film transistor substrate shown in FIG. 32.

The thin film transistor substrate shown in FIGS. 32 to 34 is an embodiment to which a switching thin film transistor having a double gate structure is applied, and description of contents overlapping with parts described with reference to FIGS. 1 to 31 may be omitted.

The thin film transistor substrate according to an embodiment may comprise a switching thin film transistor 530 and a driving thin film transistor 430. The switching thin film transistor 530 may receive signals from a gate line 341 and a data line 373 to provide a gate signal and a data signal to a corresponding pixel. A gate electrode 433 of the driving thin film transistor 430 may be electrically connected to a drain electrode 372 of the switching thin film transistor 530.

As shown in FIGS. 32 to 34, the thin film transistor substrate according to an embodiment of the present invention may comprise a support substrate 355, the switching thin film transistor 530 disposed on the support substrate 355, the driving thin film transistor 430, and a light-emitting layer 488 electrically connected to the driving thin film transistor 430.

The switching thin film transistor 530 according to an embodiment may comprise a first depletion forming layer 315, a first gate electrode 535, a double gate electrode 536, a first channel layer 360, a first source electrode 371, and a first drain electrode 372. The first source electrode 371 may be electrically connected to a first region of the first channel layer 360. The first source electrode 371 may be electrically connected to a lower surface of the first channel layer 360. The first drain electrode 372 may be electrically connected to a second region of the first channel layer 360. The first drain electrode 372 may be electrically connected to the lower surface of the first channel layer 360. The first gate electrode 535 may be disposed under the first channel layer 360. The double gate electrode 536 may be disposed on the first channel layer 360. The first depletion forming layer 315 may be disposed between the first region and the second region of the first channel layer 360. The first depletion forming layer 315 may be disposed between the first channel layer 360 and the first gate electrode 535.

The driving thin film transistor 430 according to an embodiment may comprise a second depletion forming layer 415, a second gate electrode 433, a second channel layer 460, a second source electrode 471, and a second drain electrode 472. The second source electrode 471 may be electrically connected to a first region of the second channel layer 460. The second source electrode 471 may be electrically connected to a lower surface of the second channel layer 460. The second drain electrode 472 may be electrically connected to a second region of the second channel layer 460. The second drain electrode 472 may be electrically connected to the lower surface of the second channel layer 460. The second gate electrode 433 may be disposed under the second channel layer 460. The second depletion forming layer 415 may be disposed under between the first region and the second region of the second channel layer 460. The second depletion forming layer 415 may be disposed between the second channel layer 460 and the second gate electrode 433.

The first channel layer 360 and the second channel layer 460 may be provided with, for example, a Group III-V compound semiconductor. For example, the first channel layer 360 and the second channel layer 460 may be provided with a semiconductor material having an empirical formula of $In_xAl_yGa_{1-x-y}N$ ($0 \geq x \geq 1$, $0 \geq y \geq 1$, $0 \geq x+y \geq 1$). The first channel layer 360 and the second channel layer 460 may comprise a single layer or multiple layers selected from, for example, GaN, AlN, AlGaN, InGaN, InN, InAlGaN, AlInN, AlGaAs, GaP, GaAs, GaAsP, AlGaInP and so on. The first channel layer 360 and the second channel layer 460 may be formed of different materials.

The first channel layer 360 and the second channel layer 460 may each comprise first nitride semiconductor layers 361 and 461 and second nitride semiconductor layers 362 and 462. The first nitride semiconductor layers 361 and 461 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). The second nitride semiconductor layers 362 and 462 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$).

According to the first channel layer 360 and the second channel layer 460 according to an embodiment, the first nitride semiconductor layers 361 and 461 may comprise a GaN semiconductor layer, and the second nitride semiconductor layers 362 and 462 may comprise an AlGaN semiconductor layer. The second nitride semiconductor layer 362 of the first channel layer 360 may be disposed between the first nitride semiconductor layer 361 and the first depletion forming layer 315. The second nitride semiconductor layer 462 of the second channel layer 460 may be disposed between the first nitride semiconductor layer 461 and the second depletion forming layer 415.

The first depletion forming layer 315 and the second depletion forming layer 415 may be provided with, for example, a group III-V compound semiconductor. For example, the first depletion forming layer 315 and the second depletion forming layer 415 may be provided with a semiconductor material having an empirical formula of $In_xAl_yGa_{1-x-y}N$ ($0 \geq x \geq 1$, $0 \geq y \geq 1$, $0 \geq x+y \geq 1$). The first depletion forming layer 315 and the second depletion forming layer 415 may comprise a single layer or multiple layers selected from, for example, GaN, AlN, AlGaN, InGaN, InN, InAlGaN, AlInN, AlGaAs, GaP, GaAs, GaAsP, AlGaInP and so on. The first depletion forming layer 315 and the second depletion forming layer 415 may comprise a nitride semiconductor layer doped with a p-type dopant. For example, the first depletion forming layer 315 and the second depletion forming layer 415 may comprise a GaN semiconductor layer doped with a p-type dopant or an AlGaN semiconductor layer doped with a p-type dopant. The first depletion forming layer 315 and the second depletion forming layer 415 may comprise a single layer or multiple layers provided with, for example, a semiconductor material having an empirical formula of $p\text{-}Al_xGa_{1-x}N$ ($0 \geq x \geq 0.3$). The first depletion forming layer 315 and the second depletion forming layer 415 may be provided in a thickness of 2 to 300 nm as an example. The first depletion forming layer 315 and the second depletion forming layer 415 may comprise different materials. Substances added to the first depletion forming layer 315 and the second depletion forming layer 415, and addition amounts of the added substances may be different from each other.

The first depletion forming layer 315 and the second depletion forming layer 415 may serve to form a depletion region in a two-dimensional electron gas (2DEG) provided in the first channel layer 360 and the second channel layer 460. The energy bandgap of a portion of the second nitride semiconductor layer 362 positioned thereon may be increased by the first depletion forming layer 315. As a result, the depletion region of the 2DEG may be provided at a portion of the first channel layer 360 corresponding to the first depletion forming layer 315. Therefore, a region corresponding to the position in which the first depletion forming layer 315 is disposed in the 2DEG provided at the first channel layer 360 may be cut off. A region in which the 2DEG is cut off at the first channel layer 360 may be referred to as a cut-off region. For example, a cut-off region may be formed at the second nitride semiconductor layer 362. The switching thin film transistor 330 may have a normally-off characteristic due to such a cut-off region. When a voltage equal to or higher than a threshold voltage is applied to the first gate electrode 333, the 2DEG is generated at the cut-off region and the switching thin film transistor 330 is turned on. When a channel formed at an upper portion of the first gate electrode 333 is turned on, a current may flow via the 2DEG formed at the first channel layer 360. Accordingly, the current flow from the first region to the second region of the first channel layer 360 may be controlled according to a voltage applied to the first gate electrode 333. The second depletion forming layer 415 may perform a function similar to that of the first depletion forming layer 315.

According to an embodiment, the double gate electrode 536 may be disposed on the first channel layer 360. The first gate electrode 535 and the double gate electrode 536 may be disposed to be overlapped with each other in a vertical direction. According to an embodiment, the first gate electrode 535 and the double gate electrode 536 are disposed below and above the first channel layer 360, so that a current flow in the first channel layer 360 may be controlled to be efficient and reliable.

Meanwhile, in the description of the embodiment with reference to FIGS. 32 to 34, it is described based on the case that only the switching thin film transistor is provided with the double gate structure. However, all of the switching thin film transistor and the driving thin film transistor may be provided as a double gate structure, or only the driving thin film transistor may be provided as a double gate structure.

The support substrate 355 may comprise a transparent substrate. The support substrate 355 may be provided with, for example, a transparent substrate having a thickness of 0.1 mm to 3 mm. The support substrate 355 may comprise at least one material selected from materials comprising silicon, glass, polyimide, and plastic. The support substrate 355 may comprise a flexible substrate. The support substrate 355 may serve to support the switching thin film transistor 530 and the driving thin film transistor 430 as a substrate to be used in a transfer process. In addition, the thin film transistor substrate according to an embodiment may comprise a bonding layer 350 provided between the support substrate 355 and the switching thin film transistor 530. The bonding layer 350 may be disposed between the support substrate 355 and the driving thin film transistor 430.

The bonding layer 350 may comprise an organic material. The bonding layer 350 may be provided with a transparent material. The bonding layer 350 may be provided with, for example, a material having a transmittance of 70% or more. The bonding layer 350 may comprise an organic insulating material. The bonding layer 350 may comprise at least one material selected from the group consisting of acryl, benzocyclobutene (BCB), SU-8 polymer, and the like. The bonding layer 350 may be provided in a thickness of 0.5 to 6 μm as an example.

The switching thin film transistor 530 according to an embodiment may comprise a first source contact portion 331 disposed under the first region of the first channel layer 360 and a first drain contact portion 332 disposed under the second region of the first channel layer 360. The first source contact portion 331 may be disposed in contact with the first region of the first channel layer 360. The first drain contact portion 332 may be disposed in contact with the second region of the first channel layer 360.

The switching thin film transistor 530 according to an embodiment may comprise a first source connecting wiring 342 disposed under the first source contact portion 331 and a first drain connecting wiring 343 disposed under the first drain contact portion 332. In addition, the switching thin film transistor 530 may comprise a first gate wiring 341 disposed under the first gate electrode 533. The first source connecting wiring 342 may be electrically connected to the first source contact portion 331. For example, an upper surface of the first source connecting wiring 342 may be disposed in contact with a lower surface of the first source contact portion 331. The first drain connecting wiring 343 may be electrically connected to the first drain contact portion 332. For example, an upper surface of the first drain connecting wiring 343 may be disposed in contact with a lower surface of the first drain contact portion 332. The first gate wiring 341 may be electrically connected to the first gate electrode 533. An upper surface of the first gate wiring 341 may be disposed in contact with a lower surface of the first gate electrode 533.

The first source electrode 371 may be electrically connected to the first source connecting wiring 342. The first source electrode 371 may be disposed in contact with the upper surface of the first source connecting wiring 342. For example, the first source electrode 371 may be electrically connected to the first region of the first channel layer 360 via the first source connecting wiring 342 and the first source contact portion 331. The first drain electrode 372 may be electrically connected to the first drain connecting wiring 343. The first drain electrode 372 may be disposed in contact with the upper surface of the first drain connecting wiring 343. For example, the first drain electrode 372 may be electrically connected to the second region of the first channel layer 360 via the first drain connecting wiring 343 and the first drain contact portion 332.

The driving thin film transistor 430 according to an embodiment may comprise a second source contact portion 431 disposed under the first region of the second channel layer 460 and a second drain contact portion 432 disposed under the second region of the second channel layer 460. The second source contact portion 431 may be disposed in contact with the first region of the second channel layer 460. The second drain contact portion 432 may be disposed in contact with the second region of the second channel layer 460.

The driving thin film transistor 430 according to an embodiment may comprise a second source connecting wiring 442 disposed under the second source contact portion 431 and a second drain connecting wiring 443 disposed under the second drain contact portion 432. In addition, the driving thin film transistor 430 may comprise a second gate wiring 441 disposed under the second gate electrode 433. The second source connecting wiring 442 may be electrically connected to the second source contact portion 431. For example, an upper surface of the second source connecting wiring 442 may be disposed in contact with a lower surface of the second source contact portion 431. The second drain connecting wiring 443 may be electrically connected to the second drain contact portion 432. For example, an upper surface of the second drain connecting wiring 443 may be disposed in contact with a lower surface of the second drain contact portion 432. The second gate wiring 441 may be electrically connected to the second gate electrode 433. An upper surface of the second gate wiring 441 may be disposed in contact with a lower surface of the second gate electrode 433.

The second source electrode 471 may be electrically connected to the second source connecting wiring 442. The second source electrode 471 may be disposed in contact with the upper surface of the second source connecting wiring 442. For example, the second source electrode 471 may be electrically connected to the first region of the second channel layer 460 via the second source connecting wiring 442 and the second source contact portion 431. The second drain electrode 472 may be electrically connected to the second drain connecting wiring 443. The second drain electrode 472 may be disposed in contact with the upper surface of the second drain connecting wiring 443. For example, the second drain electrode 472 may be electrically connected to the second region of the second channel layer 460 via the second drain connecting wiring 443 and the second drain contact portion 432.

The first source contact portion 331 and the first drain contact portion 332 may be provided with a material in ohmic contact with the first channel layer 360. The first source contact portion 331 and the first drain contact portion 332 may comprise a material in ohmic contact with the second nitride semiconductor layer 362. The second source contact portion 431 and the second drain contact portion 432 may be provided with a material in ohmic contact with the second channel layer 460. The second source contact portion 431 and the second drain contact portion 432 may comprise a material in ohmic contact with the second nitride semiconductor layer 462. For example, the first source contact portion 331, the first drain contact portion 332, the second source contact portion 431, and the second drain contact portion 432 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source contact portion 331, the first drain contact portion 332, the second source contact portion 431 and the second drain contact portion 432 may be provided in a thickness of 0.1 to 1 µm as an example.

The first gate electrode 533 may be provided with a material in ohmic contact with the first depletion forming layer 315. The second gate electrode 433 may be provided with a material in ohmic contact with the second depletion forming layer 415. For example, the first gate electrode 533 and the second gate electrode 433 may be provided with a material in ohmic contact with a p-type nitride layer. The first gate electrode 533 and the second gate electrode 433 may comprise a single layer or multiple layers comprising at least one material selected from the group consisting of tungsten (W), tungsten silicon (WSi$_2$), titanium nitride (TiN), tantalum (Ta), tantalum nitride (TaN), palladium (Pd), nickel (Ni), and platinum (Pt). The first gate electrode 533 and the second gate electrode 433 may be provided in a thickness of 0.1 to 1 µm as an example.

The first gate wiring 341 and the second gate wiring 441 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first gate wiring 341 and the second gate wiring 441 may be provided in a thickness of 0.1 to 3 µm as an example.

The first source connecting wiring 342, the first drain connecting wiring 343, the second source connecting wiring 442, and the second drain connecting wiring 443 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source connecting wiring 342, the first drain connecting wiring 343, the second source connecting wiring 442 and the second drain connecting wiring 443 may be provided in a thickness of 0.1 to 3 µm as an example.

The first source electrode 371, the first drain electrode 372, the second source electrode 471, and the second drain electrode 472 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source electrode 371, the first drain electrode 372, the second source electrode 471, and the second drain electrode 472 may be provided in a thickness of 0.1 to 3 µm as an example.

The thin film transistor substrate according to an embodiment may comprise a first passivation film 321 disposed under the first channel layer 360 and the second channel layer 460. The first passivation film 321 may be disposed under the second nitride semiconductor layer 362 of the first channel layer 360 and the second nitride semiconductor layer 462 of the second channel layer 460. An upper surface of the first passivation film 321 may be disposed in contact with lower surfaces of the second nitride semiconductor layer 362 of the first channel layer 360 and the second nitride semiconductor layer 462 of the second channel layer 460.

According to an embodiment, the first source contact portion 331 may be disposed to pass through the first passivation film 321. The first source contact portion 331 may be disposed to be surrounded by the first passivation film 321. The first source contact portion 331 may be disposed to pass through the first passivation film 321 and provided in contact with the first region of the first channel layer 360. The first drain contact portion 332 may be disposed to pass through the first passivation film 321. The first drain contact portion 332 may be disposed to be surrounded by the first passivation film 321. The first drain contact portion 332 may be disposed to pass through the first passivation film 321 and provided in contact with the second region of the first channel layer 360.

According to an embodiment, the second source contact portion 431 may be disposed to pass through the first passivation film 321. The second source contact portion 431 may be disposed to be surrounded by the first passivation film 321. The second source contact portion 431 may be disposed to pass through the first passivation film 321 and provided in contact with the first region of the second channel layer 460. The second drain contact portion 432 may be disposed to pass through the first passivation film 321. The second drain contact portion 432 may be disposed to be surrounded by the first passivation film 321. The second drain contact portion 432 may be disposed to pass through the first passivation film 321 and provided in contact with the second region of the second channel layer 460.

The first passivation film 321 may be provided with an insulating material. The first passivation film 321 may comprise a single layer or multiple layers comprising at least one material of a silicon-based oxide, a silicon-based nitride, a metal oxide comprising $Al_2O_3$, and an organic insulating material as an example.

The first source connecting wiring 342 may be disposed in contact with the first source contact portion 331 thereunder and provided to be surrounded by the bonding layer 350. The first drain connecting wiring 343 may be disposed in contact with the first drain contact portion 332 thereunder and provided to be surrounded by the bonding layer 350. The first gate wiring 341 may be disposed in contact with the first gate electrode 333 thereunder and provided to be surrounded by the bonding layer 350.

The upper surface of the first source connecting wiring 342 may be disposed higher than the upper surface of the first gate wiring 341. The upper surface of the first source connecting wiring 342 may be disposed higher than the lower surface of the first gate electrode 533. The upper surface of the first drain connecting wiring 343 may be disposed higher than the upper surface of the first gate wiring 341. The upper surface of the first drain connecting wiring 343 may be disposed higher than the lower surface of the first gate electrode 533.

The second source connecting wiring 442 may be disposed in contact with the second source contact portion 431 thereunder and provided to be surrounded by the bonding layer 350. The second drain connecting wiring 443 may be disposed in contact with the second drain contact portion 432 thereunder and provided to be surrounded by the bonding layer 350. The second gate wiring 441 may be disposed in contact with the second gate electrode 433 thereunder and provided to be surrounded by the bonding layer 350.

The upper surface of the second source connecting wiring 442 may be disposed higher than the upper surface of the second gate wiring 441. The upper surface of the second source connecting wiring 442 may be disposed higher than the lower surface of the second gate electrode 433. The upper surface of the second drain connecting wiring 443 may be disposed higher than the upper surface of the second gate wiring 441. The upper surface of the second drain connecting wiring 443 may be disposed higher than the lower surface of the second gate electrode 433.

The thin film transistor substrate according to an embodiment may comprise the first passivation film 321, the first channel layer 360, and a second passivation film 322 disposed on the second channel layer 460. The first source electrode 371 may pass through the first passivation film 321 and the second passivation film 322 and be electrically connected to the first source connecting wiring 342. The first source electrode 371 may comprise a first region disposed on the second passivation film 322. The first source electrode 371 may comprise a second region passing through the second passivation film 322 and the first passivation film 321. The first drain electrode 372 may pass through the first passivation film 321 and the second passivation film 322 and be electrically connected to the first drain connecting wiring 343. The first drain electrode 372 may comprise a first region disposed on the second passivation film 322. The first drain electrode 372 may comprise a second region passing through the second passivation film 322 and the first passivation film 321.

The second source electrode 471 may pass through the first passivation film 321 and the second passivation film 322 and be electrically connected to the second source connecting wiring 442. The second source electrode 471 may comprise a first region disposed on the second passivation film 322. The second source electrode 471 may comprise a second region passing through the second passivation film 322 and the first passivation film 321. The second drain electrode 472 may pass through the first passivation film 321 and the second passivation film 322 and be electrically connected to the second drain connecting wiring 443. The second drain electrode 472 may comprise a first region disposed on the second passivation film 322. The second drain electrode 472 may comprise a second region passing through the second passivation film 322 and the first passivation film 321.

According to an embodiment, a first drain-gate connecting wiring 375 may be disposed on the second passivation film 322. The first drain-gate connecting wiring 375 may comprise a first region disposed on the second passivation film 322. The first drain-gate connecting wiring 375 may comprise a second region passing through the second passivation film 322 and the first passivation film 321. The first region of the first drain-gate connecting wiring 375 may be electrically connected to the first drain electrode 372. The first region of the first drain-gate connecting wiring 375 may be disposed to be extending from the first drain electrode 372. For example, the first drain-gate connecting wiring 375 and the first drain electrode 372 may be integrally formed in the same process. In addition, the first drain-gate connecting wiring 375 and the first drain electrode 372 may be separately formed in different processes and electrically connected to each other.

According to an embodiment, a second drain-gate connecting wiring 475 may be disposed under the first passivation film 321. The second drain-gate connecting wiring 475 may be electrically connected to the first drain-gate connecting wiring 375. The second region of the first drain-gate connecting wiring 375 may be disposed in contact with the second drain-gate connecting wiring 475. The second drain-gate connecting wiring 475 may be electrically connected to the second gate wiring 441. The second drain-gate connecting wiring 475 may be disposed to be extending from the second gate wiring 441. For example, the second drain-gate connecting wiring 475 and the second gate wiring 441 may be integrally formed in the same process. In addition, the second drain-gate connecting wiring 475 and the second gate wiring 441 may be formed in separate processes and electrically connected to each other. A partial region of the second drain-gate connecting wiring 475 may be disposed in contact with the upper surface of the second gate wiring 441. The first drain electrode 372 may be electrically connected to the second gate electrode 433 via the first drain-gate connecting wiring 375, the second drain-gate connecting wiring 475, and the second gate wiring 441.

The double gate electrode 536 may comprise a first region disposed on the second passivation film 322. The double gate electrode 536 may comprise a second region passing through the second passivation film 322. The double gate electrode 536 may penetrate the second passivation film 322 and may be disposed in contact with an upper surface of the first channel layer 360. The double gate electrode 536 may be in Schottky contact with the first nitride semiconductor layer 361. The double gate electrode 536 may comprise a single layer or multiple layers comprising at least one material selected from the group consisting of nickel (Ni), platinum (Pt), gold (Au), and palladium (Pd), or an alloy thereof. For example, the Schottky contact may be implemented by plasma treatment of the first channel layer 360.

The first gate electrode 535 may be electrically connected to the double gate electrode 536 as shown in FIG. 34. The switching thin film transistor 530 according to an embodiment is disposed under the first passivation film 321 and is electrically connected to the first gate electrode 535, and may comprise a first gate connecting wiring 537 disposed to be extended from the first gate wiring 341. In addition, the switching thin film transistor 530 according to an embodiment may comprise a second gate connecting wiring 538 disposed on the second passivation film 322 and disposed to be extended from the double gate electrode 536. The first gate connecting wiring 537 and the second gate connecting wiring 538 may be electrically connected to each other by passing through the first passivation film 321 and the second passivation film 322. The first passivation film 321 may comprise a region having a first thickness and disposed in contact with the lower surface of the first channel layer 360 and a region having a second thickness and disposed in contact with a lower surface of the second passivation film 322. The region having the first thickness of the first passivation film 321 may be disposed between the lower surface of the first channel layer 360 and the upper surface of the first gate wiring 341. The region having the second thickness of the first passivation film 321 may be disposed between the lower surface of the second passivation film 322 and the upper surface of the first source connecting wiring 342 or the upper surface of the first drain connecting wiring 343. The region having the second thickness of the first passivation film 321 may be disposed between the lower surface of the second passivation film 322 and the upper surface of the bonding layer 350. The first thickness of the first passivation film 321 may be thicker than the second thickness thereof.

As shown in FIG. 33, the second channel layer 460 and the second depletion forming layer 415 may be formed in the same width. When a width of the second depletion forming layer 415 is smaller than that of the second channel layer 460, a leakage current may be generated. In other words, the length of the second channel layer 460 provided along the direction in which the second gate electrode 433 is extended and disposed and the length of the second depletion forming layer 415 may be provided in the same length.

In addition, as shown in FIG. 34, the first channel layer 360 and the first depletion forming layer 315 may be formed in the same width. When a width of the first depletion forming layer 315 is smaller than that of the first channel layer 360, a leakage current may be generated. In other words, the length of the first channel layer 360 provided along the direction in which the first gate electrode 535 is extended and disposed and the length of the first depletion forming layer 315 may be provided in the same length. The width of the first channel layer 360 and a width of a lower surface of the second gate electrode 536 may be provided in the same width.

The second passivation film 322 may comprise an insulating material. For example, the second passivation film 322 may comprise a single layer or multiple layers comprising at least one material among a silicon-based oxide, a silicon nitride, a metal oxide containing $Al_2O_3$, and an organic insulator.

The thin film transistor substrate according to an embodiment may comprise a third passivation film 323 disposed on the second passivation film 322. The third passivation film 323 may be disposed on the first source electrode 371, the first drain electrode 372, the second source electrode 471, and the second drain electrode 472. The third passivation film 323 may be disposed on the double gate electrode 536.

For example, the third passivation film 323 may comprise a single layer or multiple layers containing at least one material of a silicon-based oxide, a silicon-based nitride, a metal oxide containing $Al_2O_3$, and an organic insulating material.

The thin film transistor substrate according to an embodiment may comprise a lower electrode 486 disposed on the driving thin film transistor 430. The lower electrode 486 may be electrically connected to the driving thin film transistor 430. The lower electrode 486 may be electrically connected to the second drain electrode 472 of the driving thin film transistor 430. The lower electrode 486 may be disposed on the third passivation film 423. The lower electrode 486 may be electrically connected to the second drain electrode 472 through a contact hole provided in the third passivation film 323. A lower surface of the lower electrode 486 may be disposed in contact with an upper surface of the second drain electrode 472.

In addition, the thin film transistor substrate according to an embodiment may comprise a fourth passivation film 324 disposed on the third passivation film 323. The light-emitting layer 488 may be disposed on the lower electrode 486. An upper electrode 487 may be disposed on the light-emitting layer 488. The light-emitting layer 488 and the upper electrode 487 may be disposed on the fourth passivation film 324. A first region of the light-emitting layer 488 may be disposed on the fourth passivation film 324. A second region of the light-emitting layer 488 may be disposed in contact with an upper surface of the lower electrode 486 through a contact hole provided in the fourth passivation film 324. The light-emitting layer 488 may emit light of any one of wavelength bands comprising red, green, blue, and white as an example. The light-emitting layer 488 may be provided with an organic material as an example.

The lower electrode 486 and the upper electrode 487, for example, may comprise one material selected from ITO, ITO/Ag, ITO/Ag/ITO, and ITO/Ag/IZO, or an alloy containing the material. The lower electrode 486 and the upper electrode 487 may comprise different materials. One of the upper electrode 486 and the lower electrode 487 may be provided as a transparent electrode, and light emitted from the light-emitting layer 488 in a direction of the transparent electrode may be emitted to the outside.

Meanwhile, as explained above referring to FIG. 16, a partial region of the first drain connecting wiring 343 according to an embodiment may be disposed between the drain contact portion 332 and the first passivation film 321. In the process of forming the drain contact portion 332, a space may be provided between the side surface of the drain contact portion 332 and the first passivation film 321, and the partial region of the first drain connecting wiring 343 may be formed in this space. In the process of forming a through hole at the first passivation film 321 to form the drain contact portion 332, a side surface of the first passivation film 321 surrounding the drain contact portion 332 may be formed to be inclined. An angle a2 formed by the side surface of the first passivation film 321 and the upper surface of the first passivation film 321 may be provided as an acute angle. For example, the angle a2 formed by the side surface of the first passivation film 321 and the upper surface of the first passivation film 321 may be 10 to 90 degrees. As another embodiment, the angle a2 formed by the side surface of the first passivation film 321 and the upper surface of the first passivation film 321 may be 30 to 90 degrees. A predetermined gap t2 may be provided between the side surface of the first passivation film 321 and the drain contact portion 332 and, for example, a gap of 0 to 3 μm may be provided. In addition, although not shown in the drawing, a partial region of the source connecting wiring 342 according to an embodiment may be disposed between the source contact portion 331 and the first passivation film 321. In the process of forming the source contact portion 331, a space may be provided between the side surface of the source contact portion 331 and the first passivation film 321, and a partial region of the first source connecting wiring 343 may be formed in this space. According to an embodiment, since the first channel layer 360 is formed by the etching process, an angle a1 formed between a side surface of the first channel layer 360 and the lower surface of the first channel layer 360 may be provided as an acute angle. For example, the angle a1 formed between the side surface of the first channel layer 360 and the lower surface of the first channel layer 360 may be 30 to 90 degrees.

For example, when the first passivation film 321 is provided with a silicon-based oxide such as $SiO_2$, the first passivation film 321 may be etched by wet etching or dry etching. When the etching is performed by the wet etching, the angle of a2 may be formed at about 10 to 60 degrees, and a wider shape may be provided within a few μm compared to a pattern to be etched. When the wet etching is performed, the angle of a2 may be formed at an angle of about 35 to 45 degrees. When the etching is performed by the dry etching, the angle of a2 may be formed at about 60 to 90 degrees, and a shape having a width similar to the pattern to be etched may be provided. When the dry etching is performed, the angle of a2 may be formed at an angle of about 65 to 75 degrees.

An upper surface of the first nitride semiconductor layer 361 may be provided shorter than a lower surface thereof. An upper surface of the second nitride semiconductor layer 362 may be provided shorter than the lower surface thereof. The lower surface of the first nitride semiconductor layer 361 and the upper surface of the second nitride semiconductor layer 362 may be provided at the same length. In the process of forming the first channel layer 360 by etching, a partial over-etching may be generated at an end region of the first channel layer 360. Accordingly, a step may be provided on the upper surface of the first passivation film 321. That is, in the first passivation film 321, thicknesses of a region in which the first channel layer 360 is disposed at a lower portion thereof and a region in which the first channel layer 360 is not disposed may be different from each other. For example, a thickness t1 of the step may be provided at about 0 to 1 μm. Accordingly, the lower surface of the second passivation film 322 disposed on the first passivation film 321 may be disposed to be extending below the lower surface of the first channel layer 360.

According to the thin film transistor substrate according to an embodiment, a high carrier mobility may be implemented by providing the thin film transistor comprising the nitride-based semiconductor layer. An electron mobility ($cm^2/Vs$) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIGS. 35 and 36 are views illustrating still another example of a thin film transistor substrate according to an embodiment of the present invention. FIG. 35 is a cross-sectional view taken along line D-D of the thin film transistor substrate shown in FIG. 28, and FIG. 36 is a cross-sectional view taken along line E-E of the thin film transistor substrate shown in FIG. 28.

The thin film transistor substrate shown in FIGS. 35 and 36 is as an embodiment to which a thin film transistor having a structure in which a gate electrode is disposed in a recessed region of a channel layer is applied, and description of contents overlapping with parts described with reference to FIGS. 1 to 34 may be omitted.

The thin film transistor substrate according to an embodiment may comprise a switching thin film transistor 730 and a driving thin film transistor 830. The switching thin film transistor 730 may receive a signal from a gate line 341 and a data line 373 and may provide a gate signal and a data signal to a corresponding pixel. A gate electrode 833 of the driving thin film transistor 830 may be electrically connected to a drain electrode 372 of the switching thin film transistor 730.

As shown in FIGS. 35 and 36, the thin film transistor substrate according to an embodiment of the present invention may comprise a support substrate 355, the switching thin film transistor 730 disposed on the support substrate 355, the driving thin film transistor 830, and a light-emitting layer 488 electrically connected to the driving thin film transistor 830.

A switching thin film transistor 730 according to an embodiment may comprise a first gate electrode 733, a first channel layer 760, a first source electrode 371, and a first drain electrode 372. The first source electrode 371 may be electrically connected to a first region of the first channel layer 760. The first source electrode 371 may be electrically connected to a lower surface of the first channel layer 760. The first drain electrode 372 may be electrically connected to a second region of the first channel layer 760. The first drain electrode 372 may be electrically connected to the lower surface of the first channel layer 760. The first gate electrode 733 may be disposed under the first channel layer 760.

The first channel layer 760 may comprise a recessed region recessed in an upward direction on a lower surface thereof. The first gate electrode 733 may be disposed in the recessed region of the first channel layer 760.

A driving thin film transistor 830 according to an embodiment may comprise a second gate electrode 433, a second channel layer 860, a second source electrode 471, and a second drain electrode 472. The second source electrode 471 may be electrically connected to a first region of the second channel layer 860. The second source electrode 471 may be electrically connected to a lower surface of the second channel layer 860. The second drain electrode 472 may be electrically connected to a second region of the second channel layer 860. The second drain electrode 472 may be electrically connected to a lower surface of the second channel layer 860. The second gate electrode 833 may be disposed under the second channel layer 860.

The second channel layer 860 may comprise a recessed region recessed in an upward direction on a lower surface thereof. The second gate electrode 833 may be disposed in the recessed region of the second channel layer 860.

The structures of the switching thin film transistor 730 and the driving thin film transistor 830 may be similar to each other, and in the description of the driving thin film transistor 830, description of contents overlapping with those described with reference to the switching thin film transistor 730 may be omitted.

The first channel layer 760 and the second channel layer 860 may be provided with, for example, a Group III-V compound semiconductor. For example, the first channel layer 760 and the second channel layer 860 may be provided with a semiconductor material having an empirical formula of $In_xAl_yGa_{1-x-y}N$ ($0≥x≥1$, $0≥y≥1$, $0≥x+y≥1$). The first channel layer 760 and the second channel layer 860 may comprise a single layer or multiple layers selected from, for example, GaN, AlN, AlGaN, InGaN, InN, InAlGaN, AlInN, AlGaAs, GaP, GaAs, GaAsP, AlGaInP and so on. The first channel layer 760 and the second channel layer 860 may be formed of different materials.

The first channel layer 760 and the second channel layer 860 may each comprise first nitride semiconductor layers 761 and 861 and second nitride semiconductor layers 762 and 862. The first nitride semiconductor layers 761 and 861 may be provided with, for example, a semiconductor material having an empirical formula of $In_xAl_yGa_{1-x-y}N$ ($0≥x≥1$, $0≥y≥1$, $0≥x+y≥1$). The second nitride semiconductor layers 762 and 862 may be provided with, for example, a semiconductor material having an empirical formula of $In_xAl_yGa_{1-x-y}N$ ($0≥x≥1$, $0≥y≥1$, $0≥x+y≥1$). A recessed region recessed upwardly may be provided in a lower surface of the second nitride semiconductor layer 762 and 862. The first gate electrode 733 may be disposed in the recessed region of the second nitride semiconductor layer 762. An upper surface of the first gate electrode 733 may be disposed higher than the lowest surface of the second nitride semiconductor layer 762. The first gate electrode 733 may be in Schottky contact with the second nitride semiconductor layer 762. The second gate electrode 833 may be disposed in the recessed region of the second nitride semiconductor layer 862. An upper surface of the second gate electrode 833 may be disposed higher than the lowest surface of the second nitride semiconductor layer 862. The second gate electrode 833 may be in Schottky contact with the second nitride semiconductor layer 862. According to the first channel layer 760 and the second channel layer 860 according to an embodiment, the first nitride semiconductor layer 761, 861 may comprise a GaN semiconductor layer, and the second nitride semiconductor layer 762 and 862 may comprise an AlGaN semiconductor layer.

The support substrate 355 may comprise a transparent substrate. The support substrate 355 may be provided with, for example, a transparent substrate having a thickness of 0.1 mm to 3 mm. The support substrate 355 may comprise at least one material selected from materials comprising silicon, glass, polyimide, and plastic. The support substrate 355 may comprise a flexible substrate.

The support substrate 355 may serve to support the switching thin film transistor 730 and the driving thin film transistor 830 as a substrate to be used in a transfer process.

In addition, the thin film transistor substrate according to an embodiment may comprise a bonding layer 350 provided between the support substrate 355 and the switching thin film transistor 730. The bonding layer 350 may be disposed between the support substrate 355 and the driving thin film transistor 830.

The bonding layer 350 may comprise an organic material. The bonding layer 350 may be provided with a transparent material. The bonding layer 350 may be provided with, for example, a material having a transmittance of 70% or more. The bonding layer 350 may comprise an organic insulating material. The bonding layer 350 may comprise at least one material selected from the group consisting of acryl, benzocyclobutene (BCB), SU-8 polymer, and the like. The bonding layer 350 may be provided in a thickness of 0.5 to 6 μm as an example.

The switching thin film transistor 730 according to an embodiment may comprise a first source contact portion 331 disposed under the first region of the first channel layer 760 and a first drain contact portion 332 disposed under the second region of the first channel layer 760. The first source contact portion 331 may be disposed in contact with the first region of the first channel layer 760. The first drain contact portion 332 may be disposed in contact with the second region of the first channel layer 760.

The switching thin film transistor 730 according to an embodiment may comprise a first source connecting wiring 342 disposed under the first source contact portion 331 and a first drain connecting wiring 343 disposed under the first drain contact portion 332. In addition, the switching thin film transistor 730 may comprise a first gate wiring 341 disposed under the first gate electrode 333. The first source connecting wiring 342 may be electrically connected to the first source contact portion 331. For example, an upper surface of the first source connecting wiring 342 may be disposed in contact with a lower surface of the first source contact portion 331. The first drain connecting wiring 343 may be electrically connected to the first drain contact portion 332. For example, an upper surface of the first drain connecting wiring 343 may be disposed in contact with a lower surface of the first drain contact portion 332. The first gate wiring 341 may be electrically connected to the first gate electrode 333. An upper surface of the first gate wiring 341 may be disposed in contact with a lower surface of the first gate electrode 333.

The first source electrode 371 may be electrically connected to the first source connecting wiring 342. The first source electrode 371 may be disposed in contact with the upper surface of the first source connecting wiring 342. For example, the first source electrode 371 may be electrically connected to the first region of the first channel layer 760 via the first source connecting wiring 342 and the first source contact portion 331. The first drain electrode 372 may be electrically connected to the first drain connecting wiring 343. The first drain electrode 372 may be disposed in contact with the upper surface of the first drain connecting wiring 343. For example, the first drain electrode 372 may be electrically connected to the second region of the first channel layer 760 via the first drain connecting wiring 343 and the first drain contact portion 332.

The driving thin film transistor 830 according to an embodiment may comprise a second source contact portion 431 disposed under the first region of the second channel layer 860 and a second drain contact portion 432 disposed under the second region of the second channel layer 860. The second source contact portion 431 may be disposed in contact with the first region of the second channel layer 860.

The second drain contact portion 432 may be disposed in contact with the second region of the second channel layer 860.

The driving thin film transistor 830 according to an embodiment may comprise a second source connecting wiring 442 disposed under the second source contact portion 431 and a second drain connecting wiring 443 disposed under the second drain contact portion 432. In addition, the driving thin film transistor 830 may comprise a second gate wiring 441 disposed under the second gate electrode 433. The second source connecting wiring 442 may be electrically connected to the second source contact portion 431. For example, an upper surface of the second source connecting wiring 442 may be disposed in contact with a lower surface of the second source contact portion 431. The second drain connecting wiring 443 may be electrically connected to the second drain contact portion 432. For example, an upper surface of the second drain connecting wiring 443 may be disposed in contact with a lower surface of the second drain contact portion 432. The second gate wiring 441 may be electrically connected to the second gate electrode 433. An upper surface of the second gate wiring 441 may be disposed in contact with a lower surface of the second gate electrode 433.

The second source electrode 471 may be electrically connected to the second source connecting wiring 442. The second source electrode 471 may be disposed in contact with the upper surface of the second source connecting wiring 442. For example, the second source electrode 471 may be electrically connected to the first region of the second channel layer 860 via the second source connecting wiring 442 and the second source contact portion 431. The second drain electrode 472 may be electrically connected to the second drain connecting wiring 443. The second drain electrode 472 may be disposed in contact with the upper surface of the second drain connecting wiring 443. For example, the second drain electrode 472 may be electrically connected to the second region of the second channel layer 860 via the second drain connecting wiring 443 and the second drain contact portion 432.

The first source contact portion 331 and the first drain contact portion 332 may be provided with a material in ohmic contact with the first channel layer 760. The first source contact portion 331 and the first drain contact portion 332 may comprise a material in ohmic contact with the second nitride semiconductor layer 762. The second source contact portion 431 and the second drain contact portion 432 may be provided with a material in ohmic contact with the second channel layer 860. The second source contact portion 431 and the second drain contact portion 432 may comprise a material in ohmic contact with the second nitride semiconductor layer 862. For example, the first source contact portion 331, the first drain contact portion 332, the second source contact portion 431, and the second drain contact portion 432 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source contact portion 331, the first drain contact portion 332, the second source contact portion 431 and the second drain contact portion 432 may be provided in a thickness of 0.1 to 1 μm as an example.

The first gate electrode 733 may be provided as a material in Schottky contact with the first channel layer 760. The first gate electrode 733 may be provided with a material which is in a Schottky contact with the second nitride semiconductor layer 762. The first gate electrode 733 may comprise a single layer or multiple layers comprising at least one material selected from the group consisting of nickel (Ni), platinum (Pt), gold (Au), and palladium (Pd), or an alloy thereof. For example, the Schottky contact may be implemented by plasma treatment of the first channel layer 760. In the plasma treatment, for example, fluorine (F) ion treatment may be applied. Accordingly, the switching thin film transistor 730 according to an embodiment may be provided with a threshold voltage by the Schottky contact and may have a normally off characteristic. When a voltage equal to or higher than the threshold voltage is applied to the first gate electrode 733, a channel formed on the first gate electrode 733 is turned on to allow a current to flow the first channel layer 760.

The second gate electrode 833 may be provided as a material in Schottky contact with the second channel layer 860. The second gate electrode 833 may be provided with a material which is in a Schottky contact with the second nitride semiconductor layer 862. The second gate electrode 833 may comprise a single layer or multiple layers comprising at least one material selected from the group consisting of nickel (Ni), platinum (Pt), gold (Au), and palladium (Pd), or an alloy thereof. For example, the Schottky contact may be implemented by plasma treatment of the second channel layer 860. In the plasma treatment, for example, fluorine (F) ion treatment may be applied. Accordingly, the driving thin film transistor 830 according to an embodiment may be provided with a threshold voltage by the Schottky contact and may have a normally off characteristic. When a voltage equal to or higher than the threshold voltage is applied to the second gate electrode 833, a channel formed on the second gate electrode 833 is turned on to allow a current to flow the second channel layer 860.

The first gate wiring 341 and the second gate wiring 441 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first gate wiring 341 and the second gate wiring 441 may be provided in a thickness of 0.1 to 3 μm as an example.

The first source connecting wiring 342, the firsts drain connecting wiring 343, the second source connecting wiring 442, and the second drain connecting wiring 443 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source connecting wiring 342, the firsts drain connecting wiring 343, the second source connecting wiring 442, and the second drain connecting wiring 443 may be provided in a thickness of 0.1 to 3 μm as an example.

The first source electrode 371, the first drain electrode 372, the second source electrode 471, and the second drain electrode 472 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source electrode 371, the first drain electrode 372, the second source electrode 471, and the second drain electrode 472 may be provided in a thickness of 0.1 to 3 μm as an example.

The thin film transistor substrate according to an embodiment may comprise a first passivation film 321 disposed under the first channel layer 760 and the second channel layer 860. The first passivation film 321 may be disposed under the second nitride semiconductor layer 762 of the first channel layer 760 and the second nitride semiconductor layer 862 of the second channel layer 860. An upper surface of the first passivation film 321 may be disposed in contact with a lower surface of the second nitride semiconductor layer 762 and a lower surface of the second nitride semiconductor layer 862.

According to an embodiment, the first source contact portion 331 may be disposed to pass through the first passivation film 321. The first source contact portion 331 may be disposed to be surrounded by the first passivation film 321. The first source contact portion 331 may be disposed to pass through the first passivation film 321 and provided in contact with the first region of the first channel layer 760. The first drain contact portion 332 may be disposed to pass through the first passivation film 321. The first drain contact portion 332 may be disposed to be surrounded by the first passivation film 321. The first drain contact portion 332 may be disposed to pass through the first passivation film 321 and provided in contact with the second region of the first channel layer 760.

According to an embodiment, the second source contact portion 431 may be disposed to pass through the first passivation film 321. The second source contact portion 431 may be disposed to be surrounded by the first passivation film 321. The second source contact portion 431 may be disposed to pass through the first passivation film 321 and provided in contact with the first region of the second channel layer 860. The second drain contact portion 432 may be disposed to pass through the first passivation film 321. The second drain contact portion 432 may be disposed to be surrounded by the first passivation film 321. The second drain contact portion 432 may be disposed to pass through the first passivation film 321 and provided in contact with the second region of the second channel layer 860.

The first passivation film 321 may be provided with an insulating material. The first passivation film 321 may comprise a single layer or multiple layers comprising at least one material of a silicon-based oxide, a silicon-based nitride, a metal oxide comprising $Al_2O_3$, and an organic insulating material as an example.

The first source connecting wiring 342 may be disposed in contact with the first source contact portion 331 thereunder and provided to be surrounded by the bonding layer 350. The first drain connecting wiring 343 may be disposed in contact with the first drain contact portion 332 thereunder and provided to be surrounded by the bonding layer 350. The first gate wiring 341 may be disposed in contact with the first gate electrode 333 thereunder and provided to be surrounded by the bonding layer 350.

The second source connecting wiring 442 may be disposed in contact with the second source contact portion 431 thereunder and provided to be surrounded by the bonding layer 350. The second drain connecting wiring 443 may be disposed in contact with the second drain contact portion 432 thereunder and provided to be surrounded by the bonding layer 350. The second gate wiring 441 may be disposed in contact with the second gate electrode 433 thereunder and provided to be surrounded by the bonding layer 350.

The thin film transistor substrate according to an embodiment may comprise the first passivation film 321, the first channel layer 760, and a second passivation film 322 disposed on the second channel layer 860. The first source electrode 371 may pass through the first passivation film 321 and the second passivation film 322 and be electrically connected to the first source connecting wiring 342. The first source electrode 371 may comprise a first region disposed on the second passivation film 322. The first source electrode 371 may comprise a second region passing through the second passivation film 322 and the first passivation film 321. The first drain electrode 372 may pass through the first passivation film 321 and the second passivation film 322 and be electrically connected to the first drain connecting wiring 343. The first drain electrode 372 may comprise a first region disposed on the second passivation film 322. The first drain electrode 372 may comprise a second region passing through the second passivation film 322 and the first passivation film 321.

The second source electrode 471 may pass through the first passivation film 321 and the second passivation film 322 and be electrically connected to the second source connecting wiring 442. The second source electrode 471 may comprise a first region disposed on the second passivation film 322. The second source electrode 471 may comprise a second region passing through the second passivation film 322 and the first passivation film 321. The second drain electrode 472 may pass through the first passivation film 321 and the second passivation film 322 and be electrically connected to the second drain connecting wiring 443. The second drain electrode 472 may comprise a first region disposed on the second passivation film 322. The second drain electrode 472 may comprise a second region passing through the second passivation film 322 and the first passivation film 321.

According to an embodiment, a first drain-gate connecting wiring 375 may be disposed on the second passivation film 322. The first drain-gate connecting wiring 375 may comprise a first region disposed on the second passivation film 322. The first drain-gate connecting wiring 375 may comprise a second region passing through the second passivation film 322 and the first passivation film 321. The first region of the first drain-gate connecting wiring 375 may be electrically connected to the first drain electrode 372. The first region of the first drain-gate connecting wiring 375 may be disposed to be extending from the first drain electrode 372.

According to an embodiment, a second drain-gate connecting wiring 475 may be disposed under the first passivation film 321. The second drain-gate connecting wiring 475 may be electrically connected to the first drain-gate connecting wiring 375. The second region of the first drain-gate connecting wiring 375 may be disposed in contact with the second drain-gate connecting wiring 475. The second drain-gate connecting wiring 475 may be electrically connected to the second gate wiring 441. The second drain-gate connecting wiring 475 may be disposed to be extending from the second gate wiring 441. For example, the second drain-gate connecting wiring 475 and the second gate wiring 441 may be integrally formed in the same process. In addition, the second drain-gate connecting wiring 475 and the second gate wiring 441 may be formed in separate processes and electrically connected to each other. A partial region of the second drain-gate connecting wiring 475 may be disposed in contact with the upper surface of the second gate wiring 441. The first drain electrode 372 may be electrically connected to the second gate electrode 433 via the first drain-gate connecting wiring 375, the second drain-gate connecting wiring 475, and the second gate wiring 441.

The second passivation film 322 may comprise an insulating material. For example, the second passivation film 322 may comprise a single layer or multiple layers comprising at least one material among a silicon-based oxide, a silicon nitride, a metal oxide containing $Al_2O_3$, and an organic insulator.

The thin film transistor substrate according to an embodiment may comprise a third passivation film 323 disposed on the second passivation film 322. The third passivation film 323 may be disposed on the first source electrode 371, the first drain electrode 372, the second source electrode 471, and the second drain electrode 472.

For example, the third passivation film 323 may comprise a single layer or multiple layers containing at least one material of a silicon-based oxide, a silicon-based nitride, a metal oxide containing $Al_2O_3$, and an organic insulating material.

The thin film transistor substrate according to an embodiment may comprise a lower electrode 486 disposed on the driving thin film transistor 830. The lower electrode 486 may be electrically connected to the driving thin film transistor 830. The lower electrode 486 may be electrically connected to the second drain electrode 472 of the driving thin film transistor 830. The lower electrode 486 may be disposed on the third passivation film 423. The lower electrode 486 may be electrically connected to the second drain electrode 472 through a contact hole provided in the third passivation film 323. A lower surface of the lower electrode 486 may be disposed in contact with an upper surface of the second drain electrode 472.

In addition, the thin film transistor substrate according to an embodiment may comprise a fourth passivation film 324 disposed on the third passivation film 323. The light-emitting layer 488 may be disposed on the lower electrode 486. An upper electrode 487 may be disposed on the light-emitting layer 488. The light-emitting layer 488 and the upper electrode 487 may be disposed on the fourth passivation film 324. A first region of the light-emitting layer 488 may be disposed on the fourth passivation film 324. A second region of the light-emitting layer 488 may be disposed in contact with an upper surface of the lower electrode 486 through a contact hole provided in the fourth passivation film 324. The light-emitting layer 488 may emit light of any one of wavelength bands comprising red, green, blue, and white as an example. The light-emitting layer 488 may be provided with an organic material as an example.

The lower electrode 486 and the upper electrode 487, for example, may comprise one material selected from ITO, ITO/Ag, ITO/Ag/ITO, and ITO/Ag/IZO, or an alloy containing the material. The lower electrode 486 and the upper electrode 487 may comprise different materials. One of the upper electrode 486 and the lower electrode 487 may be provided as a transparent electrode, and light emitted from the light-emitting layer 488 in a direction of the transparent electrode may be emitted to the outside.

According to the thin film transistor substrate according to an embodiment, a high carrier mobility may be implemented by providing the thin film transistor comprising the nitride-based semiconductor layer. An electron mobility ($cm^2/Vs$) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

FIG. 37 is a block diagram illustrating an example of a display device comprising a thin film transistor substrate according to an embodiment of the present invention.

As shown in FIG. 37, the display device according to an embodiment may comprise a display panel 2100 and a panel driver 2300.

The display panel 2100 may comprise any one of the thin film transistor substrates described with reference to FIGS. 28 to 36. The panel driver 2300 may provide a driving signal to the display panel 2100. The panel driver 2300 may control light transmittance of a plurality of pixels provided in the display panel 2100, so that an image may be displayed on the display panel 2100.

The features, structures, effects and the like described in the embodiments are comprised in at least one embodiment of the present invention and are not necessarily limited to only one embodiment. Furthermore, the features, structures, effects and the like illustrated in the embodiments may be combined or modified with other embodiments by those skilled in the art to which the embodiments belong. Accordingly, it is to be understood that such combination and modification are comprised in the scope of the present invention.

The above description of the embodiments is merely examples and does not limit the present invention. It would be apparent to those of ordinary skill in the art that the present invention may be easily embodied in many different forms without changing the technical idea or essential features thereof. For example, elements of the exemplary embodiments described herein may be modified and realized. Also, it should be construed that differences related to such changes and applications are comprised in the scope of the present invention defined in the appended claims.

INDUSTRIAL APPLICABILITY

According to an embodiment, a thin film transistor substrate, a display panel and a display device comprising the same, have an advantage of realizing a high resolution and reproducing a smooth moving picture by providing a high carrier mobility.

The invention claimed is:

1. A thin film transistor substrate comprising:
   a support substrate;
   a bonding layer disposed on the support substrate;
   a thin film transistor disposed on the bonding layer, the thin film transistor comprising a channel layer comprising a nitride-based semiconductor layer, a source electrode electrically connected to a first region of the channel layer, a drain electrode electrically connected to a second region of the channel layer, a gate electrode disposed under the channel layer, and a depletion forming layer disposed between the channel layer and the gate electrode;
   a pixel electrode disposed on the thin film transistor and electrically connected to the drain electrode of the thin film transistor;
   a first passivation film disposed under the channel layer;
   a source contact portion disposed to pass through the first passivation film and in contact with the first region of the channel layer; and
   a drain contact portion disposed to pass through the first passivation film and in contact with the second region of the channel layer.

2. The thin film transistor substrate of claim 1, wherein the channel layer comprises a semiconductor layer of $In_xAl_yGa_{1-x-y}N$ ($0 \geq x \geq 1$, $0 \geq y \geq 1$, $0 \geq x+y \geq 1$).

3. The thin film transistor substrate of claim 1, wherein the channel layer comprises a GaN semiconductor layer, and an AlGaN semiconductor layer disposed between the GaN semiconductor layer and the depletion forming layer.

4. The thin film transistor substrate of claim 3, wherein the depletion forming layer comprises a nitride semiconductor layer doped with a p-type dopant.

5. The thin film transistor substrate of claim 3, wherein the depletion forming layer comprises a GaN semiconductor layer doped with a p-type dopant or an AlGaN semiconductor layer doped with a p-type dopant.

6. The thin film transistor substrate of claim 1, wherein the bonding layer comprises an organic material and has a transmittance of 70% or more.

7. The thin film transistor substrate of claim 1, wherein the support substrate is a transparent substrate having a thickness of 0.1 mm to 3 mm.

8. The thin film transistor substrate of claim 1, comprising a source connecting wiring disposed in contact with the source contact portion thereunder and surrounded by the bonding layer, a drain connecting wiring disposed in contact with the drain contact portion thereunder and surrounded by the bonding layer, and a gate wiring disposed in contact with the gate electrode thereunder and surrounded by the bonding layer.

9. The thin film transistor substrate of claim 8, wherein a partial region of the source connecting wiring is disposed between the source contact portion and the first passivation film, and a partial region of the drain connecting wiring is disposed between the drain contact portion and the first passivation film.

10. The thin film transistor substrate of claim 8, comprising a second passivation film disposed on the first passivation film and the channel layer,
    wherein the source electrode passes through the first passivation film and the second passivation film and is electrically connected to the source connecting wiring, and the drain electrode passes through the first passivation film and the second passivation film and is electrically connected to the drain connecting wiring.

11. The thin film transistor substrate of claim 10, comprising a third passivation film disposed on the source electrode, the drain electrode, and the second passivation film,
    wherein the pixel electrode is disposed on the third passivation film and electrically connected to the drain electrode via a contact hole provided in the third passivation film.

12. The thin film transistor substrate of claim 1, wherein the first passivation film is formed of a single layer or multiple layers comprising at least one of a silicon-based oxide, a silicon-based nitride, a metal oxide, and an organic insulating material.

13. The thin film transistor substrate of claim 11, comprising a fourth passivation film disposed on the third passivation film and a common electrode disposed between the third passivation film and the fourth passivation film.

14. The thin film transistor substrate of claim 13, wherein the pixel electrode is disposed in contact with an upper surface of the drain electrode by passing through the third passivation film and the fourth passivation film.

15. The thin film transistor substrate of claim 13, wherein a partial region of the pixel electrode and a partial region of the common electrode are overlapped with each other in a vertical direction.

16. The thin film transistor substrate of claim 13, comprising a touch panel lower electrode disposed between the common electrode and the fourth passivation film and a touch panel upper electrode disposed to be overlapped with the touch panel lower electrode in a vertical direction.

17. The thin film transistor substrate of claim 10, wherein the first passivation film comprises a region disposed in contact with a lower surface of the channel layer and having a first thickness, and a region disposed in contact with a lower surface of the second passivation film and having a second thickness, and the first thickness is larger than the second thickness.

18. The thin film transistor substrate of claim 1, wherein a side surface of the source contact portion and a side surface of the drain contact portion are disposed to face each other, and the depletion forming layer is disposed to extend in one direction between the side surface of the source contact portion and the side surface of the drain contact portion, and a length of the depletion forming layer disposed to extend in the one direction is longer than a side length of the source contact portion.

19. A liquid crystal display panel comprising:
    a thin film transistor substrate according to claim 1;
    a color filter substrate disposed on the thin film transistor substrate; and
    a liquid crystal layer provided between the thin film transistor substrate and the color filter substrate.

20. A display device comprising:
    a display panel comprising a thin film transistor substrate according to claim 1 and a color filter substrate disposed on the thin film transistor substrate; and
    a light unit disposed under the display panel to supply light to the display panel.

* * * * *